United States Patent
Matoba et al.

(10) Patent No.: US 6,810,371 B1
(45) Date of Patent: Oct. 26, 2004

(54) METHOD OF SIMULATING INDOOR BEHAVIOR OF PESTICIDAL COMPOUND

(75) Inventors: Yoshihide Matoba, Suita (JP); Masatoshi Matsuo, Takarazuka (JP)

(73) Assignee: Sumitomo Chemical Company Limited, Osaka (JP)

( * ) Notice: Subject to any disclaimer, the term of this patent is extended or adjusted under 35 U.S.C. 154(b) by 0 days.

(21) Appl. No.: 09/101,236

(22) PCT Filed: Oct. 29, 1997

(86) PCT No.: PCT/JP97/03924

§ 371 (c)(1),
(2), (4) Date: Jul. 6, 1998

(87) PCT Pub. No.: WO98/19530

PCT Pub. Date: May 14, 1998

(30) Foreign Application Priority Data

Nov. 11, 1906 (JP) ............................................. 6/299059
Nov. 6, 1996 (JP) ............................................. 6/294203
Nov. 7, 1996 (JP) ............................................. 6/295366
Nov. 11, 1996 (JP) ............................................. 6/299073

(51) Int. Cl.[7] ............................ G06G 7/48; G06G 7/58; G06F 17/10; G06F 7/60; G01N 33/48

(52) U.S. Cl. ............................... 703/12; 702/19; 703/2; 703/6; 703/7; 703/9; 703/11

(58) Field of Search ........................ 702/19, 20; 703/2, 703/12, 6, 7, 9, 11; 514/1, 2; 435/507

(56) References Cited

PUBLICATIONS

Matoba et al., Chemosphere, vol. 28, No. 4, pp. 767–786 (1994).*
Matoba et al., Chemosphere, vol. 28, No. 3, pp. 435–451 (1994).*
Matoba et al., Chemosphere, vol. 30, No. 2, pp. 345–365 (1995).*
Matoba et al., Chemosphere, vol. 26, No. 6, pp. 1167–1186 (1993).*
Nose, J. Pestic. Sci (Nikon Noyaku Gakkaishi), vol. 9, No. 1, pp. 7–12 (Whole Article in Japanese with Complete English Translation), 1984.*

* cited by examiner

Primary Examiner—Ardin H. Marschel
(74) Attorney, Agent, or Firm—Fitch, Even, Tabin & Flannery

(57) ABSTRACT

The present invention relates to a method of simulating an indoor behavior of a pesticidal compound, and aims to provide a simulation method which can process simultaneous differential equations necessary for simulation accurately in a short time, and to evaluate safety of the compound with respect to a human body. The simulation method includes a step of dividing an indoor environment into predetermined media and forming a differential equation concerning a fugacity of the compound in each of the media; a step of determining the fugacity of the compound in each of the media from the differential equation; a step of determining the indoor behavior of the compound from the fugacity of the compound in each of the media; a step of changing, in response to a fluctuation in mass balance of the compound indoors, a minute time unit used when solving the differential equation; and a step of evaluating, according to the indoor behavior of the compound, safety of the compound with respect to the human body.

42 Claims, 21 Drawing Sheets

CONCENTRATION IN INDOOR AIR (C)

CONCENTRATION IN INDOOR AIR (C)

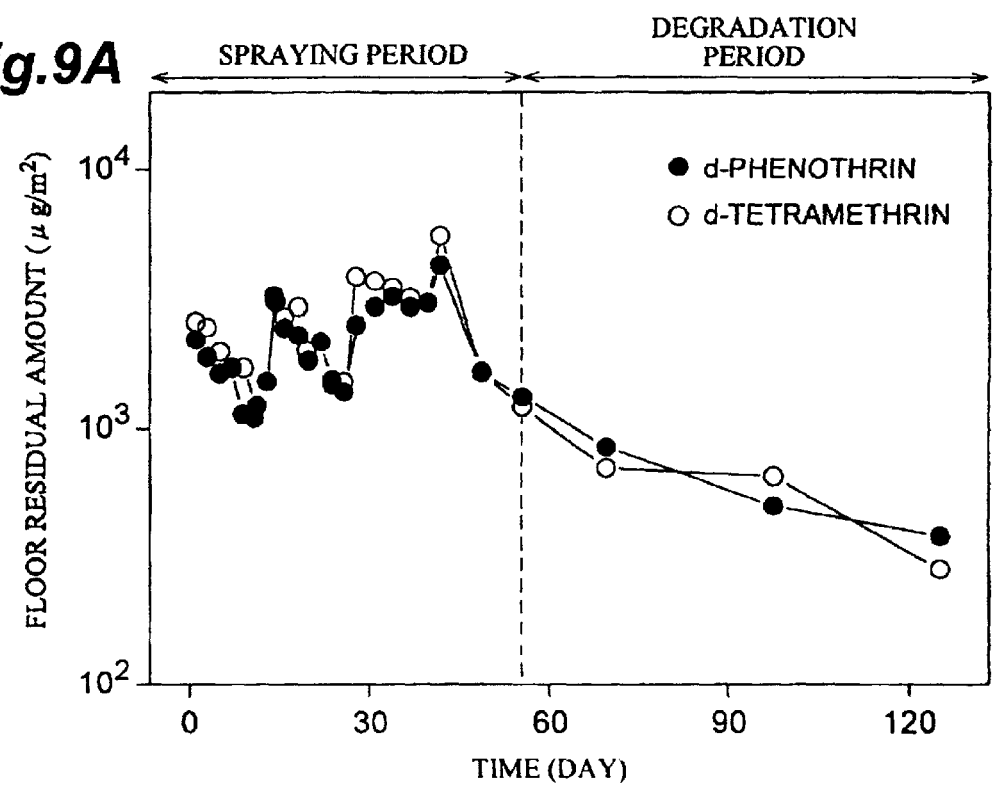
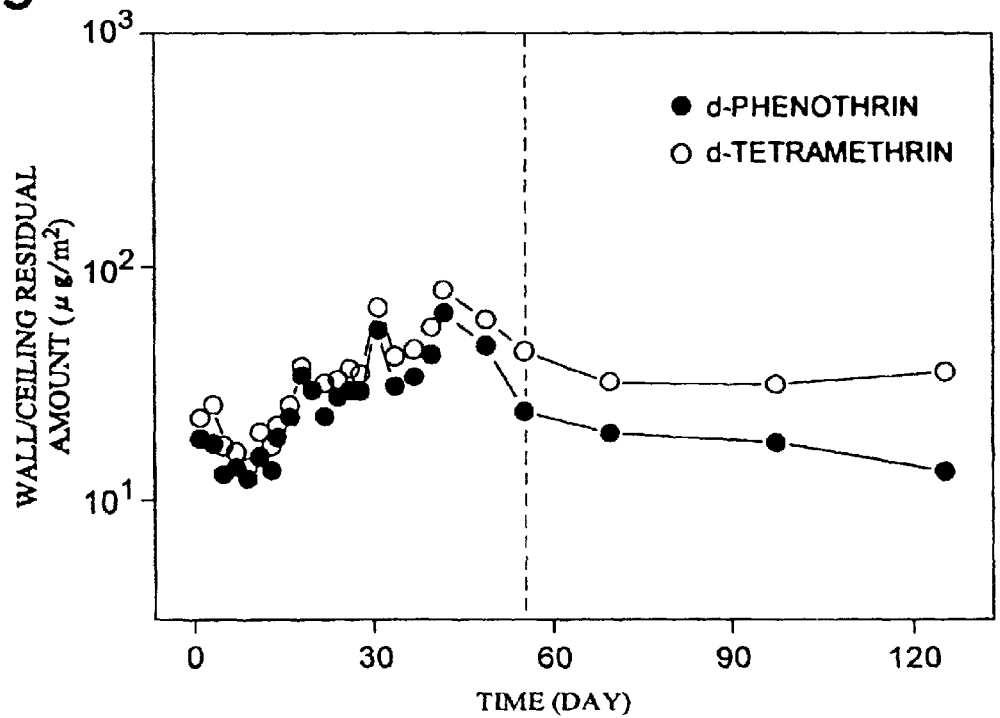

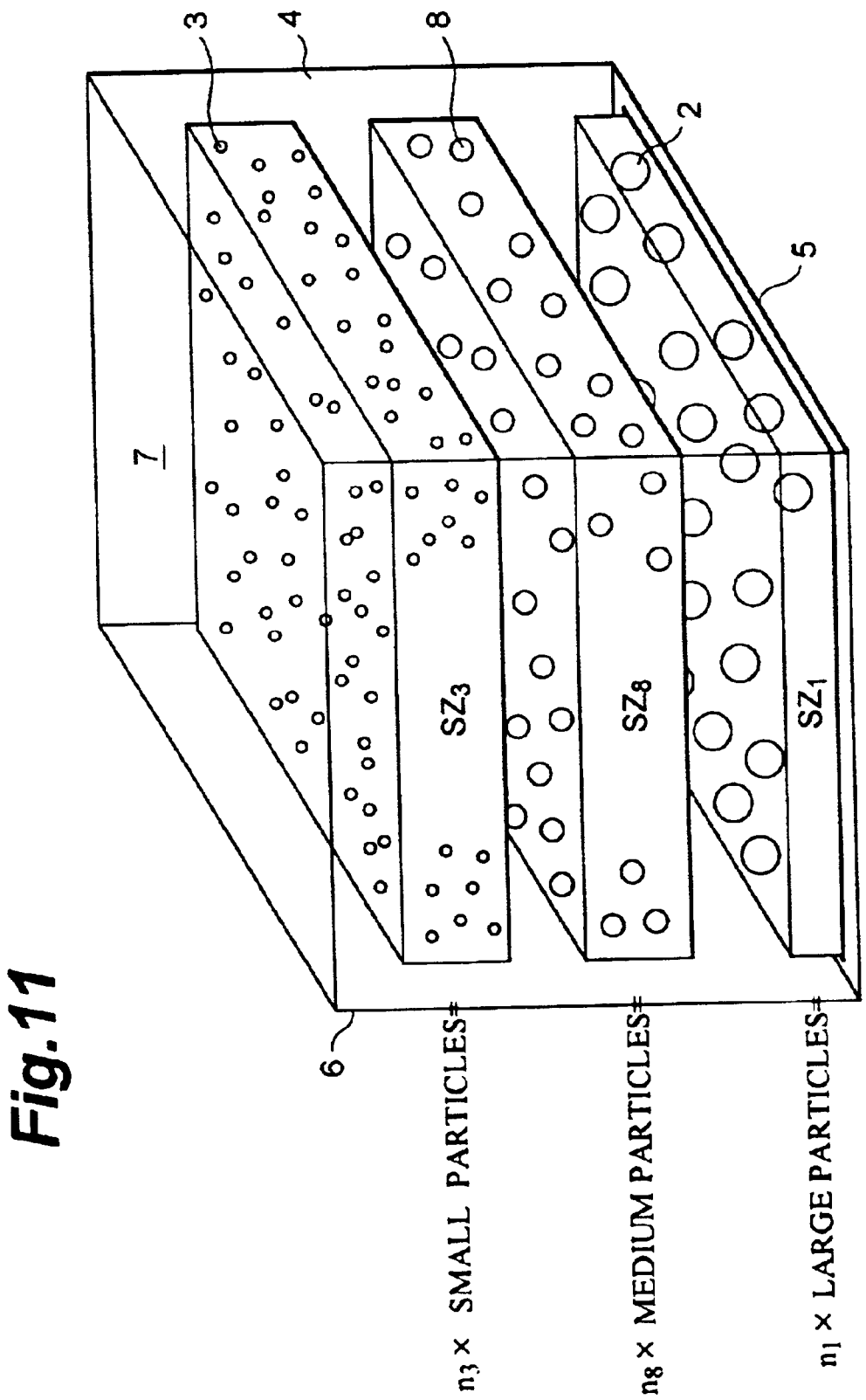

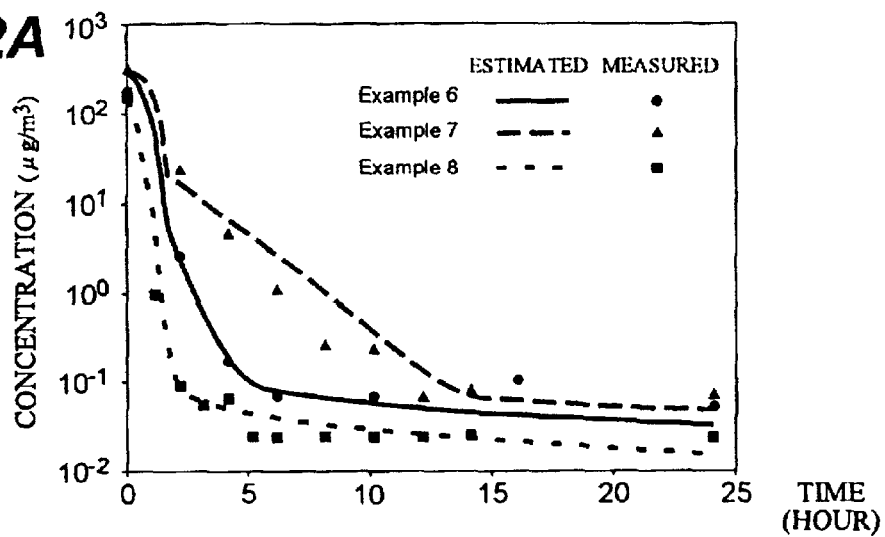
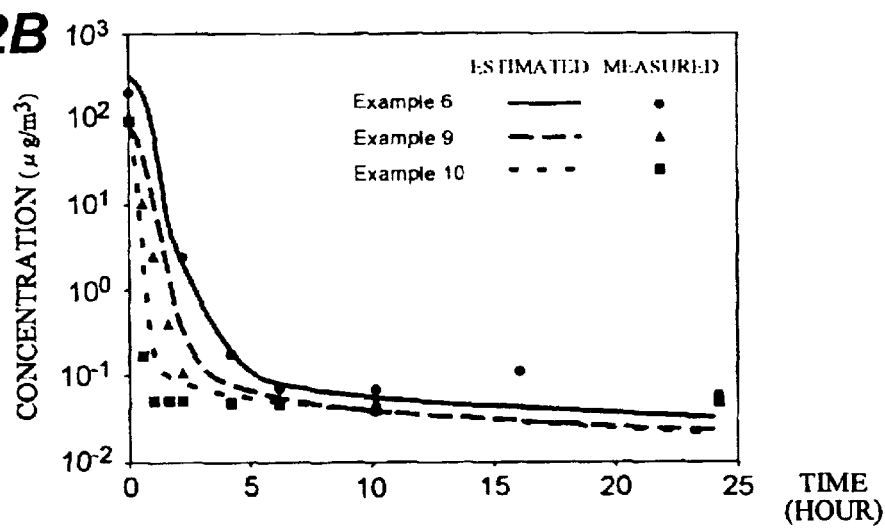
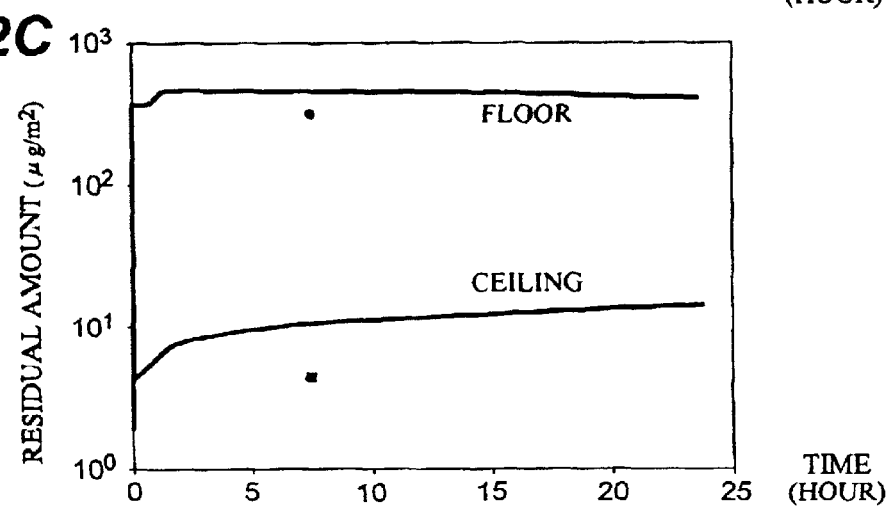

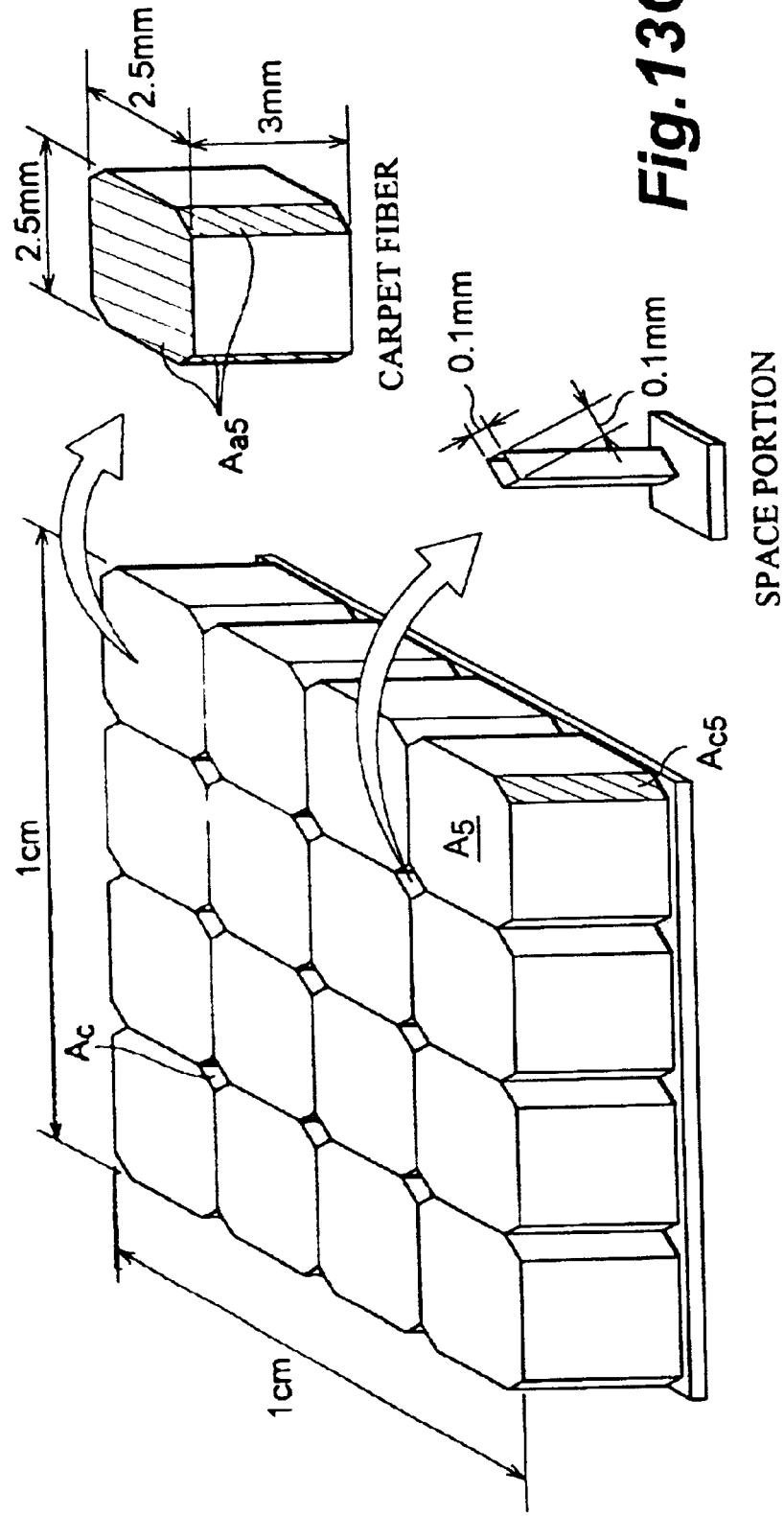

METHOD OF SIMULATING INDOOR BEHAVIOR OF PESTICIDAL COMPOUND

TECHNICAL FIELD

The present invention relates to a method of simulating, when a chemical containing a pesticidal compound is used indoors, an indoor behavior of the pesticidal compound including an estimation method of estimating the indoor behavior of the compound and a safety evaluating method of evaluating its safety in human bodies by using the estimation method; and, in particular, to a method of simulating an indoor behavior of a pesticidal compound in the case where a chemical containing the pesticidal compound is residually sprayed, sprayed in an indoor space, heated to vaporize, or sprayed over the whole floor area.

BACKGROUND ART

Conventionally known is a fugaciousness (hereinafter referred to as Fugacity) model for simulating a behavior of a chemical material in global environment. The above-mentioned fugacity model utilizes Fugacity whose unit is an external force by which the chemical material escapes from one medium to another medium, i.e., pressure. For example, when the chemical material concentration differs between two media A and B, concentrations in the respective media are expressed by:

$$N_A/V_A = f_A Z_A$$

$$N_B/V_B = f_B Z_B$$

wherein N is chemical mass, V is volume of medium, f is Fugacity, and Z is Fugacity capacity of medium.

Here, while the mass N changes over time according to transference and degradation of the chemical material between the media A and B; assuming that volume V and Fugacity capacity Z are constant, the above-mentioned two expressions are represented as:

$$(df_A/dt)V_A Z_A = dN_A/dt = -(\text{Degradation})_A \pm (\text{Transference})_{AB}$$

$$(df_B/dt)V_B Z_B = dN_B/dt = -(\text{Degradation})_B \pm (\text{Transference})_{AB}$$

When Degradation and Transference in these two differential equations are given, unknown parameters $f_A$ and $f_B$ can be determined by calculation. When these parameters are respectively multiplied by Fugacity capacity $Z_A$ and $Z_B$, the chemical material concentrations in the respective media in a specific period of time can be simulated.

As an apparatus for simulating a behavior of a chemical material, Japanese Patent Application Laid-Open No. 64-88811 discloses a configuration of closed-space simulator which can perform simulation in response to any capacity of closed space without actually constructing a closed space when evaluating temperature change of a specific gas component such as carbonic acid gas.

As a configuration for evaluating influence of a harmful material on human bodies, Japanese Patent Application Laid-Open No. 3-89146 discloses a configuration of percutaneous absorption evaluation apparatus employing a vertical type diffusion cell which is a system closer to a clinical state than is a parallel type cell, thereby being capable of simultaneously measuring, in real time, the process of a chemical being emitted from its base on the skin by optoacoustic measurement and the process of the chemical infiltrating through the skin by absorptiometry.

Also, Japanese Patent Application Laid-Open No. 7-218496 discloses a configuration of system which uses the fact that a dissolution parameter inherently existing in a chemical material and a logarithmic value of median lethal dose of the chemical material with respect to a mammal are in a specific correlation, estimating acute toxicity of the chemical material with respect to the mammal.

Further, simulations of indoor behavior of a pesticidal compound when insecticides are sprayed in an indoor space, electrically heated to vaporize in a room, and sprayed over the whole floor surface are respectively disclosed in Y. Matoba et al., "A SIMULATION OF INSECTICIDES IN INDOOR AEROSOL SPACE SPRAYING," Chemosphere, Vol.26, No.6, pp. 1167–1186, 1993; Y. Matoba et al., "INDOOR SIMULATION OF INSECTICIDES SUPPLIED WITH AN ELECTRIC VAPORIZER BY THE FUGACITY MODEL," Chemosphere, Vol.28, No.4, pp.767–786, 1994; and Y. Matoba et al., "INDOOR SIMULATION OF INSECTICIDES IN BROADCAST SPRAYING," Chemosphere, Vol.30, No.2, pp. 345–365, 1995.

DISCLOSURE OF INVENTION

The above-mentioned simulation models, however, do not mention how to solve differential equations, and minute time units set when solving the differential equations are assumed to be constant. Theoretically, the smaller is the minute time unit, the longer becomes the calculation time; whereas the solution would not converge when the minute time unit is large. Accordingly, in the case where a differential equation containing a parameter which changes over time is to be solved, when the minute time unit is set to a constant value so that the solution does not diverge, there is a problem that the processing speed of a computer must be enhanced.

Also, the above-mentioned simulation models fail to mention any security with respect to human bodies.

In order to solve the above-mentioned conventional problems, it is an object of the present invention to provide a method of simulating an indoor behavior of a pesticidal compound, which can process simultaneous differential equations accurately in a short time by automatically setting a minute time unit.

In order to achieve the above-mentioned object, the method of simulating an indoor behavior of a pesticidal compound in accordance with the present invention comprises a step of dividing an indoor environment into predetermined media (constituents) and forming a differential equation concerning a fugacity of the compound in each of the media; a step of determining the fugacity of the compound in each of the media from the differential equation; a step of determining the indoor behavior of the compound from the fugacity of the compound in each of the media; and a step of changing, in response to a fluctuation in mass balance of the compound indoors, a minute time unit used when solving the differential equation.

As the indoor environment is divided into predetermined media, and exchanges of the chemical compound between the media and the like are taken into account, simulation results close to the actual behavior of the compound can be obtained, while the minute time unit can be set automatically in response to fluctuation in mass balance when solving simultaneous differential equations including a parameter which changes over time. Accordingly, when a computer processes the above-mentioned differential equation, accurate solutions can be obtained in a short time.

Preferably, the method of simulating an indoor behavior of a pesticidal compound in accordance with the present invention further comprises a step of evaluating safety of the compound with respect to a human body according to the indoor behavior of the compound.

As a consequence of this configuration, the safety of the pesticidal compound with respect to the human body can be evaluated accurately in a short time. Accordingly, when formulating a chemical such as insecticide including the above-mentioned compound, simulation can be easily repeated while changing conditions, thereby making it easier to formulate a chemical having a high safety conforming to the aimed object.

Further, the method of simulating an indoor behavior of a pesticidal compound in accordance with the present invention may be such that the above-mentioned compound is introduced into an indoor space as a solution containing the compound is residually sprayed; whereas the above-mentioned media are a spraying site, suspended particles which are divided into at least one kind according to size, indoor air, a floor, a wall, and a ceiling.

Preferably, in this case, the differential equation at the spraying site is a differential equation stating a relationship among temporal change of fugacity of the compound at the spraying site, temporal change in volume of the spraying site, amount of attachment of the suspended particles to the spraying site, amount of transference of the compound between the spraying site and another medium, and change in amount of degradation of the compound at the spraying site; the differential equation in the suspended particles is a differential equation stating a relationship among temporal change of fugacity of the compound in the suspended particles, temporal change in volume of the suspended particles, amount of transference of the compound between the suspended particles and another medium, and change in amount of degradation of the compound in the suspended particles; the differential equation in the indoor air is a differential equation stating a relationship among temporal change of fugacity of the compound in the indoor air, amount of discharge of the compound outdoors, amount of transference of the compound between the indoor air and another medium, and change in amount of degradation of the compound in the indoor air; the differential equation at the floor is a differential equation stating a relationship among temporal change of fugacity of the compound at the floor, temporal change in volume of the floor, amount of attachment of the suspended particles to the floor, amount of transference of the compound between the floor and another medium, and change in amount of degradation of the compound at the floor; the differential equation at the wall is a differential equation stating a relationship among temporal change of fugacity of the compound at the wall, temporal change in volume of the wall, amount of attachment of the suspended particles to the wall, amount of transference of the compound between the wall and another medium, and change in amount of degradation of the compound at the wall; and the differential equation at the ceiling is a differential equation stating a relationship among temporal change of fugacity of the compound at the ceiling, temporal change in volume of the ceiling, amount of attachment of the suspended particles to the ceiling, amount of transference of the compound between the ceiling and another medium, and change in amount of degradation of the compound at the ceiling.

The method of simulating an indoor behavior of a pesticidal compound in accordance with the present invention may be such that the above-mentioned compound is introduced into an indoor space as a solution containing the compound is spatially sprayed; whereas the above-mentioned media are suspended particles which are divided into at least one kind according to size, indoor air, a floor, a wall, and a ceiling.

Preferably, in this case, the differential equation in the suspended particles is a differential equation stating a relationship among temporal change of fugacity of the compound in the suspended particles, temporal change in volume of the suspended particles, amount of transference of the compound between the suspended particles and another medium, and change in amount of degradation of the compound in the suspended particles; the differential equation in the indoor air is a differential equation stating a relationship among temporal change of fugacity of the compound in the indoor air, amount of discharge of the compound outdoors, amount of transference of the compound between the indoor air and another medium, and change in amount of degradation of the compound in the indoor air; the differential equation at the floor is a differential equation stating a relationship among temporal change of fugacity of the compound at the floor, temporal change in volume of the floor, amount of attachment of the suspended particles to the floor, amount of transference of the compound between the floor and another medium, and change in amount of degradation of the compound at the floor; the differential equation at the wall is a differential equation stating a relationship among temporal change of fugacity of the compound at the wall, temporal change in volume of the wall, amount of attachment of the suspended particles to the wall, amount of transference of the compound between the wall and another medium, and change in amount of degradation of the compound at the wall; and the differential equation at the ceiling is a differential equation stating a relationship among temporal change of fugacity of the compound at the ceiling, temporal change in volume of the ceiling, amount of attachment of the suspended particles to the ceiling, amount of transference of the compound between the ceiling and another medium, and change in amount of degradation of the compound at the ceiling.

The method of simulating an indoor behavior of a pesticidal compound in accordance with the present invention may be such that the above-mentioned compound is introduced into an indoor space as a solution containing the compound is heated to vaporize; whereas the above-mentioned media are condensed particles which are divided into at least one kind according to generation and extinction, high-concentration air, medium-concentration air, low-concentration air, a floor, a wall, and a ceiling which is divided into at least one kind according to compound concentration.

Preferably, in this case, the differential equation in the condensed particles is a differential equation stating a relationship among temporal change of fugacity of the compound in the condensed particles, temporal change in volume of the condensed particles, amount of transference of the compound between the condensed particles and another medium, and change in amount of degradation of the compound in the condensed particles; the differential equation in the high-concentration air is a differential equation stating a relationship among temporal change of fugacity of the compound in the high-concentration air, amount of discharge of the compound, amount of transference of the compound between the high-concentration air and another medium, and change in amount of degradation of the compound in the high-concentration air; the differential equation in the medium-concentration air is a differential equation stating a relationship among temporal change of fugacity of the compound in the medium-concentration air, amount of transference of the compound between the medium-concentration air and another medium, and change in amount of degradation of the compound in the medium-concentration air; the differential equation in the low-concentration air is a differential equation stating a relationship among temporal change of fugacity of the compound in the low-concentration air, amount of discharge of the compound outdoors, amount of transference of the compound between the low-concentration air and another medium, and change in amount of degradation of the compound in the low-concentration air; the differential equation at the floor is a differential equation stating a relationship among temporal change of fugacity of the compound at the floor, temporal change in volume of the floor, amount of transference of the compound between the floor and another medium, and change in amount of degradation of the compound at the floor; the differential equation at the wall is a differential equation stating a relationship among temporal change of fugacity of the compound at the wall, temporal change in volume of the wall, amount of transference of the compound between the wall and another medium, and change in amount of degradation of the compound at the wall; and the differential equation at the ceiling is a differential equation stating a relationship among temporal change of fugacity of the compound at the ceiling, temporal change in volume of the ceiling, amount of transference of the compound between the ceiling and another medium, and change in amount of degradation of the compound at the ceiling.

The method of simulating an indoor behavior of a pesticidal compound in accordance with the present invention may be such that the above-mentioned compound is introduced into an indoor space as a solution containing the compound is sprayed over the whole floor; whereas the above-mentioned media are suspended particles which are divided into at least one kind according to size, indoor air, a floor, a wall, and a ceiling.

Preferably, in this case, the differential equation in the suspended particles is a differential equation stating a relationship among temporal change of fugacity of the compound in the suspended particles, temporal change in volume of the suspended particles, amount of transference of the compound between the suspended particles and another medium, and change in amount of degradation of the compound in the suspended particles; the differential equation in the indoor air is a differential equation stating a relationship among temporal change of fugacity of the compound in the indoor air, amount of discharge of the compound outdoors, amount of transference of the compound between the indoor air and another medium, and change in amount of degradation of the compound in the indoor air; the differential equation at the floor is a differential equation stating a relationship among temporal change of fugacity of the compound at the floor, temporal change in volume of the floor, amount of attachment of the suspended particles to the floor, amount of transference of the compound between the floor and another medium, and change in amount of degradation of the compound at the floor; the differential equation at the wall is a differential equation stating a relationship among temporal change of fugacity of the compound at the wall, temporal change in volume of the wall, amount of attachment of the suspended particles to the wall, amount of transference of the compound between the wall and another medium, and change in amount of degradation of the compound at the wall; and the differential equation at the ceiling is a differential equation stating a relationship among temporal change of fugacity of the compound at the ceiling, temporal change in volume of the ceiling, amount of attachment of the suspended particles to the ceiling, amount of transference of the compound between the ceiling and another medium, and change in amount of degradation of the compound at the ceiling.

The method of simulating an indoor behavior of a pesticidal compound in accordance with the present invention may be such that the floor is constituted by a rug having ears of fiber, whereas a space between the ears is added to the above-mentioned media.

Preferably, in this case, the differential equation in the space between the ears is a differential equation stating a relationship among temporal change of fugacity of the compound in the space between the ears, temporal change in volume of the solution containing the compound in the space between the ears, amount of attachment of the compound into the space portion between the ears by falling, amount of transference of the compound between the space portion between the ears and another medium, and change in amount of degradation of the compound in the space portion between the ears.

Even in the case where a rug having ears of fiber is spread on the floor, when the space between the ears is further added to the media, the behavior of the compound can be simulated accurately, thus allowing various kinds of simulations to be performed.

In order to achieve the above-mentioned object, the computer program product of the present invention is a computer program product to be used together with an information processing apparatus comprising input means for receiving a data input from outside, display means, and readout means for reading out information from a computer-usable storage medium; the computer program product comprising a computer-usable storage medium which has a program area for storing a program and has a computer-readable program materialized in the storage medium for causing, according to data input from the input means, the display means to display a result of simulation of an indoor behavior of a pesticidal compound; the computer program product comprising, in the program area, a program for dividing an indoor environment into predetermined media and forming a differential equation concerning a fugacity of the compound, a program for determining the fugacity of the compound in each of the media from the differential equation; a program for determining the indoor behavior of the compound from the fugacity of the compound in each of the media, and a program for changing, in response to a fluctuation in mass balance of the compound indoors, a minute time unit used when solving the differential equation.

As the indoor environment is divided into predetermined media, and exchanges of the chemical compound between the media and the like are taken into account, simulation results close to the actual behavior of the compound can be obtained, while the minute time unit can be set automatically in response to fluctuation in mass balance when solving simultaneous differential equations including a parameter which changes over time. Accordingly, when a computer processes the above-mentioned differential equation, accurate solutions can be obtained in a short time.

Preferably, the computer program product further comprises, in the program area, a program for evaluating safety of the compound with respect to a human body according to the indoor behavior of the compound.

As a consequence of this configuration, the safety of the pesticidal compound with respect to the human body can be evaluated accurately in a short time. Accordingly, when formulating a chemical such as insecticide including the above-mentioned compound, simulation can be easily repeated while changing conditions, thereby making it easier to formulate a chemical having a high safety conforming to the aimed object.

The computer program product of the present invention may be such that the above-mentioned compound is introduced into an indoor space as a solution containing the compound is residually sprayed; whereas the above-mentioned media are a spraying site, suspended particles which are divided into at least one kind according to size, indoor air, a floor, a wall, and a ceiling.

Preferably, in this case, the differential equation at the spraying site is a differential equation stating a relationship among temporal change of fugacity of the compound at the spraying site, temporal change in volume of the spraying site, amount of attachment of the suspended particles to the spraying site, amount of transference of the compound between the spraying site and another medium, and change in amount of degradation of the compound at the spraying site; the differential equation in the suspended particles is a differential equation stating a relationship among temporal change of fugacity of the compound in the suspended particles, temporal change in volume of the suspended particles, amount of transference of the compound between the suspended particles and another medium, and change in amount of degradation of the compound in the suspended particles; the differential equation in the indoor air is a differential equation stating a relationship among temporal change of fugacity of the compound in the indoor air, amount of discharge of the compound outdoors, amount of transference of the compound between the indoor air and another medium, and change in amount of degradation of the compound in the indoor air; the differential equation at the floor is a differential equation stating a relationship among temporal change of fugacity of the compound at the floor, temporal change in volume of the floor, amount of attachment of the suspended particles to the floor, amount of transference of the compound between the floor and another medium, and change in amount of degradation of the compound at the floor; the differential equation at the wall is a differential equation stating a relationship among temporal change of fugacity of the compound at the wall, temporal change in volume of the wall, amount of attachment of the suspended particles to the wall, amount of transference of the compound between the wall and another medium, and change in amount of degradation of the compound at the wall; and the differential equation at the ceiling is a differential equation stating a relationship among temporal change of fugacity of the compound at the ceiling, temporal change in volume of the ceiling, amount of attachment of the suspended particles to the ceiling, amount of transference of the compound between the ceiling and another medium, and change in amount of degradation of the compound at the ceiling.

The computer program product of the present invention may be such that the above-mentioned compound is introduced into an indoor space as a solution containing the compound is spatially sprayed; whereas the above-mentioned media are suspended particles which are divided into at least one kind according to size, indoor air, a floor, a wall, and a ceiling.

Preferably, in this case, the differential equation in the suspended particles is a differential equation stating a relationship among temporal change of fugacity of the compound in the suspended particles, temporal change in volume of the suspended particles, amount of transference of the compound between the suspended particles and another medium, and change in amount of degradation of the compound in the suspended particles; the differential equation in the indoor air is a differential equation stating a relationship among temporal change of fugacity of the compound in the indoor air, amount of discharge of the compound outdoors, amount of transference of the compound between the indoor air and another medium, and change in amount of degradation of the compound in the indoor air; the differential equation at the floor is a differential equation stating a relationship among temporal change of fugacity of the compound at the floor, temporal change in volume of the floor, amount of attachment of the suspended particles to the floor, amount of transference of the compound between the floor and another medium, and change in amount of degradation of the compound at the floor; the differential equation at the wall is a differential equation stating a relationship among temporal change of fugacity of the compound at the wall, temporal change in volume of the wall, amount of attachment of the suspended particles to the wall, amount of transference of the compound between the wall and another medium, and change in amount of degradation of the compound at the wall; and the differential equation at the ceiling is a differential equation stating a relationship among temporal change of fugacity of the compound at the ceiling, temporal change in volume of the ceiling, amount of attachment of the suspended particles to the ceiling, amount of transference of the compound between the ceiling and another medium, and change in amount of degradation of the compound at the ceiling.

The computer program product of the present invention may be such that the above-mentioned compound is introduced into an indoor space as a solution containing the compound is heated to vaporize; whereas the above-mentioned media are condensed particles which are divided into at least one kind according to generation and extinction, high-concentration air, medium-concentration air, low-concentration air, a floor, a wall, and a ceiling which is divided into at least one kind according to compound concentration.

Preferably, in this case, the differential equation in the condensed particles is a differential equation stating a relationship among temporal change of fugacity of the compound in the condensed particles, temporal change in volume of the condensed particles, amount of transference of the compound between the condensed particles and another medium, and change in amount of degradation of the compound in the condensed particles; the differential equation in the high-concentration air is a differential equation stating a relationship among temporal change of fugacity of the compound in the high-concentration air, amount of discharge of the compound, amount of transference of the compound between the high-concentration air and another medium, and change in amount of degradation of the compound in the high-concentration air; the differential equation in the medium-concentration air is a differential equation stating a relationship among temporal change of fugacity of the compound in the medium-concentration air, amount of transference of the compound between the medium-concentration air and another medium, and change in amount of degradation of the compound in the medium-concentration air; the differential equation in the low-concentration air is a differential equation stating a relationship among temporal change of fugacity of the compound in the low-concentration air, amount of discharge of the compound outdoors, amount of transference of the compound between the low-concentration air and another medium, and change in amount of degradation of the compound in the low-concentration air; the differential equation at the floor is a differential equation stating a relationship among temporal change of fugacity of the compound at the floor, temporal change in volume of the floor, amount of transference of the compound between the floor and another medium, and change in amount of degradation of the compound at the floor; the differential equation at the wall is a differential equation stating a relationship among temporal change of fugacity of the compound at the wall, temporal change in volume of the wall, amount of transference of the compound between the wall and another medium, and change in amount of degradation of the compound at the wall; and the differential equation at the ceiling is a differential equation stating a relationship among temporal change of fugacity of the compound at the ceiling, temporal change in volume of the ceiling, amount of transference of the compound between the ceiling and another medium, and change in amount of degradation of the compound at the ceiling.

The computer program product of the present invention may be such that the above-mentioned compound is introduced into an indoor space as a solution containing the compound is sprayed over the whole floor; while the above-mentioned media are suspended particles which are divided into at least one kind according to size, indoor air, a floor, a wall, and a ceiling.

Preferably, in this case, the differential equation in the suspended particles is a differential equation stating a relationship among temporal change of fugacity of the compound in the suspended particles, temporal change in volume of the suspended particles, amount of transference of the compound between the suspended particles and another medium, and change in amount of degradation of the compound in the suspended particles; the differential equation in the indoor air is a differential equation stating a relationship among temporal change of fugacity of the compound in the indoor air, amount of discharge of the compound outdoors, amount of transference of the compound between the indoor air and another medium, and change in amount of degradation of the compound in the indoor air; the differential equation at the floor is a differential equation stating a relationship among temporal change of fugacity of the compound at the floor, temporal change in volume of the floor, amount of attachment of the suspended particles to the floor, amount of transference of the compound between the floor and another medium, and change in amount of degradation of the compound at the floor; the differential equation at the wall is a differential equation stating a relationship among temporal change of fugacity of the compound at the wall, temporal change in volume of the wall, amount of attachment of the suspended particles to the wall, amount of transference of the compound between the wall and another medium, and change in amount of degradation of the compound at the wall; and the differential equation at the ceiling is a differential equation stating a relationship among temporal change of fugacity of the compound at the ceiling, temporal change in volume of the ceiling, amount of attachment of the suspended particles to the ceiling, amount of transference of the compound between the ceiling and another medium, and change in amount of degradation of the compound at the ceiling.

The computer program product of the present invention may be such that the floor is constituted by a rug having ears of fiber, whereas a space between the ears is added to the above-mentioned media.

Preferably, in this case, the differential equation in the space between the ears is a differential equation stating a relationship among temporal change of fugacity of the compound in the space between the ears, temporal change in volume of the solution containing the compound in the space between the ears, amount of attachment of the compound into the space portion between the ears by falling, amount of transference of the compound between the space portion between the ears and another medium, and change in amount of degradation of the compound in the space portion between the ears.

Even in the case where a rug having ears of fiber is spread on the floor, when the space between the ears is further added to the media, the behavior of the compound can be simulated accurately, thus allowing various kinds of simulations to be performed.

BRIEF DESCRIPTION OF DRAWINGS

FIG. 9A is a graph showing temporal change in residual amount on the floor in Example 1;

FIG. 9B is a graph showing temporal change in residual amount on the wall and ceiling in Example 1;

FIG. 11 is an explanatory view showing a modeled state of indoor environment in the case where an indoor behavior of a compound is estimated in the third embodiment of the present invention;

FIG. 12A is a graph comparing actually measured values of concentration in the air and their simulation results in Examples 6 to 10;

FIG. 12B is a graph comparing actually measured values of concentration in the air and their simulation results in Examples 6 to 10;

FIG. 12C is a graph comparing actually measured values of residual amount on the floor and ceiling and their simulation results in Example 6;

FIG. 13A is an explanatory view showing a modeled state of a carpet in the case where an indoor behavior of a pesticidal compound is estimated in accordance with the fourth embodiment of the present invention;

FIG. 13B is an enlarged view of a carpet fiber in the case where an indoor behavior of a pesticidal compound is estimated in accordance with the fourth embodiment of the present invention;

FIG. 13C is an enlarged view of a space portion of the carpet in the case where an indoor behavior of a pesticidal compound is estimated in accordance with the fourth embodiment of the present invention;

BEST MODES FOR CARRYING OUT THE INVENTION (1) First Embodiment

With reference to the drawings, the first embodiment of the present invention will be explained in the following.

The method of simulating an indoor behavior of a pesticidal compound (hereinafter simply referred to as compound) contained in a chemical (solution) such as insecticide in accordance with this embodiment estimates, for example, the behavior of the compound when the chemical is residually sprayed in order to exterminate indoor vermin such as cockroach. Here, residual spraying refers to a process in which a chemical is sprayed to a local site such as the boundary between a floor and a wall. The chemical encompasses all kinds of insecticides and the like, including pyrethroid insecticidal compounds, organophosphorus compounds, carbamate compounds, and insect growth restrainers (IGR).

Figure 2:
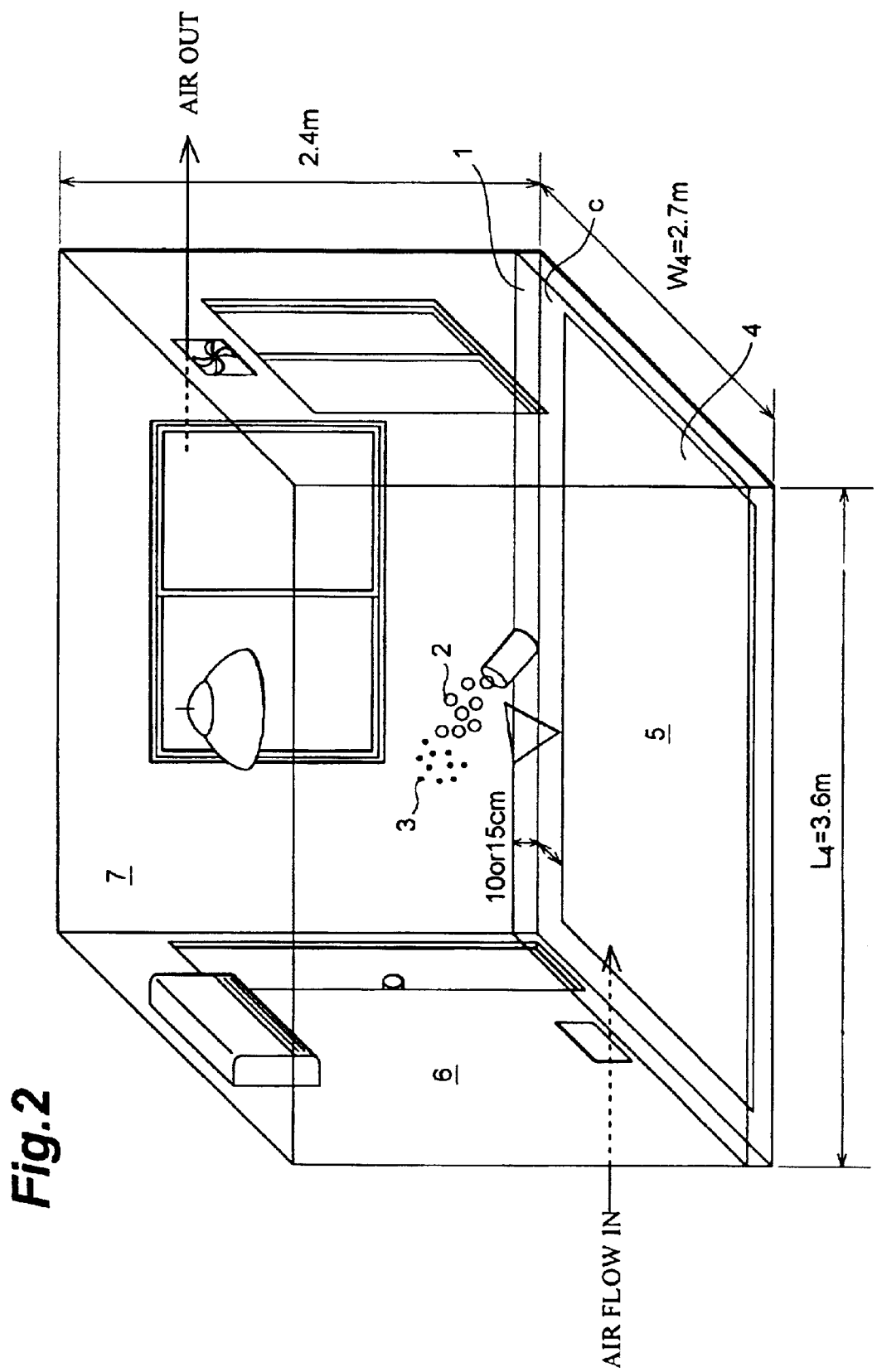
FIG. 2 is an explanatory view showing a model of indoor environment in the case where an indoor behavior of a compound is performed in the first embodiment of the present invention.

First, as shown in FIG. 2, an environment is classified into seven kinds of media consisting of spraying site 1, large particles (suspended particles) 2, small particles (suspended particles) 3, whole indoor air 4, floor 5, wall 6, and ceiling 7.

When a chemical is sprayed to the boundary between the floor 5 and the wall 6, part of the chemical attaches to the spraying site 1, whereas the rest dissipates into the air as large and small particles 2 and 3. The chemical attached to the spraying site 1 not only infiltrates into this site but also evaporates. On the other hand, among the large and small particles 2 and 3, the smaller particles 3, due to their weight, scatter higher than the larger particles 2. When these particles attach onto interior materials of the floor 5, wall 6, and ceiling 7, the compound in the particles moves into the air 4 after infiltrating into the interior materials or is degraded by light or oxidation. Such large and small particles 2 and 3 and evaporated chemical have decreased due to ventilation of the room.

Simultaneous differential equations concerning Fugacity of the compound in the above-mentioned seven kinds of media are formed and are solved by Runge-Kutta-Gill method, whereby the indoor behavior of the compound in the chemical when the chemical is residually sprayed, i.e., compound distribution in the room, and temporal change in amount of attachment to the spraying site 1, floor 5, wall 6, or ceiling 7 are estimated and analyzed.

Here, since the floor 5 mainly comprises three kinds, i.e., tatami, flooring, or carpet (rug), the differential equation is formed so as to correspond to the kind of floor. Explained in this embodiment is the case where the floor 5 is made of flooring.

Figure 1:
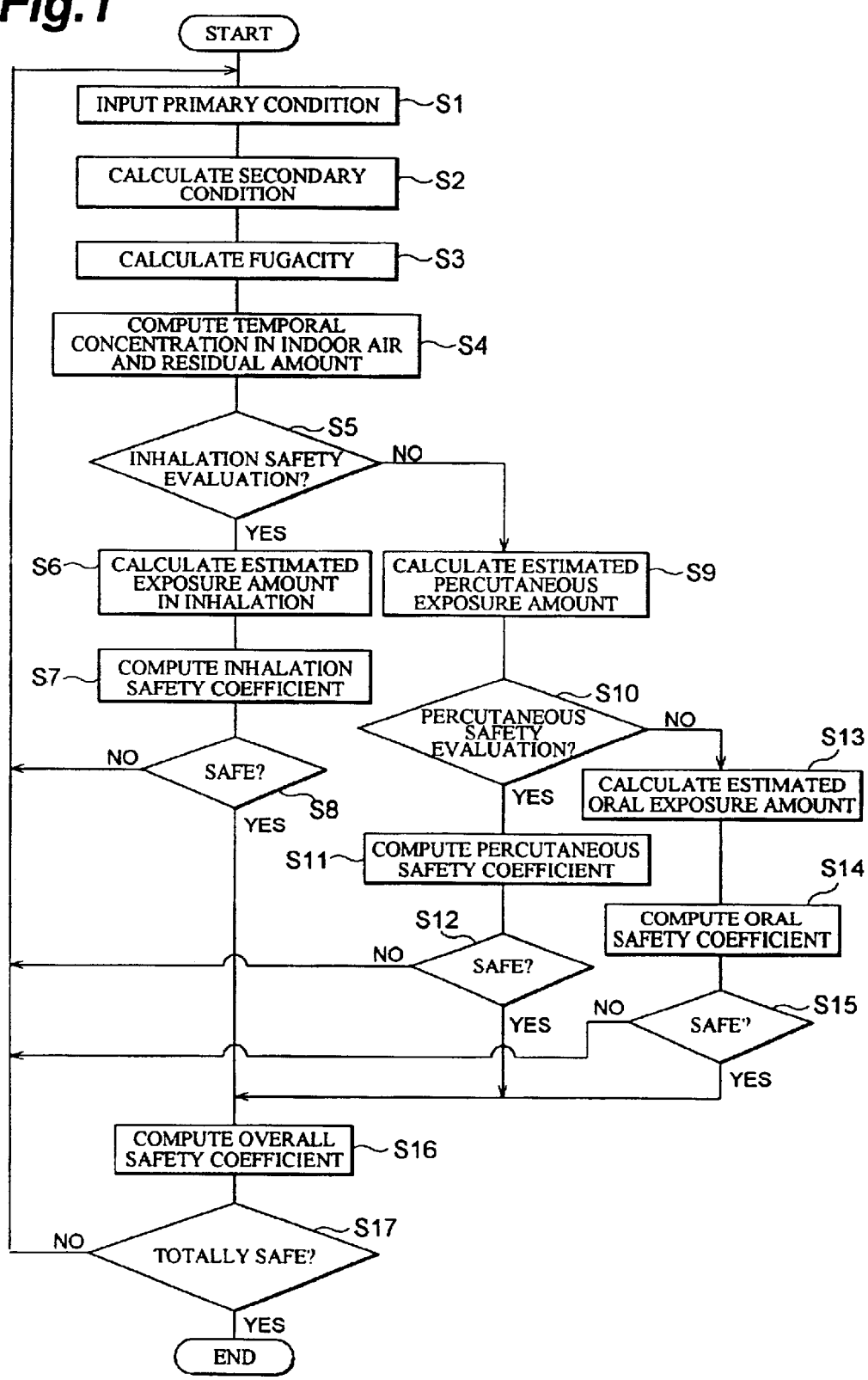
FIG. 1 is a flowchart showing a method of simulating an indoor behavior of a pesticidal compound in accordance with an embodiment of the present invention.

With reference to FIG. 1, a method of simulating an indoor behavior of the compound will be explained. The simulation method in accordance with this embodiment can be mainly divided into a step of dividing an indoor environment into predetermined media and forming a differential equation concerning a fugacity of the compound in each medium (S1 to S2); a step of determining the fugacity of the compound in each medium from the differential equation (S3); a step of determining the indoor behavior of the compound from the fugacity of the compound in each medium (S4); a step of changing, in response to a fluctuation in mass balance of the compound indoors, a minute time unit used when solving the differential equation (S21 to S35, see FIG. 5); and a step of evaluating safety of the compound with respect to a human body according to the indoor behavior of the compound (S5 to S17).

First, at step (hereinafter abridged as S) 1, a primary condition is inputted. The primary condition comprises physicochemical properties of the compound (see Table 1), indoor environmental behavior properties of the compound (see Table 2), indoor environment (see Table 3), and product properties (see Table 4).

TABLE 1

| PHYSIOCHEMICAL PROPERTY OF COMPOUND | SYMBOL | EXAMPLE OF VALUE |
| --- | --- | --- |
| MOLECULAR WEIGHT | — | 350.46 [g/mole] |
| SPECIFIC GRAVITY | $\rho$ | 1.11 [g/cm$^3$] |
| VAPOR PRESSURE | $P^s$ | 1.60 × 10$^{-4}$ [Pa] |

TABLE 1-continued

| PHYSIOCHEMICAL PROPERTY OF COMPOUND | SYMBOL | EXAMPLE OF VALUE |
|---|---|---|
| WATER SOLUBILITY | $C^S$ | $6.28 \times 10^{-3}$ [mole/m$^3$] |
| OCTANOL/WATER DISTRIBUTION COEFFICIENT | $K_{OW}$ | $7.59 \times 10^4$ |

TABLE 2

| INDOOR ENVIRONMENTAL BEHAVIOR PROPERTY OF COMPOUND | SYMBOL | EXAMPLE OF VALUE |
|---|---|---|
| DEGRADATION HALF-LIFE | | |
| IN SPRAYING SITE | $\tau_1$ | 13 [day] |
| PARTICLE | $\tau_i$ (i = 2,3) | 7.7 [h] |
| AIR | $\tau_4$ | 7.7 [h] |
| FLOOR | $\tau_5$ | 13 [day] (IN CASE OF FLOORING) |
| WALL/CEILING | $\tau_j$ (j = 6,7) | 31 [day] (IN CASE OF WALLPAPER) |

TABLE 3

| | INDOOR ENVIRONMENT | SYMBOL | EXAMPLE OF VALUE |
|---|---|---|---|
| OIL BASE | ROOM SIZE | $V_4$ | 23.3 [m$^3$] |
| | TEMPERATURE | T | 895 [K] (=25 [° C.]) |
| | RELATIVE HUMIDITY | $\phi$ | 60 [% RH] |
| | ABSOLUTE HUMIDITY | H | $1.19 \times 10^{-2}$ (kg-H$_2$O/kg-dry air) |
| | VENTILATION RATE | G | 1.58 [1/h] |
| | INDOOR VAPOR PRESSURE IN PARTICLE - CONSTITUTING SOLVENT | $P\infty$ | 0 [Pa] |
| | AIR DIFFUSION COEFFICIENT | Dair | $8.64 \times 10^{-2}$ [m$^2$/h] |
| | OIL COMPONENT CONTENT | | 0.04 (IN CASE OF FLOORING) 0.46 (IN CASE OF TATAMI) 0.3 (IN CASE OF WALLPAPER) |
| WATER BASE | WET-BULB TEMPERATURE | $T_d$ | 292.5 [K] |
| | VAPOR PRESSURE OF WATER | $P\infty$ | $1.89 \times 10^{3}$ [Pa] |

HERE, $V_4 = L_4 \times W_4 \times$ HEIGHT (= 3.6 m $\times$ 2.7 m $\times$ 2.4 m)

TABLE 4

| | PRODUCT PROPERTY | SYMBOL | EXAMPLE OF VALUE |
|---|---|---|---|
| OIL BASE | COMPOUND CONTENT | $C_a$ | $6.74 \times 10^3$ [g/m$^3$] |
| | COMPOUND EMISSION AMOUNT | $A_a$ | $8.19 \times 10^{-4}$ [mole] |
| | PARTICLE CONSTITUTING SOLVENT EMISSION AMOUNT | $O_a$ | $4.26 \times 10^{-5}$ [m$^3$] |
| | PARTICLE-CONSTITUTING SOLVENT PROPERTY | | |
| | VAPOR PRESSURE | $P_d$ | 2.72 [Pa] |
| | MOLECULAR WEIGHT | $M_d$ | 184.37 [g/mole] |
| | SPECIFIC GRAVITY | $\rho d$ | $7.56 \times 10^{-6}$ [g/m$^3$] |
| | RATIO OF ATTACHMENT TO SPRAYING SITE | — | 60 [%] |

TABLE 4-continued

| | PRODUCT PROPERTY | SYMBOL | EXAMPLE OF VALUE |
|---|---|---|---|
| | DIAMETERS OF SUSPENDED PARTICLES (2 KINDS) | $d_{o2}$ $d_{o3}$ | 20 [μm] 5 [μm] |
| | DISTRIBUTIONS OF SUSPENDED PARTICLES (2 KINDS) | — — | 30 [%] (LARGE PARTICLE) 10 [%] (SMALL PARTICLE) |
| | SPRAYING SITE AREA | $A_t$ | (3.6 + 2.7) $\times$ 0.1 $\times$ 4 [m$^2$] |
| WATER BASE | PARTICLE - CONSTITUTING SOLVENT PROPERTY | | |
| | VAPOR PRESSURE | $P_d$ | $2.26 \times 10^3$ [Pa] |
| | MOLECULAR WEIGHT | $M_d$ | 18 [g/mole] |
| | SPECIFIC GRAVITY | $\rho_d$ | $1 \times 10^6$ [g/m$^3$] |

Subsequently, using the primary condition, a secondary condition is determined by calculation (S2). The secondary condition comprises a temporally unchangeable definite factor condition (see Table 5) determined by the primary condition alone, and a temporal change condition accompanying a temporal change (see Table 6). Their calculations will be explained later in detail.

TABLE 5

| DEFINITE FACTOR CONDITION | SYMBOL |
|---|---|
| EVAPORATION CONSTANT OF SUSPENDED PARTICLE | $\alpha$ |
| VOLUME RATIO OF COMPOUND IN PRODUCT | $R_a$ |
| DIFFUSION COEFFICIENT OF COMPOUND IN AIR | $D_{ca}$ |
| SURFACE AREA OF FLOOR/WALL/CEILING | $A_j$ (j = 5,6,7) |
| DIFFUSION COEFFICIENT OF FLOOR/WALL/CEILING | $D_c$ |
| RATIO OF SUSPENDED PARTICLE FALLING TO SPRAYING SITE | $\gamma 1$ |
| RATIO OF SUSPENDED PARTICLE ATTACHING TO FLOOR/WALL/CEILING | $\gamma j$ (j = 5,6,7) |
| FUGACITY CAPACITY | |
| OF SPRAYING SITE | $Z_1$ |
| SUSPENDED PARTICLE | $Z_i$ (i = 2,3) |
| AIR | $Z_4$ |
| FLOOR/WALL/CEILING | $Z_j$ (j = 5,6,7) |
| DEGRADATION CONSTANT | |
| OF SPRAYING SITE | $K_1$ |
| SUSPENDED PARTICLE | $K_i$ (i = 2,3) |
| AIR | $K_4$ |
| FLOOR | $K_5$ |
| WALL/CEILING | $K_j$ (j = 6,7) |

HERE, AN EXAMPLE OF DIFFUSION COEFFICIENT ACCORDING TO EXAMPLES OF VALUES IN TABLE1 IS $1.36 \times 10^{-11}$ [m$^2$/h].

TABLE 6

| TEMPORAL CHANGE CONDITION | SYMBOL |
|---|---|
| SUSPENDED PARTICLE | |
| DIAMETER | $d_i$ (i = 2,3) |
| FALLING SPEED | $v_i$ (i = 2,3) |
| FLOATING NUMBER | $n_i$ (i = 2,3) |
| FLOATING HEIGHT | $H_i$ (i = 2,3) |

TABLE 6-continued

| TEMPORAL CHANGE CONDITION | SYMBOL |
|---|---|
| TRANSFERENCE SPEED OF COMPOUND | |
| IN SPRAYING SITE | $k_1$ |
| SUSPENDED PARTICLE | $k_i$ (i = 2,3) |
| AIR | $k_4$ |
| FLOOR/WALL/CEILING | $k_j$ (j = 5,6,7) |
| TRANSFERENCE COEFFICIENT OF COMPOUND BETWEEN SPRAYING SITE AND AIR | $D_{14}$ |
| TRANSFERENCE COEFFICIENT OF COMPOUND BETWEEN SUSPENDED PARTICLE AND AIR | $D_{i4}$ (i = 2,3) |
| TRANSFERENCE COEFFICIENT OF COMPOUND BETWEEN AIR AND FLOOR/WALL/CEILING | $D_{4j}$ (j = 5,6,7) |
| VOLUME OF SPRAYING SITE | $V_1$ |
| VOLUME OF SUSPENDED PARTICLE | $V_i$ (i = 2,3) |
| VOLUME OF FLOOR/WALL/CEILING | $V_j$ (j = 5,6,7) |

Using the secondary condition, seven kinds of Fugacity are calculated (S3). Namely, seven kinds of differential equations concerning the spraying site 1, large and small particles 2 and 3, air 4, floor 5, wall 6, and ceiling 7 are simultaneously formed and are solved by Runge-Kutta-Gill method, whereby seven kinds of Fugacity are computed over time. Here, an estimation nick time width (minute time unit) set when solving the differential equations is automatically set so as to be varied in response to a fluctuation in mass balance of the compound.

At S4, using thus computed Fugacity ($f_3$, $f_4$) of the small particles 3 and air 4, together with Fugacity ($f_2$) of the large particles 2 when necessary, temporal concentration of the compound in the indoor air is computed; whereas temporal residual amounts of the compound to the spraying site 1 and floor 5 are computed by use of Fugacity ($f_1$, $f_5$) of the spraying site 1 and floor 5.

At S5, it is judged whether or not to perform safety evaluation in the case where the chemical is inhaled. If the safety evaluation in inhalation is to be performed, then an estimated exposure amount in inhalation indicating a degree of exposure upon inhalation of the contaminated air is computed by use of the above-mentioned temporal concentration in the indoor air (S6). Thereafter, an inhalation safety coefficient is computed according to the estimated exposure amount in inhalation (S7). At S8, the inhalation safety coefficient is compared with a reference value defined in each country. If the inhalation safety coefficient exceeds the reference value, it is judged that "there is no problem in safety." By contrast, if the inhalation safety coefficient is lower than the reference value at S8, it is judged that "there is a problem in safety," and the operation returns to S1, where alteration of the primary condition such as alteration of compound, alteration of chemical formulation, alternation of using condition, or the like is considered.

If the safety evaluation in inhalation is not selected at S5, calculated is an estimated amount of percutaneous exposure indicating to what extent the skin is exposed in contact with the spraying site 1 or floor 5 to which the chemical is attached (S9). Thereafter, at S10, it is judged whether to perform a percutaneous safety evaluation or not. If the percutaneous safety evaluation is to be performed, a percutaneous safety coefficient is computed according to the estimated percutaneous exposure amount (S11). At S12, as with the safety evaluation in inhalation, the percutaneous safety coefficient is compared with a reference value defined in each country, whereby the safety is evaluated. If there is a problem in safety at S12, the operation returns to S1, where alteration of the primary condition is considered.

If the percutaneous safety evaluation is not selected at S10, calculated according to the estimated percutaneous exposure amount is an estimated oral exposure amount indicating the degree of exposure in the case where the chemical attached to a hand or the like is taken orally (S13). Subsequently, according to the estimated oral exposure amount, an oral safety coefficient is computed (S14). This oral exposure may occur, in particular, when an infant puts a chemical-attached hand into the mouth. At S15, as with the safety evaluation in inhalation, the oral safety coefficient is compared with a reference value defined in each country, whereby the safety is evaluated. If there is a problem in safety at S15, the operation returns to S1, where alteration of the primary condition is considered.

Finally, if it is judged to be safe at S8, S12, or S15, overall safety is evaluated. Here, the sum of respective reciprocals of the previously determined inhalation safety coefficient, percutaneous safety coefficient, and oral safety coefficient is determined, and the reciprocal of thus determined value is defined as an overall safety coefficient (S16). This overall safety coefficient is compared with a reference value, whereby an evaluation similar to the previous safety evaluation is effected (S17).

In the following, the above-mentioned steps of S2 to S4, S6, S7, S9, S11, S13, and S14 will be explained in detail.

(i) Secondary Condition Calculation (S2)

Calculations of the definite factor condition shown in Table 5 and the temporal change condition shown in Table 6 will be explained.

According to surface temperature ($T_d$) of particles, properties of particle-constituting solvent (vapor pressure $P_d$, molecular weight $M_d$, and specific gravity $\rho_d$), and indoor environment (air diffusion coefficient $D_{air}$, vapor pressure $P^\infty$, and room temperature $T^\infty$), the evaporation constant ($\alpha$) of the large and small particles 2 and 3 is defined as follows:

$$\alpha = \frac{4 D_{air} M_d}{R \rho_d} \left( \frac{P_d}{T_d} - \frac{P^\infty}{T^\infty} \right) \quad (1)$$

wherein R is a gas constant.

Here, the upper parts of the above-mentioned Tables 3 and 4 exemplify the case where the residually sprayed aerosol is of oil base. In this case, $T^\infty$ (temperature at the site far from particles) and $T_d$ are set to room temperature (T), whereas $P^\infty$ (vapor pressure of oil at the site far from particles) is set to zero.

In the case where the residually sprayed aerosol is of water base, it is necessary for $P_d$, $M_d$, $\rho_d$, $T_d$, and $P^\infty$ in expression (1) to be changed to values based on properties of water. Specifically, the above-mentioned factor values when the room temperature (T) is 298 [K] (=25° C.) and the relative humidity is 60[% RH] are exemplified in the lower parts of Tables 3 and 4.

Here, $T_d$ can be determined, according to the room temperature (T) and relative humidity (H), from "mass-based humidity table" disclosed in "Kagaku Kikai no Riron to Keisan (Theory and Calculation of Chemical Machines)" (Second Edition) (Saburo Kamei ed., Sangyo Tosho) or the like. On the other hand, $P_d$ and $P^\infty$ can be computed from the following expressions:

$$\log_{10} P_d = 10.23 - 1750/(T_d - 38)$$

$$\log_{10} P^\infty = 8.23 - 1750/(T - 38) + \log_{10} \psi$$

wherein $\psi$ is an indoor relative humidity.

From the vapor pressure ($P^s$), water solubility ($C^s$), and octanol/water distribution coefficient ($K_{ow}$) of the compound, and from the oil component content ($\rho_1$) of the floor or wall constituting the spraying site 1, Fugacity capacity ($Z_1$) of the spraying site 1 is expressed as:

$$Z_1 = \rho_1 K_{ow} C^s / P^s \quad (2)$$

From the vapor pressure ($P^s$) of the compound and the surface temperature ($T_d$) of particles, Fugacity capacity ($Z_i$, i=2, 3) of the large and small particles 2 and 3 is expressed as:

$$Z_i = \frac{6 \times 10^6}{P_L^S R T_d} \quad (3)$$

$$P_L^S = P^S \exp\{6.79(T_M/T_d - 1)\}$$

Though the vapor pressure of the compound in a liquid state ($P_L{}^s$) is computed by use of the melting point $T_M$ of the harmful material and $T_d$ here; in the case where $T_M$ cannot be obtained, $P_L{}^s$ may be set identical to the vapor pressure of the compound in a solid state ($P^s$).

From the room temperature (T), Fugacity capacity ($Z_4$) of the air 4 is expressed as follows:

$$Z_4 = \frac{1}{RT} \quad (4)$$

From the vapor pressure ($P^s$), water solubility ($C^s$), and octanol/water distribution coefficient ($K_{ow}$) of the compound, and from the particle-constituting solvent component content ($\rho_j$, j=5, 6, 7) of the material constituting the floor 5, wall 6, and ceiling 7, Fugacity capacity ($Z_j$, j=5, 6, 7) of the floor 5, wall 6, and ceiling 7 is expressed as:

$$Z_j = \rho_j K_{ow} C^s / P^s \quad (5)$$

Though the ratio ($\gamma_j$) of the large and small particles 2 and 3 attaching to the floor 5, wall 6, and ceiling 7 may be assumed to be such that 100% of them attach to the floor 5 from viewpoint of safety evaluation, it may be set, for example, floor:wall:ceiling=97:2:1 in view of the actually measured values in the past.

The ratio ($\gamma_1$) of the large and small particles 2 and 3 falling to the spraying site 1 is determined by the above-mentioned ratio ($\gamma_j$), and the area ($A_1$) occupied by the spraying site 1 with respect to the size of the room ($V_4$).

The diffusion coefficient ($D_c$) of the compound in the floor 5, wall 6, and ceiling 7 can be computed as follows. Namely, $D_c$ can be determined when the diffusion coefficient ($D_{ca}$) of the compound in the air is multiplied by $10^{-9}$, whereas $D_{ca}$ can be computed from properties of the compound (e.g., structural formula, molecular weight, and the like) according to Wike and Lee method ("Handbook of Chemical Property Estimation Methods," McGraw-Hill Book Company, 1982), for example.

Mainly generated in the seven kinds of media are degradation reactions caused by light and oxidation. The degradation constant ($K_1$) of the spraying site 1, degradation constant ($K_i$, i=2, 3) of the large and small particles 2 and 3, degradation constant ($K_4$) of the air 4, degradation constant ($K_5$) of the floor 5, and degradation constant ($K_j$, j=6, 7) of the wall 6 and ceiling 7 are defined by use of degradation half-life ($\tau_1$), ($\tau_i$), ($\tau_4$), ($\tau_5$), or ($\tau_j$) as:

$$\left.\begin{aligned} K_1&=0.693/\tau_1\\ K_i&=0.693/\tau_i\\ K_4&=0.693/\tau_4\\ K_5&=0.693/\tau_5\\ K_j&=0.693/\tau_j \end{aligned}\right\} \tag{6}$$

Here, among the degradation half-lives shown in the above-mentioned Table 2, it is difficult to actually measure the degradation half-life ($\tau_4$) of the compound in the air, whereby it is not usually easy for the degradation constant ($K_4$) to be determined. Therefore, when the actually measured value is unavailable, it may be determined as being computed by Atmospheric Oxidation program (Atkinson et al., 1984, Chem. Rev. Vol. 84, pp. 437–470) using the structural formula of the compound. Also, the degradation constant in the particles and in the interior materials (floor 5, wall 6, and ceiling 7) may be set to zero in view of the safety of inhabitants when the actually measured values are unavailable.

Since the volume of particles decreases over time due to evaporation of the particle-constituting solvent component, during the evaporation of particle-constituting solvent component, using the diameter ($d_{0i}$, i=2, 3) of particles immediately after spraying (t=0) and the evaporation constant ($\alpha$) determined from expression (1), the diameter ($d_i$, i=2, 3) of the large and small particles 2 and 3 at time t is represented as shown in the following expression (7):

$$d_i=\sqrt{d_{0i}{}^2-2\alpha t} \tag{7}$$

$$d_i=\sqrt[3]{\sqrt{R_a}}\,d_{0i} \tag{7'}$$

By contrast, the diameter ($d_i$) of particles after complete evaporation of the particle-constituting solvent component is represented as shown in the above expression (7') by use of the ratio of volume of the compound in the product ($R_a$) and the diameter ($d_{0i}$) of particles immediately after spraying.

From the compound content ($C_a$) and specific gravity ($\rho$) of the compound, the ratio of volume of the compound in the product ($R_a$) is expressed as $C_a/\rho$.

Since movement of the particles is under the control of gravity and air resistance, according to Stokes' law using the specific gravity ($\rho_d$) of the particle-constituting solvent and the diameter ($d_i$) of particles determined by expression (7), the falling speed ($v_i$, i=2, 3) of the large and small particles 2 and 3 before complete evaporation of the particle-constituting solvent component is represented by the following expression (8):

$$v_i=\frac{\rho_d g S_c}{18\eta}d_i^2=\beta(d_{0i}^2-2\alpha t) \tag{8}$$

$$S_c=1+\frac{2}{7.6\times10^7 d_i}\{6.32+2.01\exp(-8.322\times10^6 d_i)\} \tag{8'}$$

$$v_i=(\rho/\rho_d)\beta d_i^2 \tag{8''}$$

wherein g is gravitational acceleration, $\eta$ is the coefficient of viscosity of the air 4, $S_c$ is a sliding correction coefficient, and, $\beta$ is a speed coefficient. Here, while particles do not conform to the Stokes' law when they become small, the sliding correction coefficient ($S_c$) which is a coefficient for correcting this phenomenon, is represented by the above expression (8') according to the diameter ($d_i$) of particles determined by expression (7).

On the other hand, the falling speed ($v_i$) of the particles after the complete evaporation of particle-constituting solvent component is represented by the above expression (8") using the specific gravity ($\rho$) of the compound, specific gravity ($\rho_d$) of the particle-constituting solvent, speed coefficient ($\beta$), and diameter ($d_i$) of particles determined by expression (7').

From transference speed ($k_4$) of the compound in the air 4, which will be explained later, floating height of particles ($H_i$), size of the room ($V_4=L_4 \times W_4 \times$height), and the falling speed ($v_i$) of particles determined by expression (8) or (8"), the number of floating large and small particles 2 and 3 ($n_i$, i=2, 3) is expressed as:

$$\frac{dn_i}{dt} = -\frac{n_i}{H_i}v_i - \frac{n_i}{L_4}k_4 \tag{9}$$

Here, the floating height ($H_i$) of particles refers to the maximum height of the particle distribution from the floor 5 after the particles are reflected by the spraying site 1 and then are suspended in the case where the chemical is sprayed to the spraying site 1. It is positioned higher as the particles are finer.

Using the diffusion coefficient ($D_c$) of compound in the floor 5, wall 6, and ceiling 7, the transference speed ($k_1$) of the compound in the spraying site 1 is expressed as $(D_c/t)^{0.5}$.

From the transference speed ($k_4$) of the compound in the air 4 indicated in the following, the transference speed ($k_i$, i=2, 3) of the compound in the large and small particles 2 and 3 is expressed as $k_4/100$.

From the ventilation rate (G), the transference speed ($k_4$) of the compound in the air 4 is expressed as $GV_4/A_4$. Here, the above-mentioned $A_4$ is the cross-sectional area of the room with respect to the moving direction of the air 4 (arrowed direction in FIG. 2).

Using the diffusion coefficient ($D_c$) of compound in the floor 5, wall 6, and ceiling 7, the transference speed ($k_j$, j=5, 6, 7) of the compound in the floor 5, wall 6, and ceiling 7 is expressed as $(D_c/t)^{0.5}$.

From the transference coefficient ($k_1$) of the compound in the spraying site 1, transference speed ($k_4$) of the compound in the air 4, area ($A_t$) of the spraying site 1, falling speed ($v_i$) of particles determined by expression (8) or (8"), Fugacity capacity ($Z_1$) of the spraying site 1 determined by expression (2), and Fugacity capacity ($Z_4$) of the air 4 determined by expression (4), the transference coefficient ($D_{14}$) of the compound between the spraying site 1 and the air 4 is represented as follows:

$$D_{14} = \frac{1}{1/(k_1 A_1 A_t Z_1) + 1/(k_4 A_1 A_t Z_4)} \tag{10}$$

From the transference speed ($k_1$) of the compound in the large and small particles 2 and 3, transference speed ($k_4$) of the compound in the air 4, diameter ($d_i$) of particles determined by expression (7) or (7'), Fugacity capacity ($Z_i$) of particles determined by expression (3), and Fugacity capacity ($Z_4$) of the air 4 determined by expression (4), the transference coefficient ($D_{i4}$, i=2, 3) between the large and small particles 2 and 3 and the air 4 is represented as follows:

$$D_{i4} = \frac{1}{1/(k_i A_i Z_i) + 1/\{(k_4 + v_i)A_i Z_4\}} \tag{11}$$

wherein $A_i (=\pi d_i^2)$ is the surface area of particles.

From the transference speed ($k_4$) of the compound in the air 4, transference speed ($k_j$) of the compound in the floor 5, wall 6, and ceiling 7, surface area ($A_j$) of the floor 5, wall 6, and ceiling 7, Fugacity capacity ($Z_4$) of the air 4 determined by expression (4), and Fugacity capacity ($Z_j$) of the floor 5, wall 6, and ceiling 7 determined by expression (5), the transference coefficient ($D_{4j}$, j=5, 6, 7) of the compound between the air 4 and the floor 5, wall 6, and ceiling 7 becomes:

$$D_{4j} = \frac{1}{1/(k_4 A_j Z_4) + 1/(k_j A_j Z_j)} \tag{12}$$

Here, the surface area ($A_j$) of each of the floor 5, wall 6, and ceiling 7 is determined by the size of the room ($V_4=L_4 \times W_4 \times$height) and the area ($A_t$) of the spraying site 1.

The volume ($V_1$) of the spraying site 1 is determined by the diffusion coefficient ($D_c$) in the floor 5, wall 6, and ceiling 7.

Using the diameter ($d_i$) of suspended particles determined by expression (7) or (7') and the evaporation constant ($\alpha$) determined by expression (1), the volume change ($dV_i/dt$) of the large and small particles 2 and 3 is represented as:

$$\frac{dV_i}{dt} = -\frac{\pi}{2}\alpha d_i \tag{13}$$

Namely, as the oil component or moisture in the large and small particles 2 and 3 evaporates over time, their volume ($V_i$, i=2, 3) decreases.

Assuming that each of the floor 5, wall 6, and ceiling 7 before residually spraying the chemical is like a thin film and that, as the chemical infiltrates into the film, its thickness increases so as to enhance the volume thereof; from the surface area ($A_j$) of the floor 5 wall 6, and ceiling 7 and diffusion coefficient ($D_c$) of the compound in the floor 5, wall 6, and ceiling 7, the volume ($V_j$, j=5, 6, 7) of floor 5, wall 6, and ceiling 7 is indicated as follows:

$$V_j = 2\sqrt{D_c t} A_j \tag{14}$$

(ii) Fugacity Calculation (S3)

The behavior of the compound in the spraying site 1 is expressed in the form of differential equation concerning Fugacity ($f_1$) as:

$$\frac{df_1}{dt}V_1 Z_1 = -\sqrt{D_c/t}\, A_1 Z_1 f_1 + \quad \text{V-change} \tag{15}$$

$$\text{F-change} \quad \gamma_1 \sum_{i=2}^{3} n_i V_i Z_i f_i - \quad \text{Deposition}(i)$$

$$D_{14}(f_1 - f_4) - \quad \text{Transference}(1)$$

$$K_1 V_1 Z_1 f_1 \quad \text{Degradation}$$

Here, the terms of V-change, Deposition (i), Transference (1), and Degradation respectively indicate volume change (increase over time) of the spraying site 1, attachment accompanying the falling of the large and small particles 2 and 3, amount of transference of the compound between the spraying site 1 and the air 4, and change in amount of photodegradation of the compound.

The behavior of the compound in the large and small particles 2 and 3 is expressed in the form of differential equation concerning Fugacity ($f_i$, i=2, 3) as:

$$\frac{df_i}{dt}V_iZ_i = \frac{\pi}{2}\alpha d_iZ_if_i - \quad V\text{-change} \quad (16)$$

F-change $D_{14}(f_1 - f_4) - $ Transference(1)

$D_{i4}(f_i - f_4) - $ Transference(4)

$K_iV_iZ_if_i$ Degradation

Here, the terms of V-change, Transference (1), Transference (4), and Degradation respectively indicate volume change (decrease over time) of the large and small particles 2 and 3, amount of transference of the compound between the spraying site 1 and the air 4, amount of transference of the compound between the large and small particles 2 and 3 and the air 4, and change in amount of photodegradation of the compound.

The behavior of the compound in the air 4 is expressed in the form of differential equation concerning Fugacity ($f_4$) as:

$$\frac{df_4}{dt}V_4Z_4 = -GV_4Z_4f_4 - \quad \text{Ventilation} \quad (17)$$

F-change $D_{14}(f_4 - f_1) -$ Transference(1)

$\sum_{i=2}^{3} n_iD_{i4}(f_4 - f_i) -$ Transference($i$)

$\sum_{j=5}^{7} D_{4j}(f_4 - f_j) -$ Transference($j$)

$K_4V_4Z_4f_4 -$ Degradation

Here, the terms of Ventilation, Transference (1), Transference (i), Transference (j), and Degradation respectively indicate amount of discharge of the compound outdoors, amount of transference of the compound between the air 4 and the spraying site 1, amount of transference of the compound between the air 4 and the large and small particles 2 and 3, amount of transference between the air 4 and the floor 5, wall 6, and ceiling 7, and change in amount of photodegradation of the compound.

The behavior of the compound in the floor 5, wall 6, and ceiling 7 is expressed in the form of differential equation concerning Fugacity ($f_j$, j=5, 6, 7) as follows:

$$\frac{df_j}{dt}V_jZ_j = -\sqrt{D_c/t}\,A_jZ_jf_j + \quad V\text{-change} \quad (18)$$

F-change $\gamma_j\sum_{i=2}^{3} n_iV_iZ_if -$ Deposition($i$)

$D_{4j}(f_j - f_4) -$ Transference(4)

$K_jV_jZ_jf_j$ Degradation

Here, the terms of V-change, Deposition (i), Transference (4), and Degradation respectively indicate volume change (increase over time) of the floor 5, wall 6, and ceiling 7, attachment accompanying the falling of the large and small particles 2 and 3, amount of transference of the compound between the floor 5, wall 6, ceiling 7 and the air 4, and change in amount of photodegradation of the compound.

The above-mentioned seven kinds of differential equations (15) to (18) are simultaneously formed and are solved by Runge-Kutta-Gill method, so as to compute Fugacity ($f_1$ to $f_7$).

When solving these simultaneous differential equations, it is necessary to set an estimation nick time width (dt) which is a minute time unit. Namely, the estimation nick time width is used such that solutions of the simultaneous differential equations are initially determined at a time ($t_0$), and then solutions of the simultaneous differential equations are determined at a time ($t_0$+dt) to which the estimation nick time width is added. As solutions are obtained while estimation nick time widths are successively added, temporally changing Fugacity can be determined. Theoretically, as the set time of the estimation nick time width is shorter, more accurate solutions can be obtained, though necessitating a very long calculation time. By contrast, when the set time is too long, solutions tend to diverge, thereby generating errors.

Therefore, in the present invention, the estimation nick time width is set shorter when a very large change occurs in a chemical, whereas it is set longer when there is no large change.

Specifically, mass balance is always confirmed such that the amount of input of the chemical and the resulting solution coincide with each other, and the estimation nick time width is set longer when the mass balance does not fluctuate greatly, whereas it is set shorter when the mass balance starts fluctuating. For example, when the fluctuation of mass balance is set to an accuracy of ±5%, the estimation nick time width is always set so as to constantly satisfy the relationship of:

compound input amount/(existing amount+degrading amount+discharging amount)=0.95 to 1.05 namely, such that the fluctuation of mass balance lies within the range of ±5%.

Here, the above-mentioned compound input amount is the compound emission amount ($A_a$). Since the temporal amounts of compound in the seven kinds of media are determined by the simultaneous differential equations, they are summed up so as to compute the existing amount as shown in the following. Also, the degrading amount and discharging amount are as follows:

$$\left.\begin{aligned}
\text{existing amount} &= V_1Z_1f_1 + \sum_{i=2}^{3} n_if_iV_iZ_i + \sum_{k=4}^{7} f_kV_kZ_k \\
\text{degrading amount} &= K_1V_1Z_1f_1 + \sum_{i=2}^{3} K_in_if_iV_iZ_i + \sum_{k=4}^{7} K_kf_kV_kZ_k \\
\text{discharging amount} &= GV_4Z_4f_4 + \sum_{i=2}^{3} Gn_iV_iZ_if_i
\end{aligned}\right\} \tag{19}$$

With reference to the flowchart of FIG. 5, the method of setting the estimation nick time width (dt) will be explained.

First, an initial value of estimation nick time width (dt) is inputted (S21). Then, an upper limit set value (e.g., 0.1[%]) which is the upper limit of difference in mass balance, and a lower limit set value (e.g., $10^{-6}$[%]) which is the lower limit of difference in mass balance are inputted (S22). Thereafter, Fugacity and mass balance at t=$t_0$ are calculated (S23 and S24), and Fugacity and mass balance at t=t+dt (or $t_0$+dt) are calculated (S25 and S26).

It is judged whether the fluctuation in mass balance is within the range of ±5% or not (S27). If the fluctuation in mass balance is within the range of ±5%, it is judged whether the difference between the mass balance at t=t (or $t_0$) and the mass balance at t=t+dt (or $t_0$+dt) is at least the upper limit set value or not (S28). If it is judged to be at least the upper limit set value at S28, then solutions become more accurate when the estimation nick time width (dt) is made shorter. In this case, the estimation nick time width (dt) is multiplied by ½ so as to change its setting (S29). When the difference is judged to be smaller than the upper limit set value at S28, it is judged at S30 whether the difference between the mass balance at t=t (or $t_0$) and the mass balance at t=t+dt (or $t_0$+dt) is at most the lower limit set value or not.

When the mass balance difference is not greater than the lower limit set value at S30, since solutions are not influenced by longer estimation nick time width (dt), the estimation nick time width (dt) is doubled so as to change its setting (S31). Subsequently, it is judged whether the estimation nick time width (dt) changed at S31 is at most a maximum value (e.g., 0.1 [hour]) of estimation nick time width (dt) or not (S32). When the estimation nick time width (dt) is not greater than the maximum value at S32, since solutions do not diverge, the estimation nick time width (dt) set at S31 is used. When the estimation nick time width (dt) is greater than the maximum value at S32, since solutions may diverge, the estimation nick time width (dt) is reset to the maximum value (S33). When the mass balance difference is greater than the lower limit set value at the above-mentioned S30, namely, when it lies between the lower limit set value and upper limit set value, the calculations are continued without changing the estimation nick time width (dt).

After the step of S29, S30, S32, or S33, the operation returns to S25 so as to effect calculation again, and this process is repeated till the aimed time is attained.

When the fluctuation in mass balance exceeds the range of ±5% at S27, on the other hand, the mass balance fluctuation is so much that calculation is preferably effected with an estimation nick time width (dt) shorter than that in the case where the fluctuation is within the range of ±5%. Accordingly, the calculation is stopped once (S34), the lower limit set value is reset to a lower level (S35), and then the operation returns to the step of S23.

Thus, when the estimation nick time width is variably set without being held constant, while monitoring the mass balance fluctuation, Fugacity can be computed accurately and efficiently.

(iii) Computation of Temporal Concentration in Indoor Air and Residual Amount (S4)

The temporal concentration of the compound in the indoor air is computed when Fugacity ($f_4$) of the air, determined by the above-mentioned item (ii), multiplied by Fugacity capacity ($Z_4$), and Fugacity ($f_3$) of small particles multiplied by Fugacity capacity ($Z_3$) are summed up. Here, the large particles may be inhaled by a human body depending on the kind of chemical. In such a case, calculation is effected by use of Fugacity ($f_2$) and ($f_3$) of large and small particles.

The residual amount of the compound is computed when Fugacity ($f_1$) of the spraying site 1 multiplied by Fugacity capacity ($Z_1$), and Fugacity ($f_5$) of the floor 5 multiplied by Fugacity capacity ($Z_5$) are summed up. Here, in the case where there is substantially no possibility of the spraying site 1 coming into contact with the skin, Fugacity ($f_5$) of the floor 5 alone may be used for calculation.

(iv) Calculation of Estimated Exposure Amount in Inhalation and Inhalation Safety Coefficient (S6 and S7)

Figure 3B:
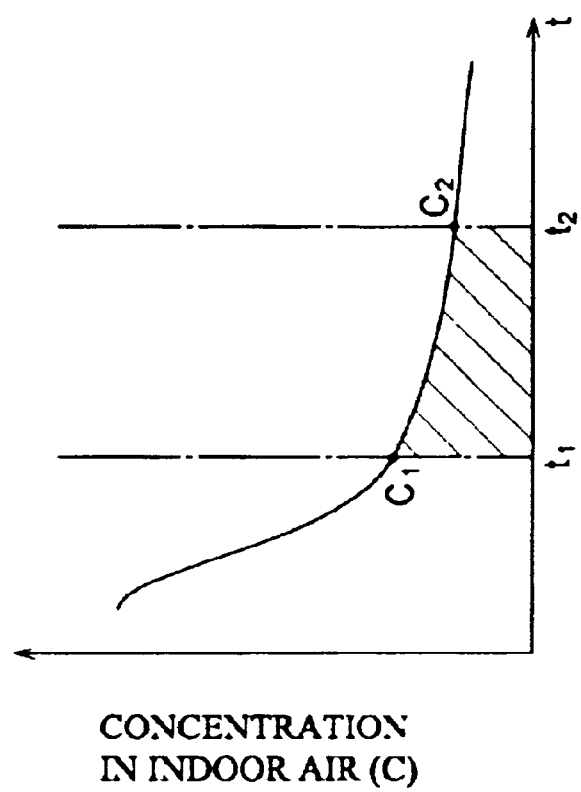
FIG. 3B is an explanatory view in the case where mean concentration in indoor air is determined by use of the graph in FIG. 3A.
Figure 3A:
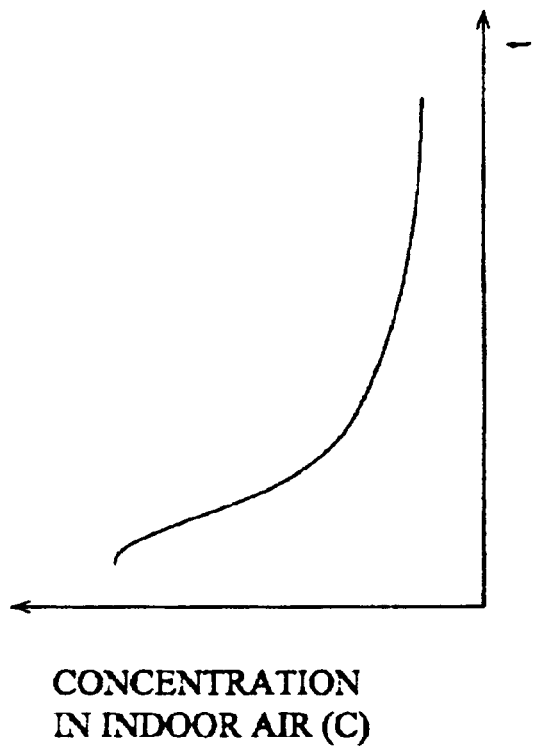
FIG. 3A is a graph showing temporal change of concentration in indoor air.

The above-mentioned temporal concentration in the indoor air forms a curve shown in FIG. 3A, for example. This concentration curve is integrated, an accumulated concentration of the compound during a specific period ($t_1$ to $t_2$) is determined (see FIG. 3B), and the mean concentration in the indoor air is computed from thus determined value. While an arbitrary period is set as the specific period depending on the object, an appropriate period is usually set in view of the method of use of the product and the test period of toxicity data.

Then, according to the above-mentioned mean concentration in the indoor air, amount of respiration, and exposure time, the estimated exposure amount in inhalation is determined. Namely, calculation of:

estimated exposure amount in inhalation [mg/kg/day]=mean concentration in indoor air [mg/m$^3$]×amount of respiration [m$^3$/kg/min]×exposure time [min/day]

is effected. Here, as the above-mentioned amount of respiration, a published value or actually measured value may be used. Also, when amounts of respiration are respectively set for adult and child, more appropriate estimated exposure amounts in inhalation can be obtained. In the case where the inhaled harmful material is not totally absorbed into the body but is partially discharged by respiration, a more appropriate estimated exposure amount in inhalation can be obtained when the inhalation ratio is taken into account.

The inhalation safety coefficient is computed from a non-influential amount concerning inhalation toxicity examined by an animal experiment beforehand and the estimated exposure amount in inhalation determined above. Namely, it is expressed as:

inhalation safety coefficient=inhalation non-influential amount [mg/kg/day]/estimated exposure amount in inhalation [mg/kg/day]

(v) Calculation of Estimated Percutaneous Exposure Amount and Percutaneous Safety Coefficient (S9 and S11)

Figure 4B:
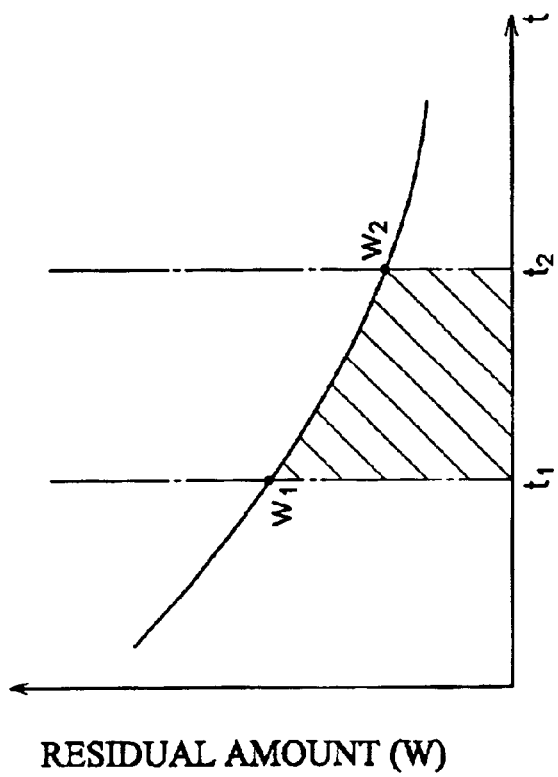
FIG. 4B is an explanatory view in the case where mean residual amount is determined by use of the graph in FIG. 4A.
Figure 4A:
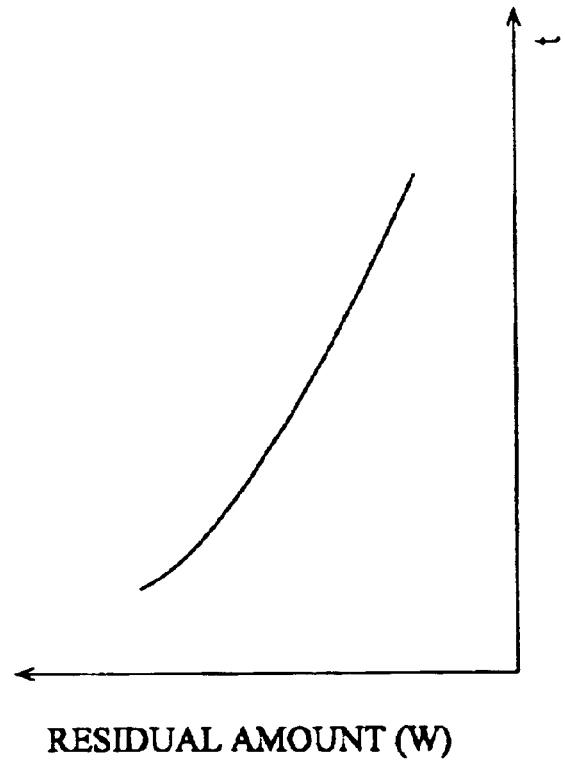
FIG. 4A is a graph showing temporal change in residual amount.

The above-mentioned residual amount forms a curve such as that shown in FIG. 4A, for example. This residual amount curve is integrated, the accumulated residual amount of the compound during a specific period ($t_1$ to $t_2$) is determined (see FIG. 4B), and the mean residual amount is computed from thus determined value. While an arbitrary period is set as the specific period depending on the object, an appropriate period is usually set in view of the method of use of the product and the test period of toxicity data.

Then, according to the mean residual amount, skin attachment ratio, contact area, and body weight, the estimated percutaneous exposure amount is determined. Namely, calculation of:

estimated percutaneous exposure amount [mg/kg/day]=(mean residual amount [mg/m$^2$]×skin attachment ratio [%]×contact area [m$^2$/day])/body weight [kg]

is effected. Here, as the contact area, a published value (e.g., 4 [m$^2$/day]) may be used. The skin attachment ratio is a ratio of the compound attaching to the skin when the latter is in contact with the floor 5 where the compound exists. As this value, a published value or a value experimentally obtained from a model may be used.

A model experiment method for the skin attachment ratio is as follows. A weight (8 cm×8 cm×8 cm; 4.2 kg) is placed on a denim cloth (8 cm×10 cm) with a pressure similar to that of an infant in contact with a floor, and the denim cloth is pulled on the floor at a speed (120 cm/15 sec) similar to the moving speed of the infant. The denim and floor are analyzed so as to compute the compound contained in the denim and floor. From the ratio therebetween, the skin attachment ratio is obtained. It has been confirmed that the skin attachment ratio obtained by this method is identical to or slightly higher than that determined from analyzed values of a hand and a floor when the hand is actually pressed against the floor, thereby proving this model experiment method to be useful for evaluating exposure of inhabitants.

The percutaneous safety coefficient is computed from the non-influential amount concerning percutaneous toxicity examined by an animal experiment beforehand and the estimated percutaneous exposure amount determined above. Namely, it is expressed as:

percutaneous safety coefficient=percutaneous non-influential amount [mg/kg/day]/estimated percutaneous exposure amount [mg/kg/day]

Nevertheless, in general, percutaneous non-influential amount has not often been determined, and there are not many published values. Accordingly, a more accurate value can be determined from the estimated percutaneous exposure amount, and oral non-influential amount and percutaneous absorption ratio for which many published values exist, according to the following expression:

percutaneous safety coefficient=oral non-influential amount [mg/kg/day]/(estimated percutaneous exposure amount [mg/kg/day]×percutaneous absorption ratio [%])

Here, when the percutaneous absorption ratio is unknown, employed is a national guideline (e.g., 10%) which usually exists.

(vi) Calculation of Estimated Oral Exposure Amount and Oral Safety Coefficient (S13 and S14)

From the estimated percutaneous exposure amount obtained in the above-mentioned item (v), hand surface area ratio, and oral transference ratio, the estimated oral exposure amount from hand to mouth is determined. Namely, calculation of:

estimated oral exposure amount [mg/kg/day]=estimated percutaneous exposure amount [mg/kg/day]×hand surface area ratio [%]×oral transference ratio [%]

is effected. Here, the hand surface area ratio is expressed by (hand surface area/body surface area), for which a published value (e.g., 5[%]) may be used. The oral transference ratio is a hypothetical value, which is set to 100%, for example.

In the case where oral exposure might occur via tableware or food contaminated with the residually sprayed compound, it is required that the estimated oral exposure amount from tableware or food to mouth be added to the estimated oral exposure amount from hand to mouth to yield the total estimated oral exposure amount. For example, the estimated oral exposure amount from tableware is obtained when, according to the tableware residual amount indicating the amount of the harmful material remaining in tableware, tableware use area which is the sum of tableware surface areas, and oral transference ratio from tableware, calculation of:

estimated oral exposure amount [mg/kg/day]=tableware residual amount [mg/m²]×tableware use area [m²/day]×oral transference ratio [%]/body weight [kg]

is effected. Here, the tableware residual amount is expressed by (mean floor residual amount×tableware contamination ratio). As the tableware contamination ratio, an actually measured value (e.g., 9%) or a hypothetical value may be used.

The oral safety coefficient is computed from the non-influential amount concerning oral toxicity examined by an animal experiment beforehand and the estimated oral exposure amount determined above. Namely, it is expressed as:

oral safety coefficient=oral non-influential amount [mg/kg/day]/estimated oral exposure amount [mg/kg/day]

As mentioned in the foregoing, in the method of estimating an indoor behavior of a pesticidal compound in this embodiment, the environment is initially divided into the spraying site 1, large and small particles 2 and 3, whole indoor air 4, floor 5, wall 6, and ceiling 7; and differential equations concerning Fugacity of the compound in them are simultaneously formed and are solved, so as to estimate the indoor behavior of the compound when a chemical containing the compound is residually sprayed.

Since the environment is thus considered to be seven kinds of media, and exchanges between the individual media and the like are taken into account, simulation results close to the actual behavior of the compound can be obtained.

The estimation nick time width set when solving the simultaneous differential equations is variably set, while constantly confirming mass balance of the compound indoors after the residual spraying, so that the amount of input of the chemical indoors and the resulting solution coincide with each other.

Accordingly, since mass balance of the compound after the residual spraying is always monitored such that the amount of input of the compound indoors and the resulting solution coincide with each other, thereby varying the estimation nick time width; the estimation nick time width is set longer when the mass balance fluctuates a little, whereas it is set shorter when the mass balance starts fluctuating greatly. Namely, when solving simultaneous differential equations including a parameter accompanying temporal change, the estimation nick time width is automatically set in response to the fluctuation in mass balance. Consequently, when processed by a computer, an accurate solution can be obtained in a short time.

The method of evaluating safety of a pesticidal compound in accordance with this embodiment uses the estimated result mentioned above to evaluate the safety of the compound with respect to the human body when the chemical is residually sprayed.

Accordingly, the safety of the compound with respect to the human body can be evaluated accurately in a short time. As a consequence, when formulating a chemical such as insecticide containing the compound, simulation can be easily repeated while changing conditions, thereby making it easier to formulate a chemical having a high safety conforming to the aimed object.

Though the kind of the floor 5 is assumed to be flooring in this embodiment, differential equations similar to those mentioned above may also be formed in the case of tatami. In this case, however, when determining fugacity capacity ($Z_5$) of the floor 5 in equation (5), it is necessary for the particle-constituting solvent component content (see Table 3) to be changed from that of the flooring to that of tatami. Also, when determining the degradation constant ($K_5$) of the floor 5 in equation (6), the decomposition half-life is required to be changed from that of the flooring to that of tatami.

Though Fugacity is determined by use of Runge-Kutta-Gill method in this embodiment, other methods may be used for solving differential equations. Runge-Kutta-Gill method, however, is preferably used since a program for the above-mentioned differential equations can be easily made by Basic. Also in the case where differential equations are solved by a method other than Runge-Kutta-Gill method, similar effects can be obtained when the estimation nick time width is set as mentioned above.

In the following, examples (Examples 1 to 5) of the above-mentioned method of estimating an indoor behavior of a pesticidal compound and the safety evaluation method using the same will be explained with reference to the accompanying drawings.

The evaluation of the method of estimating an indoor behavior of a pesticidal compound in these examples is effected as the results obtained by estimation and the actually measured values obtained by measurement of the actual indoor behavior of the compound are compared with each other.

First, the measurement of the actual indoor behavior of the compound will be explained.

The employed aerosol can (300 [ml]) contains 0.9 [g] of d-phenothrin (trademark: Smithrin; $C_{23}H_{26}O_3$: (3-phenoxyphenyl)methyl(1R)-cis-trans-2,2-dimethyl-3-(2-methyl-1-prophenyl)cyclopropane carboxylate) and 1.1 [g] of d-tetramethrin (trademark: Neo-Pyramin Forte; $C_{19}H_{25}O_4$: (1,3,4,5,6,7-hexahydro-1,3-dioxo-2H-isoindol-2-yl)methyl(1R)-cis-trans-2,2-dimethyl-3-(2-methyl-1-prophenyl)cyclopropane carboxylate).

The indoor environment is assumed to be a six-mat room (9.72 [$m^2$]) of a typical apartment in Japan. In conformity to the description of the above-mentioned aerosol can, spraying was effected at a rate of 60 [sec/$m^2$] from a distance of about 20 [cm] from the floor and wall. The spraying site had a width of 10 [cm] or 15 [cm] from the boundary between the floor and the wall toward the floor, and a width of 10 [cm] or 15 [cm] from the boundary toward the wall [see FIG. 2]. The total spraying period was 2.5 minutes for 2.52 [$m^2$] in the region having a width of 10 [cm], and 3.7 minutes for 3.78 [$m^2$] in the region having a width of 15 [cm].

Five kinds of measurement were effected while the room conditions were changed as shown in Table 7. Namely, measurement in the case with continuous use (Example 1), case with changing ventilation rate (Example 2), case with an open window (Example 3), and case with air-conditioner on (Example 4), and measurement for skin attachment ratio (Example 5) were performed.

temperature, humidity, and illuminance are measured at the center of the room. The ventilation rate was confirmed before and after the measurement.

In Example 2, the illumination condition was in the dark as natural light was cut. For performing measurement, the ventilation rate was changed to 0.5 to 4 [$h^{-1}$] since the actual ventilation rate of Japanese apartment with closed windows is 0.5 to 3 [$h^{-1}$].

In Example 3, immediately after spraying, a window was opened for 5 minutes or 2 hours in conformity to the description of the aerosol can. While the illumination condition was basically in the dark (illuminance 0 [lux] in Table 7), natural light entered when the window was open (mean illuminance 1890 [lux] in Table 7).

The sampling processing in each of the above-mentioned measurements was effected as follows.

In Examples 1 to 4, the indoor air was sampled after a specified period from the spraying. Here, as for d-phenothrin and d-tetramethrin, at the positions corresponding to the respiration regions of an infant and an adult, air suction amount was adjusted such that particles having a diameter of 30 [$\mu$m] or less can be collected, whereby not only the compounds in a gas state but also those in a suspended particle state were sampled.

In Example 1, at the centers of floor, wall, and ceiling, strips of materials identical thereto each having a size of 5 [cm]×5 [cm] were placed before spraying, whereby sampling was effected at the floor, wall, and ceiling. As for the wall, sampling was effected at three places consisting of the inflow and discharge sides of the air and a lateral side apart therefrom.

In the collecting tube that had sampled the air, flooring strip, wallpaper strip, ceiling strip, hand, and denim cloth, d-phenothrin and d-tetramethrin were analyzed by the methods shown in Table 8. In these methods, an organic solvent containing BHT (2,6-di-t-butyl-p-cresol) was used to extract these compounds, and cleanup was effected when necessary,

TABLE 7

|  | EXAMPLE 1 | EXAMPLE 2 | EXAMPLE 3 | EXAMPLE 4 | EXAMPLE 5 |
|---|---|---|---|---|---|
| MEASUREMENT SITE | AIR, FLOOR, WALL, CEILING | AIR | AIR | AIR | FLOOR, HAND, DENIM CLOTH |
| SPRAYING PERIOD [min/day] | 2.5 min/2 week × 4 | 3.7 | 2.5 | 2.5 | 2.5 |
| AIR - CONDITIONER STATE | OFF | OFF | OFF | ON | OFF |
| ROOM TEMP [° C.] | 25 | 25 | 25 | 25 | 25 |
| HUMIDITY [% RH] | 60 | 50 | 60 | 60 | 62 |
| WINDOW STATE | CLOSED | CLOSED | 5 min - OPEN OR 2 h - OPEN | CLOSED | CLOSED |
| ILLUMINATION CONDITION | SYNTHETIC LIGHT AND NATURAL LIGHT | NONE | BASICALLY NONE | NONE | NONE |
| ILLUMINANCE [lux] | 1320 | 0 |  | 0 | 0 |
| VENTILATION RATE [$h^{-1}$] | 1.58 | 0.50 OR 1.5 g OR 4.14 | 1.86, 10.6 | 1.56 | 1.54 |

In Example 1, spraying was effected four times at a rate of once in two weeks. The air-conditioner was not actuated, and the windows of the room were closed. The room temperature and humidity were controlled so as to become 25[° C.] and 60[%], respectively. The illumination condition was such that synthetic light illuminates indoors from 7 a.m. to 10 a.m. and from 6 p.m. to 11 p.m., while natural light was provided through two windows. The ventilation rate was set to 1.5 [$h^{-1}$], which was minimally necessary for a Japanese woman and an infant to inhabit. The temperature, humidity, illuminance, and ventilation rate of the room actually measured under such a condition are shown in Table 7, each being represented by the mean value in measurement. The so that analysis was effected by mass spectrometer (MSD) attached to a gas chromatography (GC). In each process, in order to prevent the compound from vaporizing due to evaporation of the solvent, diethylene glycol or octanol is added. Both d-phenothrin (mass: 183 [m/z]) and d-tetramethrin (mass: 164 [m/z]) were detected in 9 minutes under the GC condition noted in the following. As the apparatus, Shimadzu GC-MS QP-1100EX (Mode EI, 70 ev) was used with a DC-608 column (inner diameter: 0.53 [mm], length: 30 [m], thickness; 0.8 [$\mu$m]) programmed to raise temperature at a rate of 10[° C./min] from 205[° C.], whereas the temperature of injection and ion source was 260[° C.].

TABLE 8

| MEDIUM | EXTRACT | CLEANUP d-phenothrin | CLEANUP d-tetramethrin | RECOVERY [%] d-phenothrin | RECOVERY [%] d-tetramethrin | DETECTION LIMIT |
|---|---|---|---|---|---|---|
| COLLECTING TUBE | HEXANE/ACETONE | NONE | NONE | 103 | 107 | 0.05 [μg/m³] |
| FLOOR | DICHLOROMETANE | MBE-FL | MBE-FL FL | 92.7 | 78.3 | 8 [μg/m²] |
| WALL | HEXANE |  | GPC MBE-FL | 93.2 | 89.8 | 8 [μg/m²] |
| CEILING |  |  | MBE-FL |  |  |  |
| HAND | 2-PROPANOL | MBE-NH₂ | SI MBE-SI | 87.7 | 92.8 | 0.05 [μg/hand] |
| DENIM CLOTH | HEXANE |  | MBE-FL | 92.8 | 103 | 8 [μg/m²] |

NOTE) MBE:MEGABOND ELUTE, FL:FLORISIL, SI:SILICA GELL, GPC:GELL PERMEATION COLUMN.

The results of concentrations of d-phenothrin and d-tetramethrin in the air and the residual amounts in the floor, wall, and ceiling measured by the above-mentioned methods will be explained.

Figure 7:
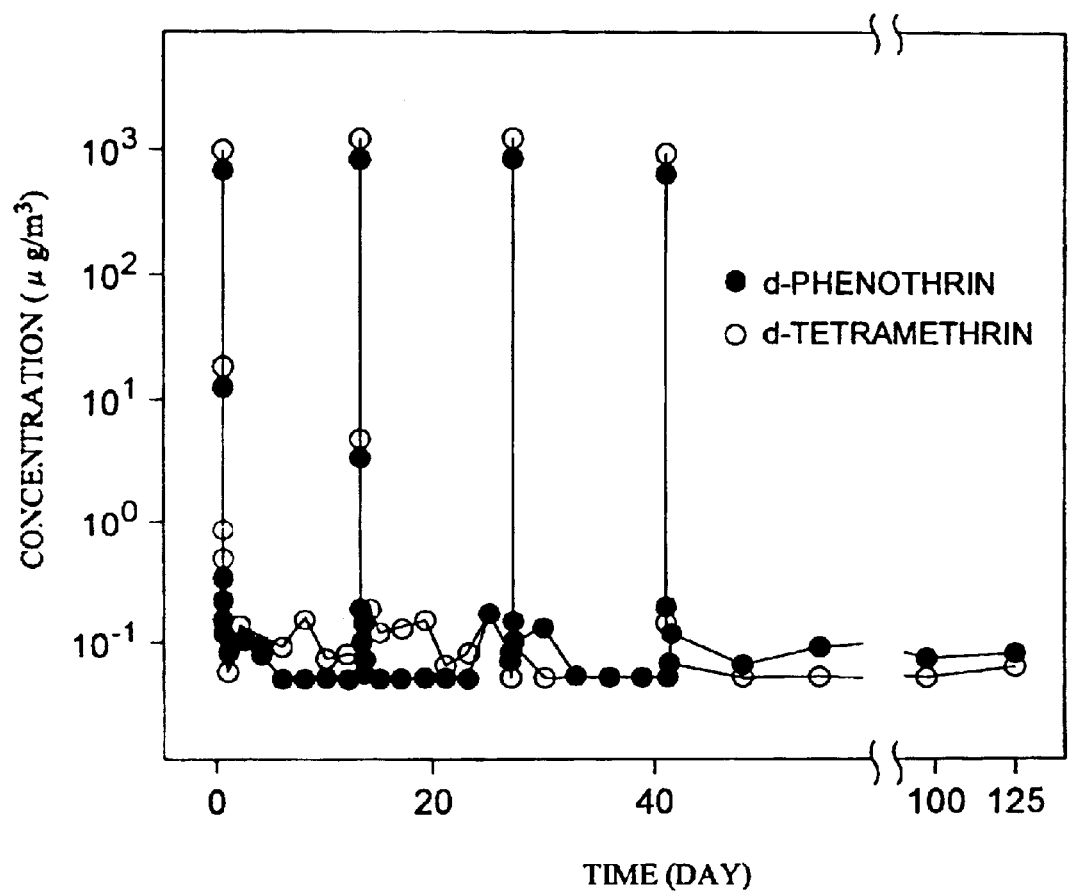
FIG. 7 is a graph showing temporal change of concentration in the air in Example 1 in the above-mentioned first embodiment.

In Example 1, the concentration in the air was measured for 125 days including the time in which spraying was effected once (2.5 minutes) per 2 weeks for 8 weeks. As shown in FIG. 7, the concentration in the air exhibited its maximum level immediately after spraying, where the average of d-phenothrin at the heights of 25 [cm] and 120 [cm] from the center of the floor was 752 [μg/m³] and that of d-tetramethrin was 1040 [μg/m³], and rapidly decreased thereafter. Here, since the half-life of each of both compounds was short, i.e., about 20 minutes, there were 4 peaks in the 8 weeks of spraying period. The concentration in the air after the spraying period was less than 0.10 [μg/m³] in both of them. Further, there was no substantial difference in concentration between the heights of 25 [cm] and 120 [cm] from the floor. Also, no increase was seen in the concentration in the air due to the increase in the number of spraying operations. In FIG. 7, concentrations which were less than the detection limit (0.05 [μg/m³]) and thus could not be measured are plotted at the detection limit.

The total spraying amount was 250 [g], including 1.11 [g] of d-phenothrin and 1.38 [μg] of d-tetramethrin, which equal 1.2 aerosol cans of 300 [ml]. Since 5 million aerosol cans of 300 [ml] for residual spraying are annually sold in Japan, annual consumption per household is calculated as 0.13 can. Accordingly, it is seen that the spraying amount used for measurement (1.3 cans per room) is considerably greater than the actual annual consumption.

As shown in Table 9, the mean concentration in the air during the spraying period and the mean annual concentration in the air including 8-week spraying period were calculated as 2.35 [μg/m³]/0.43 [μg/m³] for d-phenothrin, and 3.25 [μg/m³]/0.53 [μg/m³] for d-tetramethrin. Consequently, it is seen that the amount of existence of d-phenothrin with respect to d-tetramethrin in the air corresponds to their ratio of existence within the aerosol can. In Table 9, for those less than the detection limit value, the mean concentration in the air was calculated by use of the detection limit value.

TABLE 9

| COMPOUND | PERIOD | CONCENTRATION IN AIR [μg/m³] 25 [cm] | CONCENTRATION IN AIR [μg/m³] 120 [cm] | RESIDUAL AMOUNT [μg/m²] FLOOR | RESIDUAL AMOUNT [μg/m²] WALL | RESIDUAL AMOUNT [μg/m²] CEILING |
|---|---|---|---|---|---|---|
| d-phenothrin | SPRAYING PERIOD | 2.35 | 2.35 | 2200 | 33 | 27 |
|  | ANNUAL | 0.41 | 0.45 | 360 | 7 | 9 |
| d-tetramethrin | SPRAYING PERIOD | 3.31 | 3.19 | 2500 | 43 | 34 |
|  | ANNUAL | 0.54 | 0.52 | 400 | 15 | 30 |

Figure 8A:
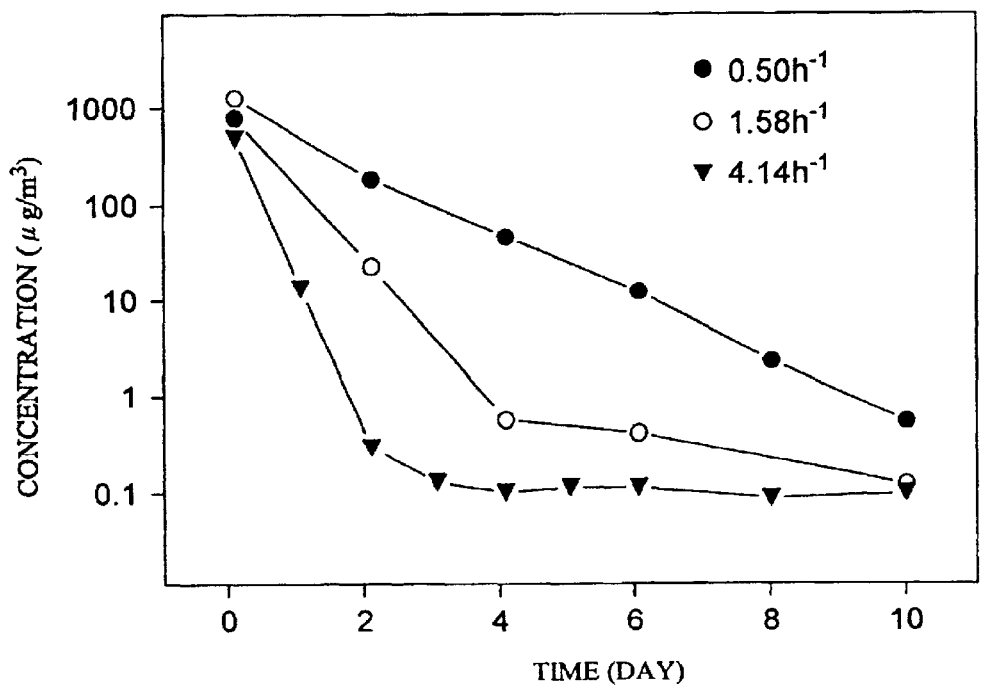
FIG. 8A is a graph showing temporal change in concentration in the air in the case where ventilation rate is changed in Example 2.

In Example 2, concentrations of d-phenothrin and d-tetramethrin in the air after 3.7 minutes from the spraying with changed ventilation ratio were measured. FIG. 8A shows only the results of d-phenothrin. This has indicated that the half-lives in the air at ventilation ratios of 1.58 [h⁻¹], 0.50 [h⁻¹], and 4.14 [h⁻¹] are 21 minutes, 58 minutes, and 11 minutes, respectively.

Figure 8B:
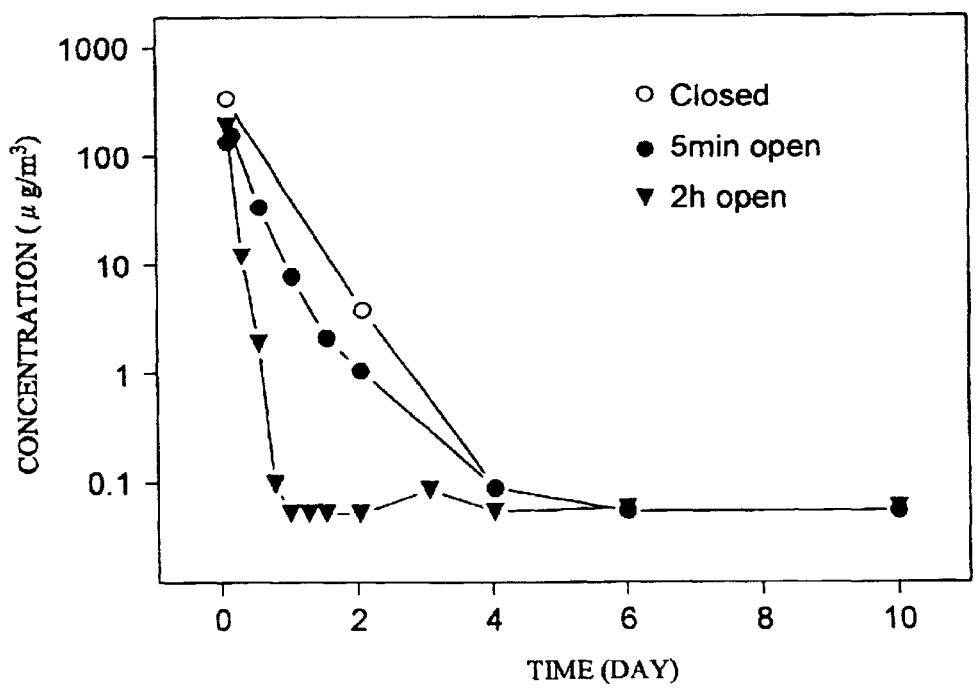
FIG. 8B is a graph showing temporal change in concentration in the air in the case where a window is opened and closed in Example 3.

In Example 3, immediately after the chemical was sprayed for 2.5 minutes, the window was opened, and the concentrations of d-phenothrin and d-tetramethrin in the air were measured. FIG. 8B shows the results of d-phenothrin. This has indicated that the half-lives in the cases where the window was opened for 5 minutes, the window was opened for 2 hours, and the window was kept closed are 14 minutes, 4 minutes, and 20 minutes, respectively. Also, the mean concentration (2.88 [μg/m³] when opened for 5 minutes, 1.19 [μg/m³] when opened for 2 hours) was less than ⅕ that of the closed state (14.8 [μg/m³]).

The measured values of FIGS. 8A and 8B are mean values of the concentrations in the air respectively sampled at heights of 25 [cm] and 120 [cm] from the floor. Also, for those less than the detection limit and thereby incapable of measurement were plotted as the detection limit value (0.05 [μg/m³]).

Table 10 lists the above-mentioned half-lives. These results have indicated that, in the residual spraying, the ventilation of room, opening the window immediately after spraying in particular, is highly influential in the concentration in the air. For reference, Table 10 shows half-lives of compounds (d-resmethrin and d-tetramethrin) in the air when a chemical is sprayed in the space.

TABLE 10

| MEASUREMENT | VENTILATION RATE OR WINDOW STATE | HALF - LIFE OF RESIDUAL SPRAYING [min] | | HALF - LIFE OF SPATIAL SPRAYING [min] | |
|---|---|---|---|---|---|
| | | d-phenothrin | d-tetramethrin | d-resmethrin | d-tetramethrin |
| EXAMPLE 1 | 1.58 [h⁻¹] | 20 | 20 | 16 | 23 |
| EXAMPLE 2 | 0.50 [h⁻¹] | 58 | 58 | — | 49 |
| | 1.58 [h⁻¹] | 21 | 22 | — | 19 |
| | 4.14 [h⁻¹] | 11 | 11 | — | 8 |
| EXAMPLE 3 | 5 min OPEN | 14 | 14 | 9 | 12 |
| | 2 h OPEN | 4 | 4 | 4 | 3 |

Meanwhile, in the state where the window is open as with Example 3, for example, the half-lives caused by photodegradation are estimated according to the above-mentioned Atmospheric Oxidation program from the structures of compounds to be 2.1 hours for d-phenothrin and 1.7 hours for d-tetramethrin. Since the half-lives in the air are shorter than the half-lives caused by photodegradation, the decreases in concentration of d-phenothrin and d-tetramethrin are considered to be mainly caused by ventilation rather than photodegradation.

In Example 4, the mean concentration when the air-conditioner was used (11.6 [μg/m³] for d-phenothrin, 15.5 [μg/m³] for d-tetramethrin) was substantially the same as the mean concentration when the air-conditioner was not used (14.8 [μg/m³] for d-phenothrin, 20.2 [/μg/m³] for d-tetramethrin). This has indicated that the influence of the air convection and absorption of the air into the filter of the air conditioner upon the concentration in the air is substantially negligible.

FIGS. 9A and 9B and the above-mentioned Table 9 show the results of measurement of residual amounts at the floor, wall, and ceiling for 125 days in Example 1. The values of the residual amounts at the wall in FIG. 9B and Table 9 are means of values on the air inflow and discharge sides and their lateral side, whereas the residual amounts of wall and ceiling in FIG. 9B are plotted as the mean values of residual amounts at the wall and ceiling.

As the air flows in and out, the residual amount at the wall on the inflow side (28 [μg/m²] for d-phenothrin, 35 [μg/m²] for d-tetramethrin) was less than the residual amount at the wall on the discharge side or lateral side (45 [μg/m²] and 58 [μg/m²] on the discharge side, 33 [μg/m²] and 43 [μg/m²] on the lateral side). Also, while the residual amounts of d-phenothrin and d-tetramethrin enhanced as the number of spraying operations increased, they gradually decreased after spraying. Here, half-lives of d-phenothrin and d-tetramethrin at the floor were respectively 13 days and 20 days, whereas their half-lives at the wall/ceiling were respectively 31 to 41 days and 24 to 75 days. These values are longer than those in the air, since the materials of floor, wall, and ceiling contain a large amount of antioxidants. Also, the residual amount at the floor, except for the site sprayed with the chemical, is greater than the residual amount at the wall or ceiling, since the suspended particles attach to the floor.

In Example 5, a hand attachment test in which a hand is directly pressed against the floor where the compound remains, and a wiping test using a denim cloth instead of the hand are performed, so as to measure the skin attachment ratios of d-phenothrin and d-tetramethrin at the flooring. When Student's t-test ($P \leq 0.05$) was performed, the skin attachment ratios obtained by the wiping test (0.31[%] and 0.33[%] respectively for d-phenothrin and d-tetramethrin after 6 hours from spraying, 0.17[%] and 0.09[%] after 24 hours from spraying) were equal to or higher than the results obtained by the hand attachment test (0.22[%] and 0.32[%] respectively for d-phenothrin and d-tetramethrin after 6 hours from spraying, 0.06[%] and 0.07[%] after 24 hours from spraying). This has indicated that the safety of percutaneous exposure can be sufficiently estimated when the skin attachment ratio is determined by the wiping test alone.

In the following, simulation results obtained according to the method of estimating an indoor behavior of a compound in accordance with the present invention will be explained. The condition here is the same as that of the above-mentioned Example 1. As the primary condition, the values described in Tables 1 to 4 of the first embodiment were inputted.

When the behavior of d-phenothrin caused by residual spraying during the period after 2.5 minutes to 24 hours from the spraying was simulated, the results shown in Table 11 were obtained. In the table, "suspension period" refers to a period in which the particles floating at the position lower than 2.4 [m] fall onto the floor or disappear in the air, whereas "transference amount" refers to the ratio of compound amount transferred within 24 hours with respect to the whole spraying amount.

TABLE 11

| BEHAVIOR | FROM | TO | RATIO | |
|---|---|---|---|---|
| CHANGE IN DIAMETER | | | | |
| OF LARGE PARTICLES | 20 [μM] | 3.6 [μm] | (CHANGE IN 35 sec.) | |
| SMALL PARTICLES | 5 [μM] | 0.9 [μm] | (CHANGE IN 2.2 sec.) | |
| SUSPENSION PERIOD | | | | |
| OF LARGE PARTICLES | 0 [h] | 2.0 [h] | | |
| SMALL PARTICLES | 0 [h] | 30 [h] | | |
| TRANSFERENCE AMOUNT | AIR (WITH PARTICLE) | SPRAYING SITE | 1.0 | [%] |
| | AIR (WITH PARTICLE) | FLOOR | 7.0 | [%] |

TABLE 11-continued

| BEHAVIOR | FROM | TO | RATIO | |
|---|---|---|---|---|
| | AIR (WITH PARTICLE) | WALL | 0.44 | [%] |
| | AIR (WITH PARTICLE) | CEILING | 0.10 | [%] |
| | SPRAYING SITE | AIR | 0.16 | [%] |
| | FLOOR | AIR | 0.15 | [%] |
| | WALL | AIR | 0.0011 | [%] |
| | CEILING | AIR | 0.00023 | [%] |
| VENTILATION AMOUNT | INDOOR | OUTDOOR | 29 | [%] |
| DEGRADATION AMOUNT | | | | |
| IN SPRAYING SITE | | | 1.7 | [%] |
| AIR (WITH PARTICLES) | | | 3.2 | [%] |
| FLOOR | | | 0.35 | [%] |
| WALL | | | 0.0080 | [%] |
| CEILING | | | 0.0018 | [%] |
| RESIDUAL AMOUNT | | | | |
| IN SPRAYING SITE | | | 58 | [%] |
| AIR (WITH PARTICLES) | | | 0.00060 | [%] |
| FLOOR | | | 6.5 | [%] |
| WALL | | | 0.42 | [%] |
| CEILING | | | 0.10 | [%] |

According to these results, the main solvent in the large particles (diameter: 20 [$\mu$m]) was completely evaporated after 35 seconds, and disappeared from within the air after 2 hours. The main solvent in the small particles (diameter: 5 [$\mu$m]) was completely evaporated after 2.2 seconds, and existed in the air for 30 hours. The chemical containing the particles in the air (40[%] of the amount of chemical immediately after spraying) was distributed to the spraying site by 1.0[%], floor by 7.0[%], wall by 0.44[%], and ceiling by 0.10[%], whereas the remaining 29[%] went outdoors, and 3.2[%] was degraded in the air. Of the chemical at the spraying site (60[%] of the amount of chemical immediately after spraying), 0.16[%] of the sprayed amount was evaporated into the air within 24 hours, 1.7[%] was degraded by light or oxidation, and the remaining 58[%] was left at the spraying site.

Figure 10A:
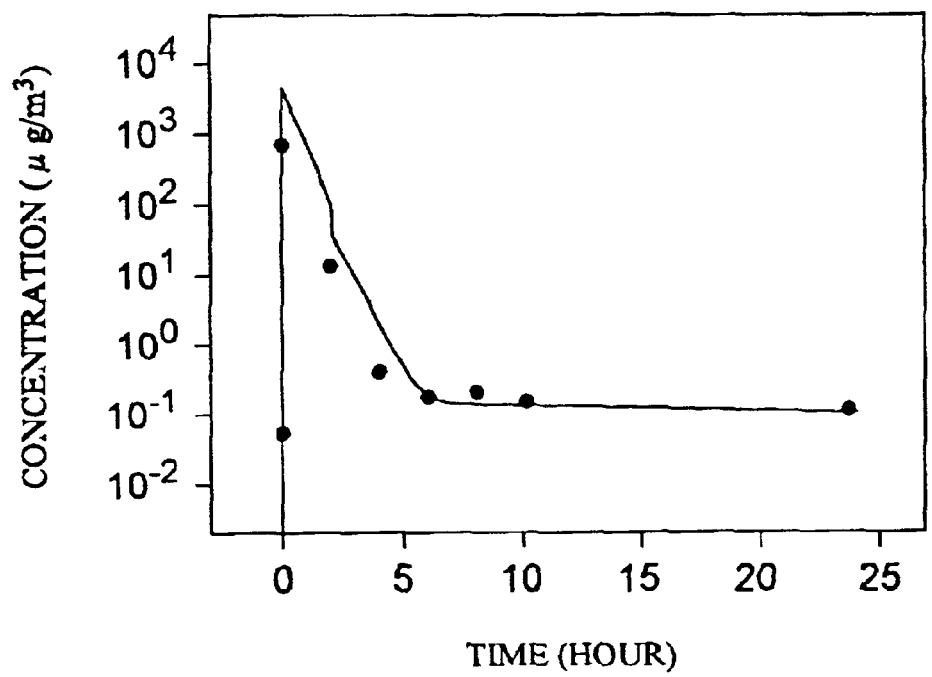
FIG. 10A is a graph comparing actually measured values of concentration in the air and their simulation results in Example 1.
Figure 10B:
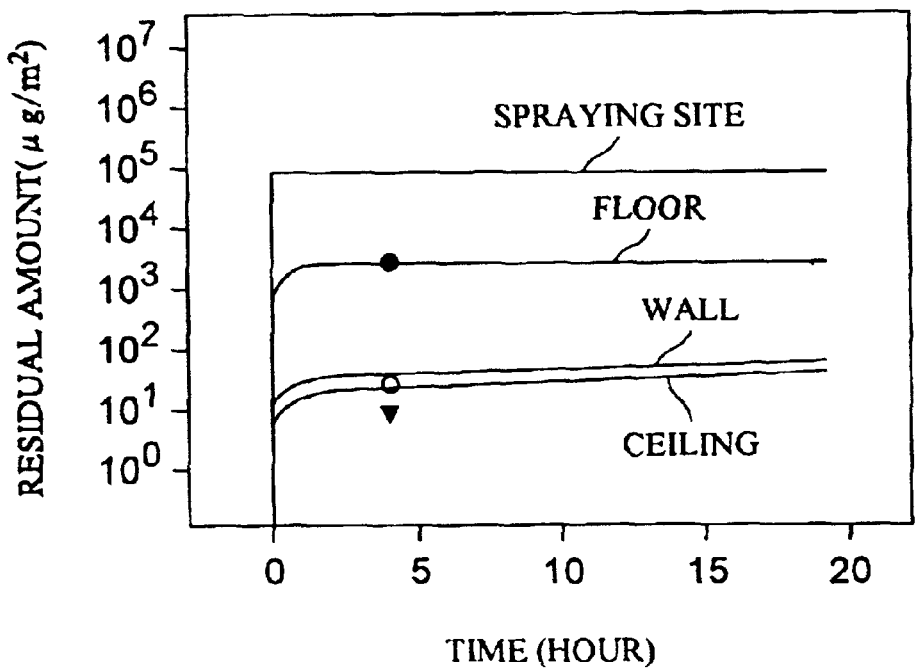
FIG. 10B is a graph comparing actually measured values of residual amount at the spraying site, floor, wall, and ceiling and their simulation results in Example 1.

When the simulation results concerning the concentration in the air and the residual amounts at the spraying site and floor/wall/ceiling and the actually measured values which is mentioned above were compared with each other, relationships shown in FIGS. 10A and 10B were obtained. In these graphs, solid lines show simulation results, whereas plotted points indicate actually measured values. These actually measured values were derived from the results of Example 1.

From these graphs, it can be seen that the estimated results according to the method of estimating an indoor behavior of a compound in accordance with the present invention are very close to the actually measured values. Namely, upon residual spraying, the most part of the chemical in the air is discharged outdoors or falls onto the floor. The chemical at the spraying site permeated through the floor or wall, and was slightly degraded or evaporated.

In the following, the results obtained according to the method of evaluating safety of a compound in accordance with the present invention will be explained. Here, indoor exposure amounts of d-phenothrin and d-tetramethrin with respect to inhabitants including an infant when a chemical was residually sprayed at the boundary between the floor and wall for four times in eight weeks (sprayed for 2.5 minutes for each time) were evaluated.

The inhabitants inhale vapors or particles of d-phenothrin and d-tetramethrin existing in the air. Since humans inhale aerosol particles having a diameter not greater than 8 [$\mu$m] to the lungs, sampling the particles having a size not greater than 30 [$\mu$m] and vapor chemicals is sufficient for evaluating the exposure in inhalation.

The following Table 12 shows the estimated exposure amount in inhalation calculated by use of the mean indoor concentration in the air (see "spraying period" in Table 9), respiration amount, and exposure time as explained in item (iv) in the first embodiment. Here, the mean indoor respiration amount of Japanese is 0.220 [L/min/kg] for an adult, and 0.235 [L/min/kg] for an infant. Also, the exposure time was presumed to be 24 [h/day], taking account of the worst case where inhabitants are confined in the room for 24 hours after spraying.

TABLE 12

| COM-POUND | SUBJECT | INHALA-TION (WINDOW CLOSED) | INHALA-TION (WINDOW OPEN) | PER-CUTA-NEOUS | ORAL |
|---|---|---|---|---|---|
| d-phenothrin | INFANT | 0.795 | 0.159 | 2.71 | 0.135 |
| | ADULT | 0.744 | 0.149 | 0.553 | — |
| d-tetramethrin | INFANT | 1.12 | 0.224 | 2.15 | 0.107 |
| | ADULT | 1.01 | 0.202 | 0.438 | — |

In the table, "window closed" refers to the case where the window is closed throughout the exposure time, whereas "window open" refers to the case where spraying was effected in the state with the closed window and then the window was opened for 5 minutes (Example 3).

Also, Table 12 shows the estimated percutaneous exposure amount calculated by use of the mean floor residual amount (see "spraying period" in Table 9), skin attachment ratio, contact area, and body weight as explained in item (v) in the first embodiment. Here, it was assumed that the contact area for an infant and an adult was 4.0 [$m^2$/day], the body weight of the infant was 10.2 [kg], and the body weight of the adult was 50 [kg]. As the skin attachment ratios for d-phenothrin and d-tetramethrin at the flooring, values evaluated by integration and extrapolation of the measured values in Example 5 were used. Namely, the skin attachment ratio was 0.31[%] for d-phenothrin, and 0.25[%] for d-tetramethrin. These values were used for calculating the estimated percutaneous exposure amount.

Further, Table 12 shows the estimated oral exposure amount calculated by use of the estimated percutaneous exposure amount, hand surface area ratio, and oral transference ratio as explained in item (vi) in the first embodiment. Here, while the hand surface area ratio was assumed to be about 5[%], and the oral transference ratio was presumed to be the worst case of 100[%], only the estimated oral exposure amount of the infant was calculated.

Table 13 lists the inhalation safety coefficient, percutaneous safety coefficient, and oral safety coefficient obtained according to the estimated exposure amount in inhalation, estimated percutaneous exposure amount, and estimated oral exposure amount determined by the above-mentioned calculations. At the same time, the total safety coefficient determined from the above-mentioned three safety coefficients are shown in the table. Further shown in the table is the safety coefficient with respect to both of d-phenothrin and d-tetramethrin computed when the sum of the respective reciprocals of the safety coefficient (inhalation, percutaneous, or oral) of d-phenothrin and the safety coefficient (inhalation, percutaneous, or oral) of d-tetramethrin is determined and then is turned into the reciprocal.

fiber. For convenience of explanation, members identical to those shown in the drawings of the previous embodiment will be referred to with numerals or letters identical thereto, without their explanations provided. Explained here is a case where only the kind of floor at the spraying site is a carpet (e.g., the floor spraying region indicated by c in FIG. 2 is assumed to be a carpet), whereas the other part of the floor is treated as a mere plane. Accordingly, only the portion different from the first embodiment will be explained.

Here, though the kind of floor (whole surface) may be a carpet, only the suspended particles fall onto the floor other than the spraying site, whereby the behavior of the floor does not greatly differ from that in the case of flooring. Accordingly, it is often only necessary for Fugacity capacity of the floor to be corrected with the particle-constituting solvent component content alone.

Figure 6:
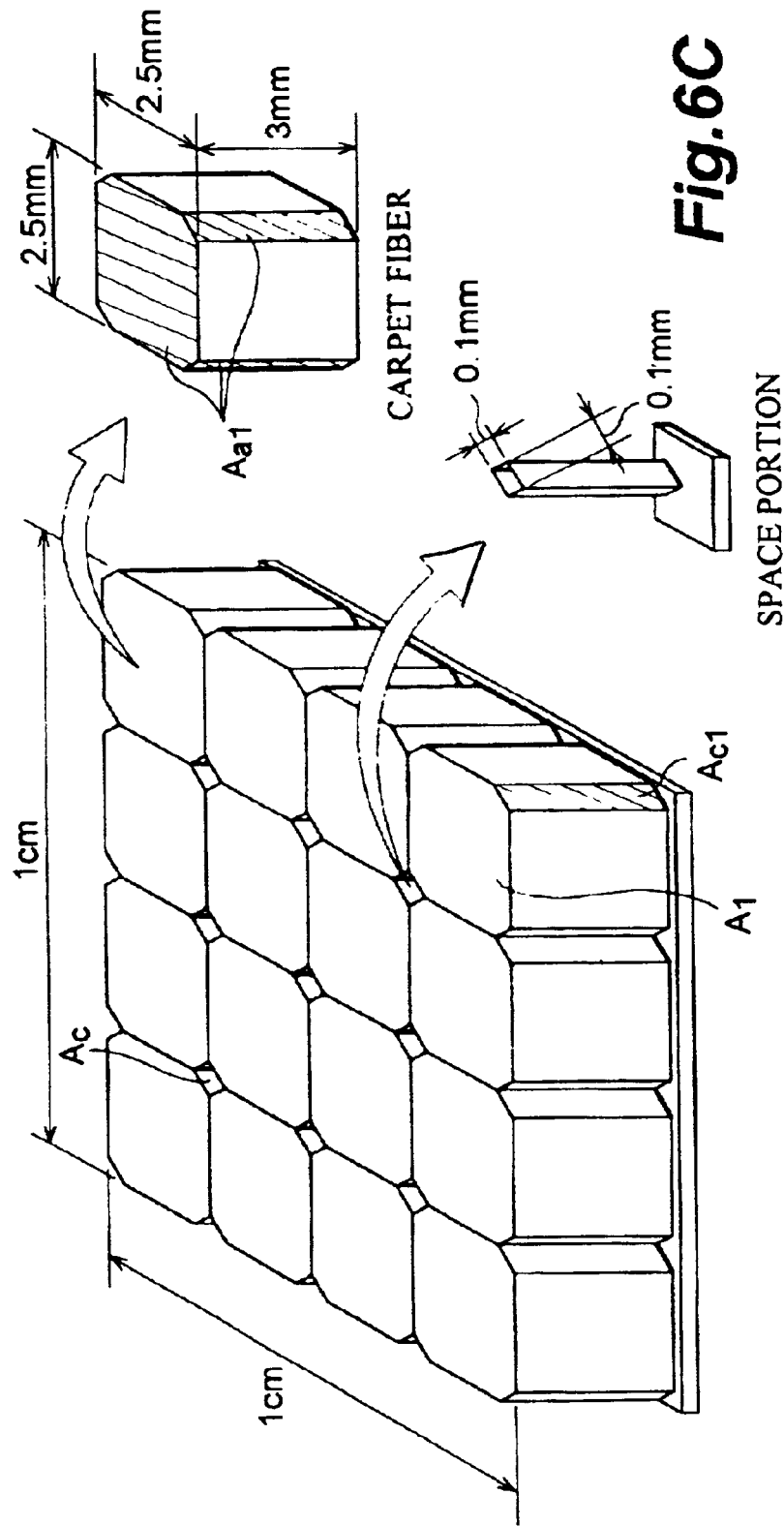
FIG. 6A is an explanatory view showing a modeled state of a carpet in the case where an indoor behavior of a pesticidal compound is estimated in accordance with the second embodiment of the present invention.
FIG. 6B is an enlarged view of a carpet fiber in the case where an indoor behavior of a pesticidal compound is estimated in accordance with the second embodiment of the present invention.
FIG. 6C is an enlarged view of a space portion of the carpet in the case where an indoor behavior of a pesticidal compound is estimated in accordance with the second embodiment of the present invention.

First, the carpet is modeled as shown in FIGS. 6A, 6B, and 6C. Namely, the carpet is divided into a plurality of carpet fibers (ears of fiber) planted on a substrate, and space portions existing between the fibers. When a chemical is

TABLE 13

| SUBJECT COMPOUND | INHALATION (WINDOW CLOSED) | INHALATION (WINDOW OPEN) | PERCUTANEOUS | ORAL | TOTAL (WINDOW CLOSED) | TOTAL (WINDOW OPEN) |
| --- | --- | --- | --- | --- | --- | --- |
| d-phenothrin | | | | | | |
| INFANT | 23,100 | 116,000 | 369,000 | 923,000 | 21,300 | 80,400 |
| ADULT | 24,700 | 124,000 | 1,810,000 | — | 24,400 | 116,000 |
| d-tetramethrin | | | | | | |
| INFANT | 2,880 | 14,400 | 465,000 | 100,000 | 2,780 | 12,200 |
| ADULT | 3,190 | 15,900 | 2,280,000 | — | 3,180 | 15,800 |
| BOTH | | | | | | |
| INFANT | 2,560 | 12,800 | 206,000 | 90,300 | 2,460 | 10,600 |
| ADULT | 2,820 | 14,100 | 1,010,000 | — | 2,820 | 13,900 |

Here, the non-influential amount of a rat concerning d-phenothrin was 18.4 [mg/kg/day] (=non-influential in-air concentration 210 [mg/m$^3$]×rat respiration amount 0.365 [L/min/kg]×rat exposure time 4 [h/day]; 4-week test with exposure of 6 days a week) in inhalation, 1000 [mg/kg/day] (21-day test) for percutaneous exposure, and 125 [mg/kg/day] (6-month test) for oral exposure. On the other hand, the non-influential amount of a rat concerning d-tetramethrin was 3.22 [mg/kg/day] (=non-influential in-air concentration 49 [mg/m$^3$]×rat respiration amount 0.365 [L/min/kg]×rat exposure time 3 [h/day]; 4-week test with exposure of 7 days a week) in inhalation, 1000 [mg/kg/day] (21-day test) for percutaneous exposure, and 10.75 [mg/kg/day] (6-month test) for oral exposure.

As a result, it has been confirmed that the safety coefficient of the infant is lower than that of the adult, and that the safety coefficients of d-phenothrin were higher than the safety coefficients of d-tetramethrin except for the percutaneous safety coefficient. Also, since the inhalation safety coefficient is the lowest of the three, it substantially determines the value of total safety coefficient when exposed by all of the three kinds of exposure routes.

(2) Second Embodiment

With reference to the drawings, the second embodiment of the present invention will be explained in the following. The method of simulating an indoor behavior of a pesticidal compound in accordance with this embodiment estimates the behavior of the compound in the case where the floor in the first embodiment is constituted by a rug having ears of residually sprayed in a room in which such a carpet covers the whole floor surface, the chemical infiltrates into the carpet fiber at the spraying site, and accumulates in the space portion.

While the method of simulating an indoor behavior of a pesticidal compound in accordance with this embodiment also conforms to the flowchart of FIG. 1, at S1, as the primary condition, the carpet-related primary condition shown in Table 14 is added to the primary condition of the first embodiment (see Tables 1 to 4). Here, the cross-sectional area ($A_c$) of the space portion of the carpet refers to the area in which the space portion is in contact with the indoor air (see FIGS. 6A, 6B, and 6C).

TABLE 14

| CARPET - RELATED PRIMARY CONDITION | SYMBOL | EXAMPLE OF VALUE |
| --- | --- | --- |
| CARPET | | |
| CROSS - SECTIONAL AREA OF SPACE PORTION OF CARPET | $A_c$ | 1.6 × 10$^{-3}$ [m$^2$/m$^2$ FLOOR] |
| AREA IN WHICH CARPET FIBER IS IN CONTACT WITH COMPOUND IN SPACE PORTION | $A_{c1}$ | 0.192 [m$^2$/m$^2$ FLOOR] |
| AREA IN WHICH CARPET FIBER IS IN CONTACT WITH COMPOUND | $A_{a1}$ | 1.19 [m$^2$/m$^2$ FLOOR] |

TABLE 14-continued

| CARPET - RELATED PRIMARY CONDITION | SYMBOL | EXAMPLE OF VALUE |
|---|---|---|
| PRODUCT PROPERTY | | |
| CONTENT OF SOLVENT (XYLENE) CONTAINED IN PRODUCT | $C_{sd}$ | |
| DILUTION OF PRODUCT | $X_{sol}$ | |

The examples of values in Table 14 are based on the values shown in FIGS. 6A, 6B, and 6C. Here, one space portion is set to a size of 0.1 [mm]×0.1 [mm]×3 [mm], and one square of carpet fiber is set to a size of 2.5 [mm]×2.5 [mm]×3 [mm]. Also, it is assumed that 16 [pieces] of carpet fiber exist in 1 [cm²].

In this case, the individual parameters can be determined as:

$$A_c = (0.1 \text{ [mm]} \times 0.1 \text{ [mm]} \times 16 \text{ [pieces]})/1 \text{ [cm]}$$
$$= 1.6 \times 10^{-3} \text{ [m}^2/\text{m}^2 \text{ floor]}$$
$$A_{cl} = (0.1 \text{ [mm]} \times 3 \text{ [mm]} \times 4 \text{ [faces]} \times 16 \text{ [pieces]})/1 \text{ [cm]}$$
$$= 0.192 \text{ [m}^2/\text{m}^2 \text{ floor]}$$
$$A_1 = 1 - A_c$$
$$= 1 - 1.6 \times 10^{-3} \text{ [m}^2/\text{m}^2 \text{ floor]}$$
$$A_{al} = A_1 + A_{cl}$$
$$= 1.19 \text{ [m}^2/\text{m}^2 \text{ floor]}$$

Here, $A_1$, which is the area occupied by the spraying site in the first embodiment, is replaced by the area in which the carpet fibers in 1 [m²] are in contact with the indoor air.

As the secondary condition at S2, the carpet-related secondary condition shown in Table 15 is added to the secondary condition of the first embodiment. Here, $k_1$ and $V_1$, which are respectively transference speed of the compound in the spraying site and the volume of the spraying site in the first embodiment (see Table 6), are respectively replaced by the transference speed of the compound in the carpet fiber and the volume of the whole fiber of the carpet.

TABLE 15

| CARPET - RELATED SECONDARY CONDITION | SYMBOL |
|---|---|
| DEFINITE FACTOR CONDITION | |
| EVAPORATION CONSTANT OF CHEMICAL IN SPACE PORTION | $R_d$ |
| HUMIDITY AT TEMPERATURE ($T_d$) OF SPACE PORTION | $H_m$ |
| VOLUME OF WHOLE FIBER OF CARPET | $V_1$ |
| TRANSFERENCE SPEED OF COMPOUND IN PRODUCT | $k_c$ |
| PROPERTY CHANGE CONSTANT OF PRODUCT | a |
| TEMPORAL CHANGE CONDITION | |
| TRANSFERENCE COEFFICIENT OF COMPOUND BETWEEN CHEMICAL IN SPACE PORTION AND AIR | $D_{c4}$ |
| TRANSFERENCE COEFFICIENT OF COMPOUND BETWEEN CHEMICAL IN SPACE PORTION AND CARPET FIBER | $D_{c1}$ |
| VOLUME OF CHEMICAL IN SPACE PORTION | $V_c$ |
| FUGACITY CAPACITY OF CHEMICAL IN SPACE PORTION | $Z_c$ |

A method of computing the definite factor conditions and temporal change conditions shown in the above-mentioned Table 15 will be explained hereinafter as exemplified by the case using an aqueous aerosol, i.e., case where the particle-constituting solvent is water.

From the cross-sectional area ($A_c$) of the space portion, room temperature (T), and humidity (H), the evaporation constant ($R_d$) of the chemical entered into the space portion of the carpet is expressed as:

$$\left.\begin{array}{l} R_d = A_c h(H_m - H)/C_H \\ C_H = 0.24 + 0.46H \\ h = 3.06 \times 10^{-4}(T - T_d)^{1/3} \end{array}\right\} \quad (20)$$

wherein $T_d$ is the temperature of the space portion of the carpet (corresponding to the wet-bulb temperature), and $H_m$ is the humidity (corresponding to the saturated humidity at the wet-bulb temperature) of the space portion at $T_d$. Here, $T_d$ and $H_m$ can be determined from the above-mentioned "mass-based humidity table" according to the room temperature (T) and humidity (H). In the case of an oil-based product (aerosol), while the vapor constant of the chemical can be computed when properties of the water and oil are compared with each other and then are multiplied by $R_d$, $R_d$=0 may be assumed in the case where the evaporation of the oil is slow. The chemical entered into the space portion of the carpet reduces its volume upon evaporation and finally disappears, leaving the compound. Thus left compound permeates through the carpet fiber.

From the diffusion coefficient ($D_c$) in the floor/wall/ceiling and the area ($A_{a1}$) in which the carpet fiber is in contact with the compound, the volume ($V_1$) of the whole fiber of the carpet is determined as follows:

$$V_1 = 2\sqrt{D_c/t} A_{a1} A_t \quad (21)$$

The transference speed ($k_c$) of the compound in the product is expressed as $k_4/100$ by use of $k_4$ (=$GV_4/A_4$) which indicates the transference speed of the compound in the indoor air.

From the above-mentioned transference speed ($k_c$) of the compound in the product, transference speed ($k_d$) of the compound in the indoor air, area ($A_t$) of the spraying site, cross-sectional area ($A_c$) of the space portion, Fugacity capacity ($Z_c$) of the chemical in the space portion determined by expression (24) which will be mentioned later, and Fugacity capacity ($Z_4$) of the air determined by expression (4) of the first embodiment, the transference coefficient ($D_{c4}$) of the compound between the chemical in the space portion of the carpet and the air is expressed as follows:

$$D_{c4} = \frac{1}{1/(k_c A_c A_t Z_c) + 1/(k_4 A_c A_t Z_4)} \quad (22)$$

From the above-mentioned transference speed ($k_c$) of the compound in the product, diffusion coefficient ($D_c$), area ($A_t$) of the spraying site, area ($A_{c1}$) in which the carpet fiber is in contact with the compound in the space portion, Fugacity capacity ($Z_c$) of the chemical in the space portion, and Fugacity capacity ($Z_1$) of the floor determined by expression (2) of the first embodiment, the transference coefficient ($D_{c1}$) of the compound between the chemical in the space portion and the carpet fiber is expressed as:

$$D_{cl} = \frac{1}{1/(k_c A_{cl} A_t Z_c) + 1/(k_1 A_{cl} A_t Z_1)} \quad (23)$$

wherein the transference speed ($k_1$) of the compound within the carpet fiber is expressed as $(D_c/t)^{0.5}$.

The volume ($V_c$) of the chemical in the space portion is determined from the area ($A_t$) of the spraying site, amount of emission of the particle-constituting solvent ($O_a$), and evaporation constant ($R_d$) of the chemical in the space portion determined by expression (20). The volume ($V_c$) of the space portion decreases until the solvent in the chemical completely evaporates.

From the vapor pressure ($P^s$), water solubility ($C^s$), and octanol/water distribution coefficient ($K_{ow}$) of the compound, and property change constant (a) of the product, Fugacity capacity ($Z_c$) of the chemical in the space portion is expressed as:

$$Z_c = (e^{-at} K_{ow} + 1 - e^{-at}) C^s / P^s \quad (24)$$

Here, the property change constant (a) of the product can be computed according to the evaporation constant ($R_d$) of the chemical in the space portion determined by expression (20), content ($C_{sd}$) of the solvent (Xylene) contained in the product, and dilution ($X_{sol}$) of the product. Namely, Fugacity capacity ($Z_c$) of the chemical in the space portion is also expressed as:

$$Z_o = [(\text{ratio of organic solvent in product}) K_{ow} + (\text{ratio of water in product})] \times C^s / P^s$$

By simultaneously forming this expression and the above-mentioned expression (24), the property change constant (a) of the product is computed. Here, in the case of the oil-based product (aerosol), Fugacity capacity ($Z_c$) of the chemical in the space portion is given by expression (5) of the first embodiment from the vapor pressure ($P^s$), water solubility ($C^s$), and octanol/water distribution coefficient ($K_{ow}$) of the compound.

Consequently, the behavior of the compound in the space portion of the carpet is expressed in the form of differential equation concerning Fugacity ($f_c$) as follows:

$$\frac{df_c}{dt} V_c Z_c = \gamma_1 \sum_{i=1}^{3} n_i A_c V_i Z_i f_i + \quad \text{Deposition}(i) \quad (25)$$

$R_d A_t Z_c f_c -$     V-change $D_{cl}(f_c - f_1) -$     Transference(j)

$D_{c4}(f_c - f_4) -$     Transference(5)

$K_c V_c Z_c f_c$     Degradation

Also, expressions (15) and (17) in the first embodiment are respectively replaced by:

$$\frac{df_1}{dt} V_1 Z_1 = \sqrt{D_c/t} A_{cl} A_t Z_1 f_1 + \quad \text{V-change} \quad (26)$$

F-change $\sum_{i=2}^{3} n_i A_1 A_t V_i Z_i f_i -$     Deposition(i)

$D_{cl}(f_3 - f_c) -$     Transference(c)

$D_{14}(f_1 - f_4) -$     Transference(1)

$K_1 V_1 Z_1 f1$     Degradation $$\frac{df_4}{dt} V_4 Z_4 = -G V_4 Z_4 f_4 - \quad \text{Ventilation} \quad (27)$$

F-change $\sum_{i=2}^{3} n_i D_{i4}(f_4 - f_i) -$     Transference(i)

$\sum_{j=5}^{7} D_{4j}(f_4 - f_j) -$     Transference(j)

$K_4 V_4 Z_4 f_4 -$     Degradation $D_{c4}(f_4 - f_c) -$     Transference(c)

$D_{14}(f_4 - f_1)$     Transference(1)

In expression (26), terms of V-change, Deposition (i), Transference (c), Transference (1), and Degradation respectively indicate the change in volume (increase over time) of the carpet fiber, attachment accompanying the falling of particles, amount of transference of the compound between the carpet fiber and the space portion, amount of transference of the compound between the carpet fiber and the air, and change in amount of photodegradation of the compound.

In expression (27), terms of Ventilation, Transference (i), Transference (j), Degradation, Transference (c), and Transference (1) respectively indicate the amount of discharge of the compound outdoors, amount of transference of the compound between the air and the particles, amount of transference of the compound between the air and the floor/ceiling/wall, change in amount of photodegradation of the compound, amount of transference of the compound between the air and the space portion at the spraying site, and amount of transference of the compound between the air and the carpet fiber at the spraying site.

Accordingly, Fugacity calculation at S3 is performed such that eight kinds of differential equations of expressions (16) and (18) in the first embodiment and the above-mentioned expressions of (25) to (27) are solved by Runge-Kutta-Gill method. The subsequent steps of S4 to S17 are similar to those in the first embodiment.

As explained in the foregoing, in the method of estimating an indoor behavior of a pesticidal compound in accordance with this embodiment, in the case where the kind of the spraying site is a carpet having ears of fiber and a space portion between the ears, a differential equation for Fugacity in the above-mentioned space portion of the carpet is added to seven kinds of simultaneous differential equations concerning Fugacity of the compound in the spraying site, two kinds of suspended particles, indoor air, floor, wall, and ceiling, so as to calculate each Fugacity.

Consequently, even in the case where the chemical is accumulated in the space portion, so that the compound behaves differently from the case with a flat floor, the behavior of the compound can be estimated accurately, whereby various kinds of simulations can be performed.

(3) Third Embodiment

With reference to the drawings, the third embodiment of the present invention will be explained in the following.

The method of simulating an indoor behavior of a pesticidal compound (hereinafter simply referred to as compound) contained in a chemical (solution) such as insecticide in accordance with this embodiment mainly estimates the behavior of the compound in the case where the chemical is spatially sprayed in order to terminate indoor vermin such as mosquito or fly. Here, the chemical encompasses all kinds of insecticides including pyrethroid insecticidal compounds and organophosphorus insecticidal compounds.

First, as shown in FIG. 11, an environment is classified into seven kinds of media consisting of large particles (aerosol particles) 2, medium particles (aerosol particles) 8, and small particles (aerosol particles) 3 having diameters different from each other, whole indoor air 4, floor 5, wall 6, and ceiling 7.

The particles are divided into three kinds since their behavior mainly depends on their diameter. Though the particles are distributed in the same site immediately after spraying, as time passes, the large particles 2 are distributed into a spraying zone $SZ_2$ near the floor due to their weight, the medium particles 8 into a spraying zone $SZ_8$ in the middle of the room, and the small particles 3 into a spraying zone $SZ_3$ near the ceiling 7 since they are lighter than the other two kinds of particles.

Simultaneous differential equations concerning Fugacity of the compound in the above-mentioned seven kinds of media are formed and are solved by Runge-Kutta-Gill method, whereby the indoor behavior of the compound in the chemical when the chemical is sprayed in the indoor space, i.e., temporal change of compound distribution in the room, is estimated and analyzed.

Here, since the floor 5 mainly comprises three kinds, i.e., tatami, flooring, and carpet (rug), the differential equation is formed so as to correspond to the kind of floor. Explained in this embodiment is the case where the floor 5 is made of tatami.

With reference to FIG. 1, a method of simulating an indoor behavior of the compound will be explained. The simulation method in accordance with this embodiment can be mainly divided into a step of dividing an indoor environment into predetermined media and forming a differential equation concerning a fugacity of the compound in each medium (S1 to S2); a step of determining the fugacity of the compound in each medium from the differential equation (S3); a step of determining the indoor behavior of the compound from the fugacity of the compound in each medium (S4); a step of changing, in response to a fluctuation in mass balance of the compound indoors, a minute time unit used when solving the differential equation (S21 to S35, see FIG. 5); and a step of evaluating safety of the compound with respect to a human body according to the indoor behavior of the compound (S5 to S17).

First, at step (herein after abridged as S) 1, a primary condition is inputted. The primary condition comprises physicochemical properties of the compound (see Table 16), indoor environmental behavior properties of the compound (see Table 17), indoor environment (see Table 18), product properties (see Table 19), and a spray condition (see Table 20).

TABLE 16

| PHYSICOCHEMICAL PROPERTY OF COMPOUND | SYMBOL | EXAMPLE OF VALUE |
|---|---|---|
| MOLECULAR WEIGHT | — | 277.23 [g/mole] |
| SPECIFIC GRAVITY | $\rho$ | $1.33 \times 10^6$ [g/m$^3$] |
| VAPOR PRESSURE | $P^S$ | $2.85 \times 10^{-2}$ [Pa] |
| WATER SOLUBILITY | $C^S$ | $5.05 \times 10^{-2}$ [mole/m$^3$] |
| OCTANOL/WATER DISTRIBUTION COEFFICIENT | $K_{OW}$ | $10^{3.27}$ |
| MELTING POINT | $T_M$ | 273.45 [K] |

TABLE 17

| INDOOR ENVIRONMENTAL BEHAVIOR PROPERTY OF COMPOUND | SYMBOL | EXAMPLE OF VALUE |
|---|---|---|
| PHOTODEGRADATION CONSTANT | | |
| IN AEROSOL PARTICLES | $K_i$ (i = 2,3,8) | $8.67 \times 10^{-3}$ [1/h] |
| AIR | $K_4$ | $1.05 \times 10^{-1}$ [1/h] |
| FLOOR | $K_5$ | $1.60 \times 10^{-3}$ [1/h] |
| WALL/CEILING | $K_j$ (j = 6,7) | $9.62 \times 10^{-4}$ [1/h] |
| HALF-LIFE OF TRANSFERENCE TO AIR | | |
| IN FLOOR | $\tau_{45}$ | 36.0 [h] |
| WALL | $\tau_{46}$ | 43.2 [h] |
| CEILING | $\tau_{47}$ | 43.2 [h] |

TABLE 18

| INDOOR ENVIRONMENT | | SYMBOL | EXAMPLE OF VALUE |
|---|---|---|---|
| OIL BASE | ROOM SIZE | $V_4$ | 23.3 [m$^3$] |
| | TEMPERATURE | T | 297 [K] |
| | RELATIVE HUMIDITY | $\phi$ | 60 [% RH] |
| | ABSOLUTE HUMIDITY | H | $1.19 \times 10^{-2}$ [kg-H$_2$O/kg-dry air] |
| | VENTILATION RATE | G | 1.58 [1/h] |
| | INDOOR VAPOR PRESSURE IN PARTICLE - CONSTITUTING SOLVENT | $P\infty$ | 0 [Pa] |
| | AIR DIFFUSION COEFFICIENT | $D_{air}$ | $1.84 \times 10^{-2}$ [m$^2$/h] |
| | OIL COMPONENT CONTENT | — | 46 [%] (IN CASE OF TATAMI) 4 [%] (IN CASE OF FLOORING) 30 [%] (IN CASE OF WALLPAPER) |
| WATER BASE | WET - BULB TEMPERATURE | $T_d$ | 294 [K] |
| | VAPOR PRESSURE OF WATER | $P\infty$ | $1.89 \times 10^3$ [Pa] |

HERE, $V_4 = L_4 \times W_4 \times$ HEIGHT.

TABLE 19

| PRODUCT PROPERTY | | SYMBOL | EXAMPLE OF VALUE |
|---|---|---|---|
| OIL BASE | COMPOUND CONTENT (CONCENTRATION) | $C_a$ | $1.33 \times 10^3$ [g/m$^3$] |
| | SPRAY RATE | — | 0.45 [g/sec] |
| | PARTICLE CONSTITUTING SOLVENT PROPERTY | | |
| | VAPOR PRESSURE | $P_d$ | 6.92 [Pa] |
| | MOLECULAR WEIGHT | $M_d$ | 184.37 [g/mole] |
| | SPECIFIC GRAVITY | $\rho_d$ | $7.56 \times 10^5$ [g/m$^3$] |
| | DIAMETERS OF AEROSOL PARTICLE (3 KINDS) | $d_{02}$ | 50 [$\mu$m] |
| | | $d_{08}$ | 30 [$\mu$m] |
| | | $d_{03}$ | 10 [$\mu$m] |

TABLE 19-continued

| PRODUCT PROPERTY | | SYMBOL | EXAMPLE OF VALUE |
|---|---|---|---|
| | DISTRIBUTIONS OF AEROSOL PARTICLES (3 KINDS) | — | 30 [%] (LARGE PARTICLE) |
| | | — | 60 [%] (MEDIUM PARTICLE) |
| | | — | 10 [%] (SMALL PARTICLE) |
| WATER BASE | PARTICLE CONSTITUTING SOLVENT PROPERTY | | |
| | VAPOR PRESSURE | $P_d$ | $2.26 \times 10^3$ [Pa] |
| | MOLECULAR WEIGHT | $M_d$ | 18 [g/mole] |
| | SPECIFIC GRAVITY | $\rho_d$ | $1 \times 10^6$ [g/m$^3$] |

TABLE 20

| SPRAY CONDITION | EXAMPLE OF VALUE |
|---|---|
| SPRAY TIME | 10 [sec] |
| SPRAY HEIGHT | 1.6 [m] |

Figure 14:
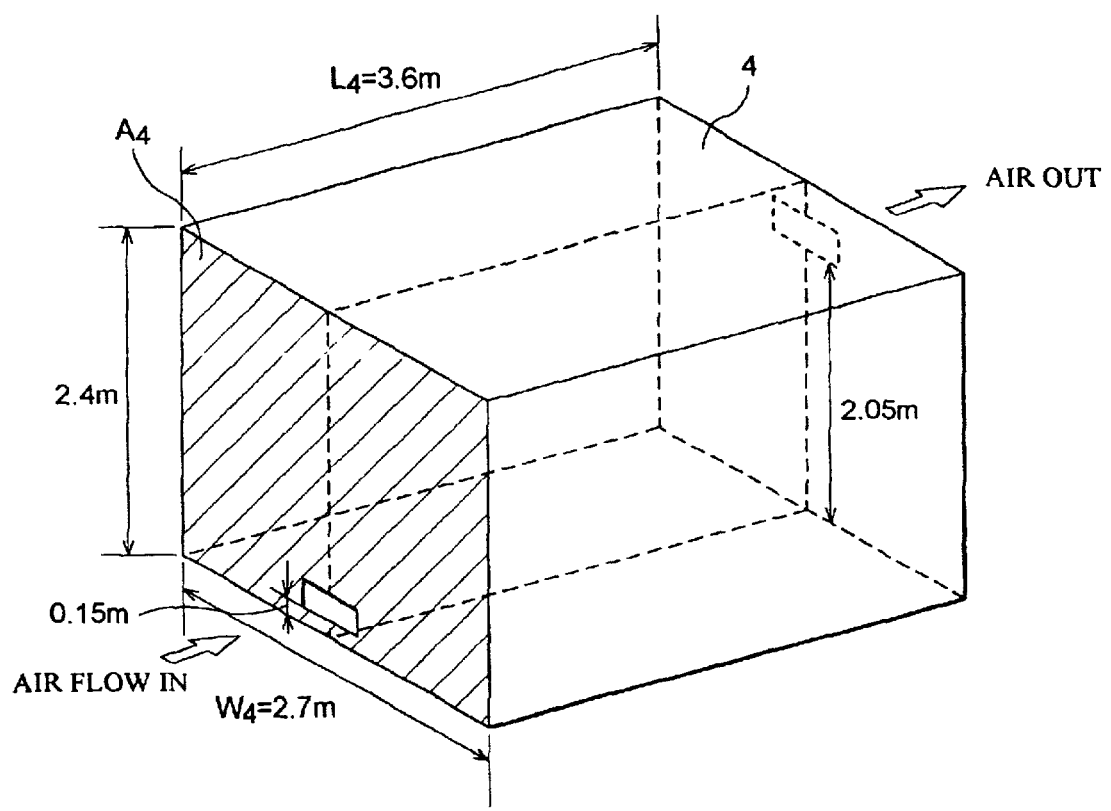
FIG. 14 is an explanatory view showing an example of size of a typical room, together with an airflow.

Here, the examples of values in Tables 16 to 20 assume those of a six-mat room (9.72 [m$^2$]) of a typical apartment in Japan in summer (see FIG. 14).

Subsequently, using the primary condition, a secondary condition is determined by calculation (S2). The secondary condition comprises a temporally unchangeable definite factor condition (see Table 21) determined by the primary condition alone, and a temporal change condition accompanying a temporal change (see Table 22). Their calculations will be explained later in detail.

TABLE 21

| DEFINITE FACTOR CONDITION | SYMBOL |
|---|---|
| NUMBER OF AEROSOL PARTICLES IMMEDIATELY AFTER SPRAYING | $n_{0i}$ (i = 2,8,3) |
| EVAPORATION CONSTANT OF AEROSOL PARTICLES | $\alpha$ |
| VOLUME RATIO OF COMPOUND IN PRODUCT | $R_a$ |
| DIFFUSION COEFFICIENT OF COMPOUND IN AIR | $D_{ca}$ |
| SURFACE AREA OF FLOOR/WALL/CEILING | $A_j$ (j = 5,6,7) |
| DIFFUSION COEFFICIENT OF FLOOR/WALL/CEILING | $D_c$ |
| FUGACITY CAPACITY | |
| OF AEROSOL PARTICLE | $Z_i$ (i = 2,8,3) |
| AIR | $Z_4$ |
| FLOOR/WALL/CEILING | $Z_j$ (j = 5,6,7) |

TABLE 22

| TEMPORAL CHANGE CONDITION | SYMBOL |
|---|---|
| AEROSOL PARTICLE | |
| DIAMETER | $d_i$ (i = 2,8,3) |
| FALLING SPEED | $v_i$ (i = 2,8,3) |
| FLOATING NUMBER | $n_i$ (i = 2,8,3) |
| AEROSOL ZONE WIDTH | $L_{zi}$ (i = 2,8,3) |
| TRANSFERENCE SPEED OF COMPOUND | |
| IN AEROSOL PARTICLE | $k_i$ (i = 2,8,3) |
| AIR | $k_4$ |

TABLE 22-continued

| TEMPORAL CHANGE CONDITION | SYMBOL |
|---|---|
| FLOOR/WALL/CEILING | $k_j$ (j = 5,6,7) |
| TRANSFERENCE COEFFICIENT OF COMPOUND BETWEEN AEROSOL PARTICLE AND AIR | $D_{i4}$ (i = 2,8,3) |
| TRANSFERENCE COEFFICIENT OF COMPOUND BETWEEN AIR AND FLOOR/WALL/CEILING | $D_{4j}$ (j = 5,6,7) |
| VOLUME OF AEROSOL PARTICLE | $V_i$ (i = 2,8,3) |
| VOLUME OF FLOOR/WALL/CEILING | $V_j$ (j = 5,6,7) |

Using the secondary condition, seven kinds of Fugacity are calculated (S3). Namely, seven kinds of differential equations concerning the large, medium, and small particles 2, 8, and 3, air 4, floor 5, wall 6, and ceiling 7 are simultaneously formed and are solved by Runge-Kutta-Gill method, whereby seven kinds of Fugacity are computed over time. Here, an estimation nick time width (minute time unit) set when solving the differential equations is automatically set so as to be varied in response to a fluctuation in mass balance of the compound.

At S4, using thus computed Fugacity ($f_i$, i=2, 8, 3) of the small, medium, and large particles 2, 8, and 3, and Fugacity ($f_4$) of the air 4, temporal concentration of the compound in the air is computed; whereas temporal floor residual amount of the compound on the floor 5 is computed by use of Fugacity ($f_5$) of the floor 5.

At S5, it is judged whether or not to perform safety evaluation in the case where the chemical is inhaled. If the safety evaluation in inhalation is to be performed, then an estimated exposure amount in inhalation indicating a degree of exposure upon inhalation of the contaminated air is computed by use of the above-mentioned temporal concentration in the indoor air (S6). Thereafter, an inhalation safety coefficient is computed according to the estimated exposure amount in inhalation (S7). At S8, the inhalation safety coefficient is compared with a reference value defined in each country. If the inhalation safety coefficient exceeds the reference value, it is judged that "there is no problem in safety." By contrast, if the inhalation safety coefficient is lower than the reference value at S8, it is judged that "there is a problem in safety," and the operation returns to S1, where alteration of the primary condition such as alteration of compound, alteration of chemical formulation, alternation of using condition, or the like is considered.

If the safety evaluation in inhalation is not selected at S5, calculated is an estimated amount of percutaneous exposure indicating to what extent the skin is exposed in contact with the floor 5 to which the chemical is attached (S9). Thereafter, at S10, it is judged whether to perform a percutaneous safety evaluation or not. If the percutaneous safety evaluation is to be performed, a percutaneous safety coefficient is computed according to the estimated percutaneous exposure amount (S11). At S12, as with the safety evaluation in inhalation, the percutaneous safety coefficient is compared with a reference value defined in each country, whereby the safety is evaluated. If there is a problem in safety at S12, the operation returns to S1, where alteration of the primary condition is considered.

If the percutaneous safety evaluation is not selected at S10, calculated at S13 according to the estimated percutaneous exposure amount is an estimated oral exposure amount indicating the degree of exposure in the case where the chemical attached to a hand or the like is taken orally (S13). Subsequently, according to the estimated oral exposure amount, an oral safety coefficient is computed (S14). This oral exposure may occur, in particular, when an infant puts a chemical-attached hand into the mouth. At S15, as with the safety evaluation in inhalation, the oral safety coefficient is compared with a reference value defined in each country, whereby the safety is evaluated. If there is a problem in safety at S15, the operation returns to S1, where alteration of the primary condition is considered.

Finally, if it is judged to be safe at S8, S12, or S15, overall safety is evaluated. Here, the sum of respective reciprocals of the previously determined inhalation safety coefficient, percutaneous safety coefficient, and oral safety coefficient is determined, and the reciprocal of thus determined value is defined as an overall safety coefficient (S16). This overall safety coefficient is compared with a reference value, whereby an evaluation similar to the previous safety evaluation is effected (S17).

In the following, the above-mentioned steps of S2 to S4, S6, S7, S9, S11, S13, and S14 will be explained in detail.

(i) Secondary Condition Calculation (S2)

Calculations of the definite factor condition shown in Table 21 and the temporal change condition shown in Table 22 will be explained.

The particle number ($n_{0i}$, i=2, 8, 3) of the large, medium, and small particles 2, 8, and 3 immediately after spraying is determined from the spraying rate, particle diameter ($d_{0i}$, i=2, 8, 3) immediately after spraying, distributions of particles (three kinds), and spray time. The particle number ($n_{0i}$) is constant until the bottom of the spraying zone ($SZ_i$, i=2, 8, 3) reaches the floor 5.

According to surface temperature ($T_d$) of particles, properties of particle-constituting solvent (vapor pressure $P_d$, molecular weight $M_d$, and specific gravity $\rho_d$), and indoor environment (air diffusion coefficient $D_{air}$, vapor pressure $P^\infty$, and room temperature $T^\infty$), the evaporation constant ($\alpha$) of the large, medium, and small particles 2, 8, and 3 is defined as:

$$\alpha = \frac{4D_{air}M_d}{R\rho_d}\left(\frac{P_d}{T_d} - \frac{P\infty}{T\infty}\right) \tag{28}$$

wherein R is a gas constant.

Here, the upper parts of the above-mentioned Tables 18 and 19 exemplify the case where the spatially sprayed aerosol is of oil base. In this case, $T^\infty$ (temperature at the site far from aerosol particles) and $T_d$ are set to room temperature (T), whereas $P^\infty$ (vapor pressure of oil at the site far from aerosol particles) is set to zero.

In the case where the spatially sprayed aerosol is of water base, it is necessary for $P_d$, $M_d$, $\rho_d$, $T_d$, and $P^\infty$ in expression (28) to be changed to values based on properties of water. Specifically, the above-mentioned factor values when the room temperature (T) is 298 [K] (=25° C.) and the relative humidity is 60[% RH] are exemplified in the lower parts of Tables 18 and 19.

Here, $T_d$ can be determined, according to the room temperature (T) and relative humidity (H), from "mass-based humidity table" disclosed in "Kagaku Kikai no Riron to Keisan (Theory and Calculation of Chemical Machines)" (Second Edition) (Saburo Kamei ed., Sangyo Tosho) or the like. On the other hand, $P_d$ and $P^\infty$ can be computed from the following expressions:

$\log_{10}P_d = 10.23 - 1750/(T_d - 38)$ $\log_{10}P^\infty = 8.23 - 1750/(T - 38) + \log_{10}\psi$ wherein $\psi$ is an indoor relative humidity.

From the vapor pressure ($P^s$) and melting point ($T_M$) of the compound and surface temperature ($T_d$) of particles, Fugacity capacity ($Z_i$, i=2, 8, 3) of the large, medium, and small particles 2, 8, and 3 is expressed as:

$$Z_i = \frac{6 \times 10^6}{P_L^s RT_d} \tag{29}$$

$$P_L^s = P^s \exp\{6.79(T_M/T_d - 1)\}$$

Though the vapor pressure of the compound in a liquid state ($P_L^s$) is computed by use of $T_M$ and $T_d$ here; in the case where $T_M$ cannot be obtained, $P_L^s$ may be set identical to the vapor pressure of the compound in a solid state ($P^s$).

From the room temperature (T), Fugacity capacity ($Z_4$) of the air 4 is expressed as follows:

$$Z_4 = \frac{1}{RT} \tag{30}$$

From the vapor pressure ($P^s$), water solubility ($C^s$), and octanol/water distribution coefficient ($K_{ow}$) of the compound, and from the oil component content ($\rho_j$, j=5, 6, 7) of the material constituting the floor 5, wall 6, and ceiling 7, Fugacity capacity ($Z_j$, j=5, 6, 7) of the floor 5, wall 6, and ceiling 7 is expressed as:

$$Z_j = \rho_j K_{ow} C^s / P^s \tag{31}$$

Since the volume of particles decreases over time due to evaporation of the particle-constituting solvent component, during the evaporation of particle-constituting solvent component, using the diameter ($d_{0i}$) of particles immediately after spraying (t=0) and the evaporation constant ($\alpha$) determined from expression (28), the diameter ($d_i$, i=2, 8, 3) of the large, medium, and small particles 2, 8, and 3 at time t is represented as shown in the following expression (32):

$$d_i = \sqrt{d_{0i}^2 - 2\alpha t} \tag{32}$$

$$d_i = \sqrt[3]{R_a} d_{0i} \tag{32'}$$

By contrast, the diameter ($d_i$) of particles after complete evaporation of the particle-constituting solvent component is represented as shown in the above expression (32') by use of the ratio of volume of the compound in the product ($R_a$) and the diameter ($d_{0i}$) of particles immediately after spraying.

From the compound content ($C_a$) and specific gravity of the compound ($\rho$), the ratio of volume of the compound in the product ($R_a$) is expressed as $C_a/\rho$.

Since movement of the particles is under the control of gravity and air resistance, according to Stokes' law using the specific gravity ($\rho_d$) of the particle-constituting solvent and the diameter ($d_i$) of particles determined by expression (32), the falling speed ($v_i$, i=2, 8, 3) of the large, medium, and small particles 2, 8, and 3 before complete evaporation of the particle-constituting solvent component is represented by the following expression (33):

$$v_i = \frac{\rho_d g S_c}{18\eta} d_i^2 = \beta d_i^2 = \beta(d_{0i}^2 - 2\alpha t) \tag{33}$$

$$S_c = 1 + \frac{2}{7.6 \times 10^7 d_i}\{6.32 + 2.01\exp(-8.322 \times 10^6 d_i)\} \tag{33'}$$

$$v_i = (\rho/\rho_d)\beta d_i^2 \tag{33''}$$

wherein g is gravitational acceleration, $\eta$ is the coefficient of viscosity of the air 4, $S_c$ is a sliding correction coefficient, and, $\beta$ is a speed coefficient. Here, while particles do not conform to the Stokes' law when they become small, the sliding correction coefficient ($S_c$), which is a coefficient for correcting this phenomenon, is represented by the above expression (33') according to the diameter ($d_i$) of particles determined by expression (32).

On the other hand, the falling speed ($v_i$) of the particles after the complete evaporation of particle-constituting solvent component is represented by the above expression (33") using the specific gravity ($\rho$) of the compound, specific gravity ($\rho_d$) of the particle-constituting solvent, speed coefficient ($\beta$), and diameter ($d_i$) of particles determined by expression (32').

From the spray height, aerosol zone width ($L_{zi}$) determined by expression (35) which will be mentioned later, falling speed ($v_i$) of particles determined by expression (33) or expression (33"), and the above-mentioned particle number ($n_{0i}$) immediately after spraying, the floating number ($n_i$, i=2, 8, 3) of the large, medium, and small particles 2, 8, and 3 after the bottom of the spraying zone ($SZ_i$) reaches the floor 5 is expressed as:

$$n_i = n_{0i}\left[1 - \frac{v_i}{L_{Zi}}(t - t_{Xi}) - Gt\right] \quad (34)$$

wherein $t_{xi}$ is the time necessary for the bottom of the spraying zone ($SZ_i$) to reach the floor 5, and $t<t_{xi}$. Here, G is the ventilation rate, taking account of the fact that the large, medium, and small particles 2, 8, and 3 not only disappear as attaching to the floor, wall, and ceiling but also are discharged outdoors by ventilation. Also, $L_{Zi}$ is the dispersion width of suspended particles upon spraying, which may be either determined by expression (35) or simplified by use of the dispersion width immediately after dispersion as it is.

The width of aerosol zone ($L_{Zi}$, i=2, 8, 3) is the width (height) of the spraying zone after the bottom of the spraying zone ($SZ_i$) reaches the floor 5. Since the spraying zone ($S_{zi}$) is absorbed by the floor 5 while changing the falling speed ($v_i$) of particles determined by expression (33) or expression (33"), from the spray height and the above-mentioned falling speed ($v_i$), the aerosol zone width is defined as:

$$L_{Zi} = \int_{t_{xi}}^{t_{yi}} v_i dt \quad (35)$$

wherein $t_{yi}$ is the time necessary for the spraying zone ($SZ_i$) to be completely absorbed by the floor 5.

From the transference speed ($k_i$, i=2, 8, 3) of the compound in the large, medium, and small particles 2, 8, and 3, transference speed ($k_4$) of the compound in the air 4, diameter ($d_i$) determined by expression (32) or (32'), and Fugacity capacity ($Z_i$) and Fugacity capacity ($Z_4$) determined by expressions (29) and (30), the transference coefficient ($D_{i4}$, i=2, 8, 3) between the large, medium, and small particles 2, 8, and 3 and the air 4 is represented as follows:

$$D_{i4} = \frac{1}{1/(k_i A_i Z_i) + 1/\{(k_4 + v_i)A_i Z_4\}} \quad (36)$$

wherein $A_i$ ($=\pi d_i^2$) is the surface area of particles. From the ventilation rate (G), the transference speed ($k_4$) of the compound in the air 4 is expressed as $GV_4/A_4$. From the transference speed ($k_4$) of the compound in the air, the transference speed ($k_i$) of the compound in the particles is expressed as $k_4/100$. Here, as shown in FIG. 14, the above-mentioned $A_4$ is the cross-sectional area of the room with respect to the direction of movement of the air 4 (arrowed direction in the drawing).

Using the diffusion coefficient ($D_c$) of compound in the floor 5, wall 6, and ceiling 7, the transference speed ($k_j$) of the compound in the floor 5, wall 6, and ceiling 7 is expressed as $(D_c/t)^{0.5}$. Here, $D_c$ can be computed as follows. Namely, $D_c$ can be determined when the diffusion coefficient ($D_{ca}$) in the air is multiplied by $10^{-9}$, whereas $D_{ca}$ can be computed from properties of the compound (e.g., structural formula, molecular weight, and the like) according to Wike and Lee method ("Handbook of Chemical Property Estimation Methods," McGraw-Hill Book Company, 1982), for example.

From the half-life of transference to air ($\tau_{4j}$, j=5, 6, 7) in each of the floor 5, wall 6, and ceiling 7, room size ($V_4$), volume ($V_j$) of the floor 5, wall 6, and ceiling 7 determined by expression (39) mentioned later, and Fugacity capacity ($z_4$) and ($z_j$) determined by expressions (30) and (31), the transference coefficient ($D_{4j}$, j=5, 6, 7) of the compound between the air 4 and the floor 5, wall 6, and ceiling 7 is represented as the following expression (37):

$$D_{4j} = \frac{0.693}{\tau_{4j}\{1/(V_4 Z_4) + 1/(V_j Z_j)\}} \quad (37)$$

$$D_{4j} = \frac{1}{1/(k_4 A_j Z_4) + 1/(k_j A_j Z_j)} \quad (37')$$

The above-mentioned transference coefficient ($D_{4j}$) may also be determined by the expression represented by the above-mentioned expression (37') from the speed of the compound in the air ($k_4$), speed ($k_j$) of the compound in the floor 5, wall 6, and ceiling 7, surface area ($A_j$, j=5, 6, 7) of the floor 5, wall 6, and ceiling 7, and Fugacity capacity ($Z_4$) and ($Z_j$) determined by expressions (30) and (31). The surface area ($A_j$) of each of the floor 5, wall 6, and ceiling 7 is determined by the size of the room ($V_4=L_4 \times W_4 \times$height).

Here, the half-life of transference to air ($\tau_{4j}$) in expression (37) is hard to actually measure and varies under various conditions, thus making it difficult to determine an accurate value thereof. By contrast, all the parameters in expression (37') can be easily determined by calculation without necessitating measurement. Accordingly, the transference coefficient ($D_{4j}$) is more preferably determined by expression (37') than by expression (37).

Using the diameter ($d_i$) of particles determined by expression (32) or expression (32'), the volume ($V_i$, i=2, 8, 3) of the large, medium, and small particles 2, 8, and is expressed by:

$$V_i = \frac{\pi}{6}d_i^3 \quad (38)$$

Assuming that each of the floor 5, wall 6, and ceiling 7 before spraying the chemical is like a thin film and that, as the chemical infiltrates into the film, its thickness increases so as to enhance the volume thereof; from the surface area ($A_j$) of the floor 5, wall 6, and ceiling 7 and diffusion coefficient ($D_c$) of the compound in the floor 5, wall 6, and ceiling 7, the volume ($V_j$, j=5, 6, 7) of floor 5, wall 6, and ceiling 7 becomes:

$$V_j = 2\sqrt{D_c t} A_j \quad (39)$$

(ii) Fugacity Calculation (S3)

The behavior of the compound in the large, medium, and small particles 2, 8, and 3 is expressed in the form of differential equation concerning Fugacity ($f_i$) as:

$$\frac{df_i}{dt}V_iZ_i = \frac{\pi}{2}\alpha d_i Z_i f_i \quad \text{V-change} \quad (40)$$

$$\text{F-change}$$

$$-D_{i4}(f_i - f_4) \quad \text{Transference(4)}$$

$$-K_i V_i Z_i f_i \quad \text{Degradation}$$

Here, the terms of V-change, Transference (4), and Degradation respectively indicate volume change (decrease over time) of the large, medium, and small particles 2, 8, and 3, amount of transference of the compound between the particles and the air 4, and change in amount of photodegradation of the compound. Here, among the photodegradation constants shown in the above-mentioned Table 17, it is difficult to actually measure the photodegradation constant ($K_4$) of the compound in the air, whereby it is not usually easy to determine this value. Therefore, when the actually measured value is unavailable, it may be determined as being computed by Atmospheric Oxidation program (Atkinson et al., 1984, Chem. Rev. Vol. 84, pp.437–470) using the structural formula of the compound. Also, the degradation constant in the particles and in the interior materials (floor 5, wall 6, and ceiling 7) may be set to zero in view of the safety of inhabitants when the actually measured values are unavailable. Here, the term of V-change is effective only while the particle-constituting solvent component is evaporating, whereas Fugacity ($f_i$) is effective only while the spraying zone ($SZ_i$) exists.

The behavior of the compound in the air 4 is expressed in the form of differential equation concerning Fugacity ($f_4$) as:

$$\frac{df_4}{dt}V_4Z_4 = -GV_4Z_4 f_4 \quad \text{Ventilation} \quad (41)$$

$$\text{F-change}$$

$$-\sum_{i=2,8,3} n_i D_{i4}(f_4 - f_i) \quad \text{Transference}(i)$$

$$-\sum_{j=5}^{7} D_{4j}(f_4 - f_j) \quad \text{Transference}(j)$$

$$-K_4 V_4 Z_4 f_4 \quad \text{Degradation}$$

Here, the terms of Ventilation, Transference (i), Transference (j), and Degradation respectively indicate amount of discharge of the compound outdoors, amount of transference of the compound between the air 4 and the particles, amount of transference between the air 4 and the floor 5, wall 6, and ceiling 7, and change in amount of photodegradation of the compound.

The behavior of the compound in the floor 5, wall 6, and ceiling 7 is expressed in the form of differential equation concerning Fugacity ($f_5$), ($f_6$), ($f_7$) as:

$$\frac{df_5}{dt}V_5Z_5 = -\sqrt{D_c/t}\, A_5 Z_5 f_5 + \quad \text{V-change} \quad (42)$$

$$\text{F-change } \gamma_5 \sum_{i=2,8,3} \frac{n_{01}}{L_{zi}} v_i V_i Z_i f_i - \quad \text{Deposition}(i)$$

$$D_{45}(f_5 - f_4) - \quad \text{Transference(4)}$$

$$K_5 V_5 Z_5 f_5 \quad \text{Degradation}$$

$$\frac{df_6}{dt}V_6Z_6 = -\sqrt{D_c/t}\, A_6 Z_6 f_6 + \quad \text{V-change} \quad (43)$$

$$\text{F-change } \gamma_6 \sum_{i=2,8,3} \frac{n_{01}}{L_{zi}} v_i V_i Z_i f_i - \quad \text{Deposition}(i)$$

$$D_{46}(f_6 - f_4) - \quad \text{Transference(4)}$$

$$K_6 V_6 Z_6 f_6 \quad \text{Degradation}$$

$$\frac{df_7}{dt}V_7Z_7 = -\sqrt{D_c/t}\, A_7 Z_7 f_7 + \quad \text{V-change} \quad (44)$$

$$\text{F-change } \gamma_7 \sum_{i=2,8,3} \frac{n_{01}}{L_{zi}} v_i V_i Z_i f_i - \quad \text{Deposition}(i)$$

$$D_{47}(f_7 - f_4) - \quad \text{Transference(4)}$$

$$K_7 V_7 Z_7 f_7 \quad \text{Degradation}$$

Here, the terms of V-change, Transference (4), and Degradation in each expression respectively indicate volume change (increase over time) of the floor 5, wall 6, and ceiling 7, amount of transference of the compound between the floor 5, wall 6, ceiling 7 and the air 4, and change in amount of photodegradation of the compound. Also, Deposition (i) indicates attachment accompanying the falling of the particles. Here, $\gamma_5$, $\gamma_6$, and $\gamma_7$ indicate ratios of the large, medium, and small particles 2, 8, 3 attaching to the floor 5, wall 6, and ceiling 7, respectively, and mainly depend on the ventilation rate (e.g., when the ventilation rate is 1.58 [1/hour], $\gamma_5=0.93$, $\gamma_6=0.06$, $\gamma_7=0.01$). As $\gamma_5$, $\gamma_6$, and $\gamma_7$ are introduced, the behavior of the compound can be estimated accurately. When $\gamma_5$, $\gamma_6$, and $\gamma_7$ are unavailable, it is preferable to presume the worst case in terms of safety evaluation and perform calculation with $\gamma_5=1$, $\gamma_6=0$, and $\gamma_7=0$.

The above-mentioned seven kinds of differential equations (40) to (44) are simultaneously formed and are solved by Runge-Kutta-Gill method, so as to compute Fugacity ($f_2$ to $f_8$).

When solving these simultaneous differential equations, it is necessary to set an estimation nick time width (dt) which is a minute time unit. Namely, the estimation nick time width is used such that solutions of the simultaneous differential equations are initially determined at a time ($t_0$), and then solutions of the simultaneous differential equations are determined at a time ($t_0+dt$) to which the estimation nick time width is added. As solutions are obtained while estimation nick time widths are successively added, temporally changing Fugacity can be determined. Theoretically, as the set time of the estimation nick time width is shorter, more accurate solutions can be obtained, though necessitating a very long calculation time. By contrast, when the set time is too long, solutions tend to diverge, thereby generating errors.

Therefore, in the present invention, the estimation nick time width is set shorter when a very large change occurs in a chemical, whereas it is set longer when there is no large change.

Specifically, mass balance is always confirmed such that the amount of input of the chemical and the resulting solution coincide with each other, and the estimation nick time width is set longer when the mass balance does not fluctuate greatly, whereas it is set shorter when the mass balance starts fluctuating. For example, when the fluctuation of mass balance is set to an accuracy of ±5%, the estimation nick time width is always set so as to constantly satisfy the relationship of:

compound input amount/(existing amount+degrading amount+discharging amount)=0.95 to 1.05 namely, such that the fluctuation of mass balance lies within the range of ±5%.

Here, the above-mentioned compound input amount is determined by the compound content ($C_a$), spray rate, and spray time. Since the temporal amounts of compound in the seven kinds of media are determined by the simultaneous differential equations, they are summed up so as to compute the existing amount as follows:

$$\text{existing amount} = \sum_{i=2,8,3} n_i f_i V_i Z_i + \sum_{k=4}^{7} f_k V_k Z_k \quad (45)$$

$$\text{degrading amount} = \sum_{i=2,8,3} n_i K_i f_i V_i Z_i + \sum_{k=4}^{7} K_k f_k V_k Z_k$$

$$\text{discharging amount} = G V_4 Z_4 f_4$$

The degrading amount and discharging amount are as represented above.

With reference to the flowchart of FIG. 5, the method of setting the estimation nick time width (dt) will be explained.

First, an initial value of estimation nick time width (dt) is inputted (S21). Then, an upper limit set value (e.g., 0.1[%]) which is the upper limit of difference in mass balance, and a lower limit set value (e.g., $10^{-6}$[%]) which is the lower limit of difference in mass balance are inputted (S22). Thereafter, Fugacity and mass balance at $t=t_0$ are calculated (S23 and S24), and Fugacity and mass balance at t=t+dt (or $t_0$+dt) are calculated (S25 and S26).

It is judged whether the fluctuation in mass balance is within the range of ±5% or not (S27). If the fluctuation in mass balance is within the range of ±5%, it is judged whether the difference between the mass balance at t=t (or $t_0$) and the mass balance at t=t+dt (or $t_0$+dt) is at least the upper limit set value or not (S28). If it is judged to be at least the upper limit set value at S28, then solutions become more accurate when the estimation nick time width (dt) is made shorter. In this case, the estimation nick time width (dt) is multiplied by ½ so as to change its setting (S29). When the difference is judged to be smaller than the upper limit set value at S28, it is judged at S30 whether the difference between the mass balance at t=t (or $t_0$) and the mass balance at t=t+dt (or $t_0$+dt) is at most the lower limit set value or not.

When the mass balance difference is not greater than the lower limit set value at S30, since solutions are not influenced by longer estimation nick time width (dt), the estimation nick time width (dt) is doubled so as to change its setting (S31). Subsequently, it is judged whether the estimation nick time width (dt) changed at S31 is at most a maximum value (e.g., 0.1 [hour]) of estimation nick time width (dt) or not (S32). When the estimation nick time width (dt) is not greater than the maximum value at S32, since solutions do not diverge, the estimation nick time width (dt) set at S31 is used. When the estimation nick time width (dt) is greater than the maximum value at S32, since solutions may diverge, the estimation nick time width (dt) is reset to the maximum value (S33). When the mass balance difference is greater than the lower limit set value at the above-mentioned S30, namely, when it lies between the lower limit set value and upper limit set value, the calculations are continued without changing the estimation nick time width (dt).

After the step of S29, S30, S32, or S33, the operation returns to S25 so as to effect calculation again, and this process is repeated till the aimed time is attained.

When the fluctuation in mass balance exceeds the range of ±5% at S27, on the other hand, the mass balance fluctuation is so much that calculation is preferably effected with an estimation nick time width (dt) shorter than that in the case where the fluctuation is within the range of ±5%. Accordingly, the calculation is stopped once (S34), the lower limit set value is reset to a lower level (S35), and then the operation returns to the step of S23.

Thus, when the estimation nick time width is variably set without being held constant, while monitoring the mass balance fluctuation, Fugacity can be computed accurately and efficiently.

(iii) Computation of Temporal Concentration in Indoor Air and Floor Residual Amount (S4)

The temporal concentration of the compound in the indoor air is computed when Fugacity ($f_i$) of the large, medium, and small particles 2, 8, and 3, determined by the above-mentioned item (ii), multiplied by their Fugacity capacity ($Z_i$), and Fugacity ($f_4$) of the air 4 multiplied by Fugacity capacity ($Z_4$) of the air 4 are summed up. Here, the large particles 2 or medium particles 8 may not be inhaled by a human body depending on the kind of chemical. In such a case, calculation is effected by use of Fugacity ($f_3$) of the small particles 3 alone, for example.

The floor residual amount of the compound is computed when Fugacity ($f_5$) of the floor 5 is multiplied by Fugacity capacity ($Z_5$) of the floor 5.

(iv) Calculation of Estimated Exposure Amount in Inhalation and Inhalation Safety Coefficient (S6 and S7)

The above-mentioned temporal concentration in the indoor air forms a curve shown in FIG. 3A, for example. This concentration curve is integrated, an accumulated concentration of the compound during a specific period ($t_1$ to $t_2$) is determined (see FIG. 3B), and the mean concentration in the indoor air is computed from thus determined value. While an arbitrary period is set as the specific period depending on the object, an appropriate period is usually set in view of the method of use of the product and the test period of toxicity data.

Then, according to the above-mentioned mean concentration in the indoor air, amount of respiration, and exposure time, the estimated exposure amount in inhalation is determined. Namely, calculation of:

estimated exposure amount in inhalation [mg/kg/day]=mean concentration in indoor air [mg/m$^3$]×amount of respiration [m$^3$/kg/min]×exposure time [min/day]

is effected. Here, as the above-mentioned amount of respiration, a published value or actually measured value may be used. Also, when amounts of respiration are respectively set for adult and child, more appropriate estimated exposure amounts in inhalation can be obtained. In the case where the inhaled harmful material is not totally absorbed into the body but is partially discharged by respiration, a more appropriate estimated exposure amount in inhalation can be obtained when the inhalation ratio is taken into account.

The inhalation safety coefficient is computed from a non-influential amount concerning inhalation toxicity examined by an animal experiment beforehand and the estimated exposure amount in inhalation determined above. Namely, it is expressed as:

inhalation safety coefficient=inhalation non-influential amount [mg/kg/day]/estimated exposure amount in inhalation [mg/kg/day]

(v) Calculation of Estimated Percutaneous Exposure Amount and Percutaneous Safety Coefficient (S9 and S11)

The above-mentioned floor residual amount forms a curve such as that shown in FIG. 4A, for example. This residual amount curve is integrated, the accumulated residual amount of the compound during a specific period ($t_1$ to $t_2$) is determined (see FIG. 4B), and the mean residual amount is computed from thus determined value. While an arbitrary period is set as the specific period depending on the object, an appropriate period is usually set in view of the method of use of the product and the test period of toxicity data.

Then, according to the mean floor residual amount, skin attachment ratio, contact area, and body weight, the estimated percutaneous exposure amount is determined. Namely, calculation of:

> estimated percutaneous exposure amount [mg/kg/day]=(mean floor residual amount [mg/m$^2$]×skin attachment ratio [%]×contact area [m$^2$/day])/body weight [kg]

is effected. Here, as the contact area, a published value (e.g., 4 [m$^2$/day]) may be used. The skin attachment ratio is a ratio of the compound attaching to the skin when the latter is in contact with the floor 5 where the compound exists. As this value, a published value or a value experimentally obtained from a model may be used.

A model experiment method for the skin attachment ratio is as follows. A weight (8 cm×8 cm×8 cm; 4.2 kg) is placed on a denim cloth (8 cm×10 cm) with a pressure similar to that of an infant in contact with a floor, and the denim cloth is pulled on the floor at a speed (120 cm/15 sec) similar to the moving speed of the infant. The denim and floor are analyzed so as to compute the compound contained in the denim and floor. From the ratio therebetween, the skin attachment ratio is obtained. It has been confirmed that the skin attachment ratio obtained by this method is identical to or slightly higher than that determined from analyzed values of a hand and a floor when the hand is actually pressed against the floor, thereby proving this model experiment method to be useful for evaluating exposure of inhabitants.

The percutaneous safety coefficient is computed from the non-influential amount concerning percutaneous toxicity examined by an animal experiment beforehand and the estimated percutaneous exposure amount determined above. Namely, it is expressed as:

> percutaneous safety coefficient=percutaneous non-influential amount [mg/kg/day]/estimated percutaneous exposure amount [mg/kg/day]

Nevertheless, in general, percutaneous non-influential amount has not often been determined, and there are not many published values. Accordingly, a more accurate value can be determined from the estimated percutaneous exposure amount, and oral non-influential amount and percutaneous absorption ratio for which many published values exist, according to the following expression:

> percutaneous safety coefficient=oral non-influential amount [mg/kg/day]/(estimated percutaneous exposure amount [mg/kg/day]×percutaneous absorption ratio [%])

Here, when the percutaneous absorption ratio is unknown, employed is a national guideline (e.g., 10%) which usually exists.

(vi) Calculation of Estimated Oral Exposure Amount and Oral Safety Coefficient (S13 and S14)

From the estimated percutaneous exposure amount obtained in the above-mentioned item (v), hand surface area ratio, and oral transference ratio, the estimated oral exposure amount from hand to mouth is determined. Namely, calculation of:

> estimated oral exposure amount (mg/kg/day]=estimated percutaneous exposure amount [mg/kg/day]×hand surface area ratio [%]×oral transference ratio [%]

is effected. Here, the hand surface area ratio is expressed by (hand surface area/body surface area), for which a published value (e.g., 5[%]) may be used. The oral transference ratio is a hypothetical value, which is set to 100%, for example.

In the case where oral exposure might occur via tableware or food contaminated with the residually sprayed compound, it is required that the estimated oral exposure amount from tableware or food to mouth be added to the estimated oral exposure amount from hand to mouth to yield the total estimated oral exposure amount. For example, the estimated oral exposure amount from tableware is obtained when, according to the tableware residual amount indicating the amount of the harmful material remaining in tableware, tableware use area which is the sum of tableware surface areas, and oral transference ratio from tableware, calculation of:

> estimated oral exposure amount [mg/kg/day]=tableware residual amount [mg/m$^2$]×tableware use area [m$^2$/day]×oral transference ratio [%]/body weight [kg]

is effected. Here, the tableware residual amount is expressed by (mean floor residual amount×tableware contamination ratio). As the tableware contamination ratio, an actually measured value (e.g., 9%) or a hypothetical value may be used.

The oral safety coefficient is computed from the non-influential amount concerning oral toxicity examined by an animal experiment beforehand and the estimated oral exposure amount determined above. Namely, it is expressed as:

> oral safety coefficient=oral non-influential amount [mg/kg/day]/estimated oral exposure amount [mg/kg/day]

As mentioned in the foregoing, in the method of estimating an indoor behavior of a pesticidal compound in this embodiment, when a chemical containing the above-mentioned compound is spatially sprayed, differential equations concerning Fugacity of the large, medium, and small particles 2, 8, and 3, air 4, floor 5, wall 6, and ceiling 7 are simultaneously formed and are solved, and the indoor behavior of the compound is estimated according to thus obtained solution. Here, the estimation nick time width is variably set, while constantly confirming mass balance of the compound indoors after the spraying, so that the amount of input of the chemical indoors and the resulting solution coincide with each other.

Accordingly, since mass balance of the compound after the spraying is always monitored such that the amount of input of the compound indoors and the resulting solution coincide with each other, thereby varying the estimation nick time width; the estimation nick time width is set longer when the mass balance fluctuates a little, whereas it is set shorter when the mass balance starts fluctuating greatly. Namely, when solving simultaneous differential equations including a parameter accompanying temporal change, the estimation nick time width is automatically set in response to the fluctuation in mass balance. Consequently, when processed by a computer, an accurate solution can be obtained in a short time.

The method of evaluating safety of a pesticidal compound in accordance with this embodiment uses the estimated result mentioned above to evaluate the safety of the compound with respect to the human body when the chemical is spatially sprayed.

Accordingly, the safety of the compound with respect to the human body can be evaluated accurately in a short time. As a consequence, when formulating a chemical such as insecticide containing the compound, simulation can be easily repeated while changing conditions, thereby making it easier to formulate a chemical having a high safety conforming to the aimed object.

Though the kind of the floor 5 is assumed to be tatami in this embodiment, differential equations similar to those mentioned above may also be formed in the case of flooring. In this case, however, when determining fugacity capacity ($Z_5$) of the floor 5 in equation (31), it is necessary for the particle-constituting solvent component content (see Table 18) to be changed from that of tatami to that of flooring.

Though Fugacity is determined by use of Runge-Kutta-Gill method in this embodiment, other methods may be used for solving differential equations. Runge-Kutta-Gill method, however, is preferably used since a program for the above-mentioned differential equations can be easily made by Basic. Also in the case where differential equations are solved by a method other than Runge-Kutta-Gill method, similar effects can be obtained when the estimation nick time width is set as mentioned above.

In the following, examples (Examples 6 to 10) of the method of simulating an indoor behavior of a pesticidal compound in accordance with the third embodiment will be explained.

The evaluation of the method of estimating an indoor behavior of a pesticidal compound in these examples is effected, under various experimental conditions (Example 6 to Example 10), as the results obtained by estimation and the actually measured values obtained by measurement of the actual indoor behavior of the compound are compared with each other. The respective experimental conditions of Examples are as follows.

Example 6 uses, as the spatially sprayed chemical, an oil-based insecticide containing pyrethroid. The indoor environment is a typical apartment room (3.6 [m]×3.6 [m]×2.4 [m]) in Japan. The floor is a flooring in which a wooden floor is covered with a polyurethane resin, whereas the wall and ceiling are covered with a polychlorovinyl wallpaper. The windows are completely closed during and after the spatial spraying. The spatial spraying is uniformly effected for 10 seconds at a height of 1.6 [m] from the floor. The other conditions are shown in Tables 16 to 20.

The conditions of Example 7 are the same as those of Example 6 except that its ventilation rate is 0.5 [1/hour].

The conditions of Example 8 are the same as those of Example 6 except that its ventilation rate is 4.1 (1/hour].

The conditions of Example 9 are the same as those of Example 6 except that the windows are opened for only 5 minutes after 5 minutes from the spraying.

The conditions of Example 10 are the same as those of Example 6 except that the windows are opened for only 2 hours after 5 minutes from the spraying.

FIGS. 12A and 12B show the simulation results and actually measured values of the compound concentration in the air under the respective conditions of the above-mentioned Examples. Also, FIG. 12C shows the simulation results of the residual amounts in floor and ceiling in Example 6. In these charts, solid lines, dotted lines, and dashed lines indicate simulation results, whereas plotted points indicate actually measured values.

From the above-mentioned results, it can be seen that the estimated results according to the method of simulating an indoor behavior of the compound in accordance with the present invention are very close to the actually measured values.

(4) Fourth Embodiment

With reference to the drawings, the fourth embodiment of the present invention will be explained in the following. The method of simulating an indoor behavior of a pesticidal compound in accordance with this embodiment estimates the behavior of the compound in the case where the floor in the third embodiment is constituted by a rug having ears of fiber. For convenience of explanation, members identical to those shown in the drawings of the above-mentioned third embodiment will be referred to with numerals or letters identical thereto, without their explanations provided. Explained here is a case where the kind of floor is a carpet. Accordingly, only the portion different from the third embodiment will be explained.

First, the carpet is modeled as shown in FIGS. 13A, 13B, and 13C. Namely, the carpet is divided into a plurality of carpet fibers (ears of fiber) planted on a substrate and space portions existing between the fibers. When a chemical is spatially sprayed in a room in which such a carpet covers the whole floor surface, as particles fall on the carpet, the chemical infiltrates into the carpet fiber and accumulates in the space portion.

While the method of simulating an indoor behavior of a pesticidal compound in accordance with this embodiment also conforms to the flowchart of FIG. 1, at S1, as the primary condition, the carpet-related primary condition shown in Table 23 is added to the primary condition of the third embodiment (see Tables 16 to 20). Here, the cross-sectional area ($A_c$) of the space portion of the carpet refers to the area in which the space portion is in contact with the indoor air (see FIGS. 13A, 13B, and 13C).

TABLE 23

| CARPET-RELATED PRIMARY CONDITION | SYMBOL | EXAMPLE OF VALUE |
|---|---|---|
| CARPET | | |
| CROSS - SECTIONAL AREA OF SPACE PORTION OF CARPET | $A_c$ | $1.6 \times 10^{-3}$ [m²/m² FLOOR] |
| AREA IN WHICH CARPET FIBER IS IN CONTACT WITH COMPOUND IN SPACE PORTION | $A_{c5}$ | 0.192 [m²/m² FLOOR] |
| AREA IN WHICH CARPET FIBER IS IN CONTACT WITH COMPOUND PRODUCT PROPERTY | $A_{a5}$ | 1.19 [m²/m² FLOOR] |
| CONTENT OF SOLVENT (XYLENE) CONTAINED IN PRODUCT | $C_{sd}$ | |
| DILUTION OF PRODUCT | $X_{sol}$ | |

The examples of values in Table 23 are based on the values shown in FIGS. 13A, 13B, and 13C. Here, one space portion is set to a size of 0.1 [mm]×0.1 [mm]×3 [mm], and one square of carpet fiber is set to a size of 2.5 [mm]×2.5 [mm]×3 [mm]. Also, it is assumed that 16 [pieces] of carpet fiber exist in 1 [cm²].

In this case, the individual parameters can be determined as:

$$A_c = (0.1 \text{ [mm]} \times 0.1 \text{ [mm]} \times 16 \text{ [pieces]})/1 \text{ [cm]}$$
$$= 1.6 \times 10^{-3} \text{ [m}^2\text{/m}^2 \text{ floor]}$$
$$A_{c5} = (0.1 \text{ [mm]} \times 3 \text{ [mm]} \times 4 \text{ [faces]} \times 16 \text{ [pieces]})/1 \text{ [cm]}$$
$$= 0.192 \text{ [m}^2\text{/m}^2 \text{ floor]}$$
$$A_5 = 1 - A_c$$
$$= 1 - 1.6 \times 10^{-3} \text{ [m}^2\text{/m}^2 \text{ floor]}$$
$$A_{a5} = A_5 + A_{c5}$$
$$= 1.19 \text{ [m}^2\text{/m}^2 \text{ floor]}$$

Here, $A_5$ is the area in which the carpet fibers in 1 [m²] are in contact with the indoor air.

As the secondary condition at S2, the carpet-related secondary condition shown in Table 24 is added to the secondary condition of the third embodiment. Here, $k_5$ and $V_5$, which are respectively transference speed of the compound in the floor and the volume of the floor in the third embodiment (see Table 22), are respectively replaced by the transference speed of the compound in the carpet fiber and the volume of the whole fiber of the carpet.

TABLE 24

| CARPET - RELATED SECONDARY CONDITION | SYMBOL |
|---|---|
| DEFINITE FACTOR CONDITION | |
| EVAPORATION CONSTANT OF CHEMICAL IN SPACE PORTION | $R_d$ |
| HUMIDITY AT TEMPERATURE ($T_d$) OF SPACE PORTION | $H_m$ |
| VOLUME OF WHOLE FIBER OF CARPET | $V_5$ |
| TRANSFERENCE SPEED OF COMPOUND IN PRODUCT | $k_c$ |
| PROPERTY CHANGE CONSTANT OF PRODUCT | a |
| TEMPORAL CHANGE CONDITION | |
| TRANSFERENCE COEFFICIENT OF COMPOUND BETWEEN CHEMICAL IN SPACE PORTION AND AIR | $D_{c4}$ |
| TRANSFERENCE COEFFICIENT OF COMPOUND BETWEEN CHEMICAL IN SPACE PORTION AND CARPET FIBER | $D_{c5}$ |
| VOLUME OF CHEMICAL IN SPACE PORTION | $V_c$ |
| FUGACITY CAPACITY OF CHEMICAL IN SPACE PORTION | $Z_c$ |

A method of computing the definite factor conditions and temporal change conditions shown in the above-mentioned Table 24 will be explained hereinafter as exemplified by the case using an aqueous aerosol, i.e., case where the particle-constituting solvent is water.

From the cross-sectional area ($A_c$) of the space portion, room temperature (T), and humidity (H), the evaporation constant ($R_d$) of the chemical entered into the space portion of the carpet is expressed as:

$$R_d = A_c h (H_m - H) / C_H$$

$$C_H = 0.24 + 0.46H$$

$$h = 3.06 \times 10^{-4} (T - T_d)^{1/3} \quad (46)$$

wherein $T_d$ is the temperature of the space portion of the carpet (corresponding to the wet-bulb temperature), and $H_m$ is the humidity (corresponding to the saturated humidity at the wet-bulb temperature) of the space portion at $T_d$. Here, $T_d$ and $H_m$ can be determined from the above-mentioned "mass-based humidity table" according to the room temperature (T) and humidity (H). In the case of an oil-based product (aerosol), while the vapor constant of the chemical can be computed when properties of the water and oil are compared with each other and then are multiplied by $R_d$, $R_d = 0$ may be assumed in the case where the evaporation of the oil is slow.

From the diffusion coefficient ($D_c$) and the area ($A_{a5}$) in which the carpet fiber is in contact with the compound, the volume ($V_5$) of the whole fiber of the carpet is determined as:

$$V_5 = 2\sqrt{D_{ct}} A_{a5} \quad (47)$$

The transference speed ($k_c$) of the compound in the product is expressed as $k_4/100$ by use of $k_4$ ($=GV_4/A_4$) which indicates the transference speed of the compound in the indoor air.

From the above-mentioned transference speed ($k_c$) of the compound in the product, transference speed ($k_4$) of the compound in the indoor air, floor size ($L_4 \times W_4$), cross-sectional area ($A_c$) of the space portion, Fugacity capacity ($Z_c$) of the chemical in the space portion determined by expression (50) which will be mentioned later, and Fugacity capacity ($Z_4$) of the air determined by expression (30) of the third embodiment, the transference coefficient ($D_{c4}$) of the compound between the chemical in the space portion of the carpet and the air is expressed as:

$$D_{c4} = \frac{1}{1/(k_c A_c L_4 W_4 Z_c) + 1/(k_4 A_c L_4 W_4 Z_4)} \quad (48)$$

From the transference speed ($k_c$) of the compound in the product, diffusion coefficient ($D_c$), floor size ($L_4 \times W_4$), area ($A_{c5}$) in which the carpet fiber is in contact with the compound in the space portion, Fugacity capacity ($Z_c$) of the chemical in the space portion, and Fugacity capacity ($Z_5$) of the floor determined by expression (31) of the third embodiment, the transference coefficient ($D_{c5}$) of the compound between the chemical in the space portion and the carpet fiber is expressed as:

$$D_{c5} = \frac{1}{1/(k_c A_{c5} L_4 W_4 Z_c) + 1/(k_5 A_{c5} L_4 W_4 Z_5)} \quad (49)$$

wherein the transference speed ($k_5$) of the compound within the carpet fiber is expressed as $(D_c/t)^{0.5}$.

The volume ($V_c$) of the chemical in the space portion is determined from the floor size ($L_4 \times W_4$), spray rate, content ($C_{ad}$) of the solvent (Xylene) contained in the product, dilution ($X_{sol}$) of the product, and evaporation constant ($R_d$) of the chemical in the space portion determined by expression (46).

From the vapor pressure ($P^s$), water solubility ($C^s$), and octanol/water distribution coefficient ($K_{ow}$) of the compound, and property change constant (a) of the product, Fugacity capacity ($Z_c$) of the chemical in the space portion is expressed as:

$$Z_c = (e^{-at} K_{OW} + 1 - e^{-at}) C^s / P^s \quad (50)$$

Here, the property change constant (a) of the product can be computed according to the evaporation constant ($R_d$) of the chemical in the space portion determined by expression (46), content ($C_{sd}$) of the solvent (Xylene) contained in the product, and dilution ($X_{sol}$) of the product. Namely, Fugacity capacity ($Z_c$) of the chemical in the space portion is also expressed as:

$$Z_c = [(\text{ratio of organic solvent in product}) K_{ow} + (\text{ratio of water in product})] \times C^s / P^s$$

By simultaneously forming this expression and the above-mentioned expression (50), the property change constant (a) of the product is computed. Here, in the case of the oil-based product (aerosol), Fugacity capacity ($Z_c$) of the chemical in the space portion is given by expression (31) of the third embodiment from the vapor pressure ($P^s$), water solubility ($C^s$), and octanol/water distribution coefficient ($K_{ow}$) of the compound.

Consequently, the behavior of the compound in the space portion of the carpet is expressed in the form of differential equation concerning Fugacity ($f_c$) as:

$$\frac{df_c}{dt} V_c Z_c = \gamma_5 \sum_{i=2,8,3} n_i v_i A_c V_i Z_i f_i / L_{zi} + \text{Deposition}(i) \quad (51)$$

F-change  $R_d L_4 W_4 Z_c f_c -$      V-change $D_{c4}(f_c - f_4) -$      Transference(4)

$D_{c5}(f_c - f_5) -$      Transference(5)

$K_c V_c Z_c f_c$      Degradation

Also, expressions (42) and (41) in the third embodiment are respectively replaced by:

$$\frac{df_5}{dt} V_5 Z_5 = \sqrt{D_c/t} A_{a5} Z_5 f_5 + \quad V\text{-change} \quad (52)$$

F-change $\gamma_5 (1 - A_c) \frac{n_{0i}}{L_{zi}} v_i V_i Z_i f_i -$      Deposition(i)

$D_{c5}(f_5 - f_c) -$      Transference(c)

$D_{45}(f_5 - f_4) -$      Transference(4)

$K_5 V_5 Z_5 f_5$      Degradation $$\frac{df_4}{dt} V_4 Z_4 = -G V_4 Z_4 f_4 - \quad \text{Ventilation} \quad (53)$$

F-change $\sum_{i=2,8,3} n_i D_{i4}(f_4 - f_i) -$      Transference(i)

$\sum_{j=5}^{7} D_{4j}(f_4 - f_j) -$      Transference(j)

$K_4 V_4 Z_4 f_4 -$      Degradation $D_{4c}(f_4 - f_c)$      Transference(c)

In expression (52), terms of V-change, Deposition (i), Transference (c), Transference (4), and Degradation respectively indicate the change in volume (increase over time) of the carpet fiber, attachment accompanying the falling of particles, amount of transference of the compound between the carpet fiber and the space portion, amount of transference of the compound between the carpet fiber and the air, and change in amount of photodegradation of the compound.

In expression (53), terms of Ventilation, Transference (i), Transference (j), Degradation, and Transference (c) respectively indicate the amount of discharge of the compound outdoors, amount of transference of the compound between the air and the particles, amount of transference of the compound between the air and the floor (carpet fiber)/ceiling/wall, change in amount of photodegradation of the compound, and amount of transference of the compound between the air and the space portion.

Accordingly, Fugacity calculation at S3 is performed such that eight kinds of differential equations of expressions (40), (43), and (44) in the third embodiment and the above-mentioned expressions (51) to (53) are solved by Runge-Kutta-Gill method. The subsequent steps of S4 to S17 are similar to those in the third embodiment.

As explained in the foregoing, in the method of estimating an indoor behavior of a pesticidal compound in accordance with this embodiment, in the case where the kind of floor is a carpet having ears of fiber and a space portion between the ears, a differential equation for Fugacity in the above-mentioned space portion of the carpet is added to seven kinds of simultaneous differential equations concerning Fugacity in the three kinds of large, medium, and small particles, indoor air, floor (carpet fiber), ceiling, and wall, so as to calculate each Fugacity.

Consequently, even in the case where the chemical is accumulated in the space portion, so that the compound behaves differently from the case with a flat floor, the behavior of the compound can be estimated accurately, whereby various kinds of simulations can be performed.

(5) Fifth Embodiment

With reference to the drawings, the fifth embodiment of the present invention will be explained in the following.

The method of simulating an indoor behavior of a pesticidal compound (hereinafter simply referred to as compound) contained in a chemical (solution) such as insecticide in accordance with this embodiment estimates, for example, the behavior of the compound in the case where the chemical is heated to vaporize by use of an electric heating vaporizer such as electronic mosquito repellent in order to terminate indoor vermin. Here, the chemical encompasses all kinds of insecticides including pyrethroid insecticidal compounds and organophosphorus insecticidal compounds.

Figure 15:
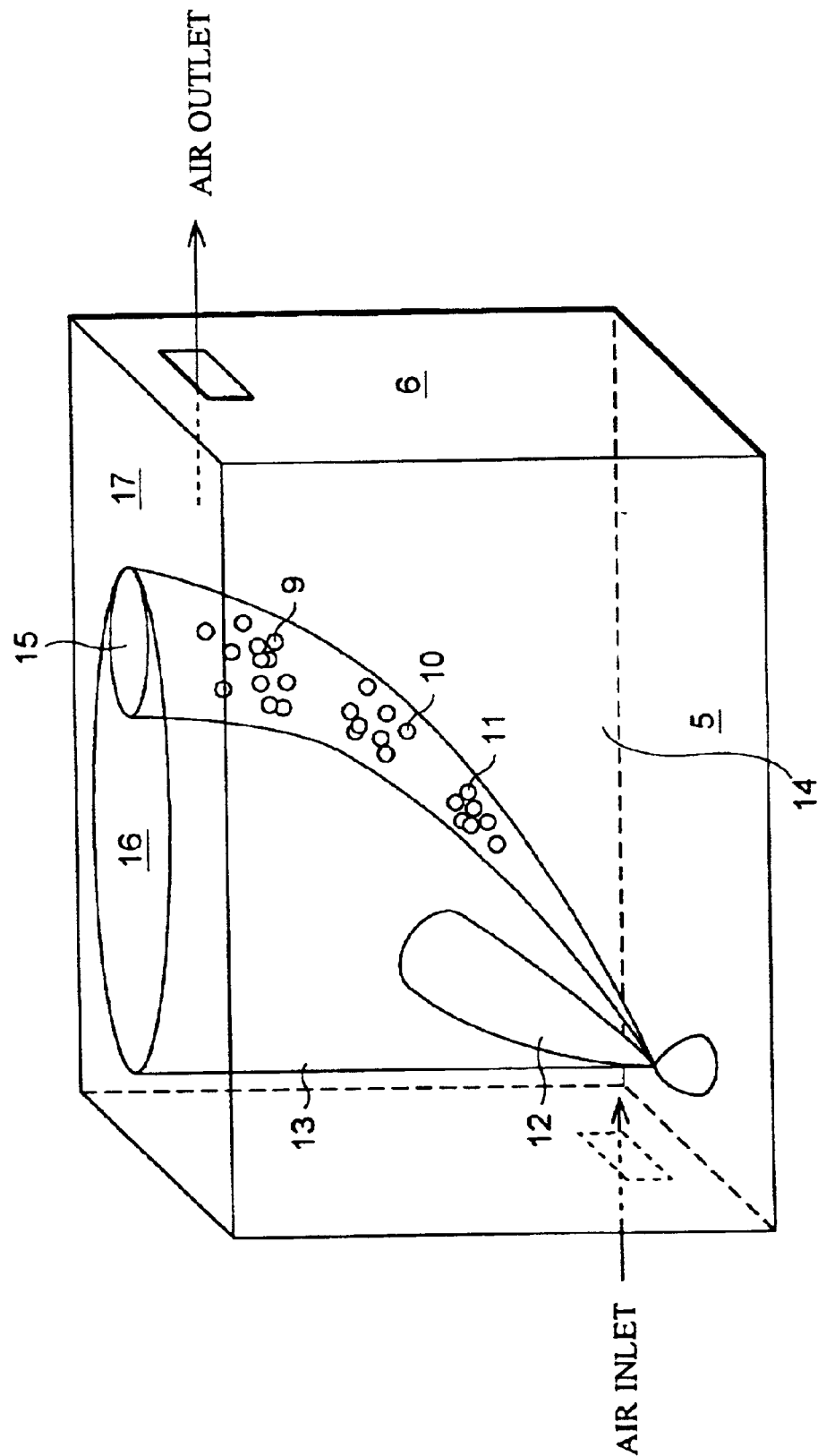
FIG. 15 is an explanatory view showing a modeled state of indoor environment in the case where an indoor behavior of a compound is estimated in the fifth embodiment of the present invention.

First, as shown in FIG. 15, an environment is classified into 11 kinds of media consisting of 3 kinds of condensed particles 9, 10, and 11, high-concentration air 12, medium-concentration air 13, low-concentration air 14, floor 5, wall 6, high-concentration ceiling 15, medium-concentration ceiling 16, and low-concentration ceiling 17.

Namely, in the case where the chemical is vaporized, though the whole compound is initially evaporated as complete vapor (high-concentration air 12), the condensed particles 9, 10, and 11 are successively formed when the emission rate of the compound ($E_T$) in the medium-concentration air 13 exceeds the saturated amount of the compound in the vapor. These condensed particles 9, 10, and 11 are divided into three kinds depending on the time between the occurrence and extinction of particles. The indoor air other than the above-mentioned high-concentration air 12 and medium-concentration air 13, which is mainly respired by humans, is defined as the low-concentration air 14. The high-concentration ceiling 15 is a ceiling portion into which the condensed particles 9, 10, and 11 are absorbed; the medium-concentration ceiling 16 is a ceiling portion in contact with the medium-concentration air 13, and the low-concentration ceiling 17 is a ceiling portion in contact with the low-concentration air 14.

Simultaneous differential equations concerning Fugacity of the compound in the above-mentioned 11 kinds of media are formed and are solved by Runge-Kutta-Gill method, whereby the indoor behavior of the compound in the chemical when the chemical is heated and vaporized, i.e., temporal change in compound distribution in the room, is estimated and analyzed.

Here, since the floor 5 mainly comprises three kinds, i.e., tatami, flooring, and carpet (rug), the differential equation is formed so as to correspond to the kind of floor. Explained in this embodiment is the case where the floor 5 is made of tatami.

With reference to FIG. 1, a method of simulating an indoor behavior of the compound will be explained. The simulation method in accordance with this embodiment can be mainly divided into a step of dividing an indoor environment into predetermined media and forming a differential equation concerning a fugacity of the compound in each medium (S1 to S2); a step of determining the fugacity of the compound in each medium from the differential equation (S3); a step of determining the indoor behavior of the compound from the fugacity of the compound in each medium (S4); a step of changing, in response to a fluctuation in mass balance of the compound indoors, a minute time unit used when solving the differential equation (S21 to S35, see FIG. 5); and a step of evaluating safety of the compound with respect to a human body according to the indoor behavior of the compound (S5 to S17).

First, at step (hereinafter abridged as S) 1, a primary condition is inputted. The primary condition comprises physicochemical properties of the compound (see Table 25), indoor environmental behavior properties of the compound (see Table 26), indoor environment (see Table 27), and product properties (see Table 28).

TABLE 25

| PHYSICOCHEMICAL PROPERTY OF COMPOUND | SYMBOL | EXAMPLE OF VALUE |
|---|---|---|
| MOLECULAR WEIGHT | $M_a$ | 302.41 [g/mole] |
| SPECIFIC GRAVITY | $\rho$ | $1.5 \times 10^6$ [g/m$^3$] |
| VAPOR PRESSURE | $P^S$ | $9.53 \times 10^{-3}$ [Pa] |
| WATER SOLUBILITY | $C^S$ | $1.42 \times 10^{-2}$ [mole/m$^3$] |
| OCTANOL/WATER DISTRIBUTION COEFFICIENT | $K_{OW}$ | $10^{4.78}$ |
| MELTING POINT | $T_M$ | 323 [K] |

TABLE 26

| INDOOR ENVIRONMENTAL BEHAVIOR PROPERTY OF COMPOUND | SYMBOL | EXAMPLE OF VALUE |
|---|---|---|
| HALF-LIFE OF DEGRADATION BY LIGHT/OXIDATION | | |
| IN CONDENSED PARTICLE | $\tau_i$ (i = 9,10,11) | $1.08 \times 10^4$ [sec] |
| AIR | $\tau_j$ (j = 12, 13,14) | $1.08 \times 10^4$ [sec] |
| FLOOR/WALL/CEILING | $\tau_k$ k = 5, 6,15,16, 17) | $8.64 \times 10^5$ [sec] |

TABLE 26-continued

| INDOOR ENVIRONMENTAL BEHAVIOR PROPERTY OF COMPOUND | SYMBOL | EXAMPLE OF VALUE |
|---|---|---|
| HALF-LIFE OF TRANSFERENCE TO AIR | | |
| IN FLOOR | $\tau_{jk}$ (j = 14, k = 5) | $3.71 \times 10^5$ [sec] |
| CEILING | $\tau_{jk}$ (j = 13, 14, k = 15, 16,17) | $4.45 \times 10^5$ [sec] |

TABLE 27

| | INDOOR ENVIRONMENT | SYMBOL | EXAMPLE OF VALUE |
|---|---|---|---|
| OIL BASE | ROOM SIZE | $V_4$ | 23.3 [m$^3$] |
| | FLOOR AREA | $L_4 \times W_4$ | 9.7 [m$^2$] |
| | TEMPERATURE | T | 298 [K] |
| | RELATIVE HUMIDITY | $\phi$ | 60 [% RH] |
| | ABSOLUTE HUMIDITY | H | $1.19 \times 10^{-2}$ [kg-H$_2$O/ kg-dry air] |
| | VENTILATION RATE | G | 0.58 [1/h] |
| | INDOOR VAPOR PRESSURE IN PARTICLE - CONSTITUTING SOLUENT | $P\infty$ | 0 [Pa] |
| | AIR DIFFUSION COEFFICIENT | $D_{air}$ | $8.64 \times 10^{-2}$ [m$^2$/h] |
| | OIL COMPONENT CONTENT | — | 0.46 (IN CASE OF TATAMI) 0.04 (IN CASE OF FLOORING) 0.04 (IN CASE OF CARPET) |
| WATER BASE | WET - BULB TEMPERATURE | $T_d$ | 292.5 [K] |
| | VAPOR PRESSURE OF WATER | $P\infty$ | $1.89 \times 10^3$ [Pa] |

TABLE 28

| | PRODUCT PROPERTY | SYMBOL | EXAMPLE OF VALUE |
|---|---|---|---|
| OIL BASE | COMPOUND CONTENT | $R_a$ | $1.94 \times 10^{-2}$ [v/v] |
| | EMISSION RATE | $E_T$ | $7.36 \times 10^{-7}$ [g/sec] |
| | CONDENSATION RATIO | $C_r$ | 0.98 |
| | PARTICLE-CONSTITUTING SOLVENT PROPERTY | | |
| | VAPOR PRESSURE | $P_d$ | 1.77 [Pa] |
| | MOLECULAR WEIGHT | $M_d$ | 198.39 [g/mole] |
| | SPECIFIC GRAVITY | $\rho_d$ | $7.56 \times 10^5$ [g/m$^3$] |
| | DIAMETER OF CONDENSED PARTICLE | $d_0$ | 3.5 [$\mu$m] |
| | VOLUME OF HIGH - CONCENTRATION AIR | $V_{12}$ | 2 [m$^3$] |
| | VOLUME OF MEDIUM - CONCENTRATION AIR | $V_{13}$ | 3 [m$^3$] |
| | VOLUME OF LOW - CONCENTRATION AIR | $V_{14}$ | 18.3 [m$^3$] |
| | CROSS - SECTIONAL AREA OF HIGH - CONCENTRATION AIR | $A_{12}$ | 1.2 [m$^2$] |
| | CROSS - SECTIONAL AREA OF MEDIUM - CONCENTRATION AIR | $A_{13}$ | 0.96 [m$^2$] |
| | CROSS - SECTIONAL AREA OF LOW - CONCENTRATION AIR | $A_{14}$ | 7.48 [m$^2$] |
| WATER BASE | PARTICLE-CONSTITUTING SOLVENT PROPERTY | | |
| | VAPOR PRESSURE | $P_d$ | $2.26 \times 10^3$ [Pa] |
| | MOLECULAR WEIGHT | $M_d$ | 18 [g/mole] |
| | SPECIFIC GRAVITY | $\rho_d$ | $1 \times 10^6$ [g/m$^3$] |

Here, $A_{12}$, $A_{13}$, and $A_{14}$ in Table 28 indicate cross-sectional areas of the respective airs 12, 13, and 14 with respect to the direction of movement of indoor air (arrow in FIG. 15).

Figure 16A:
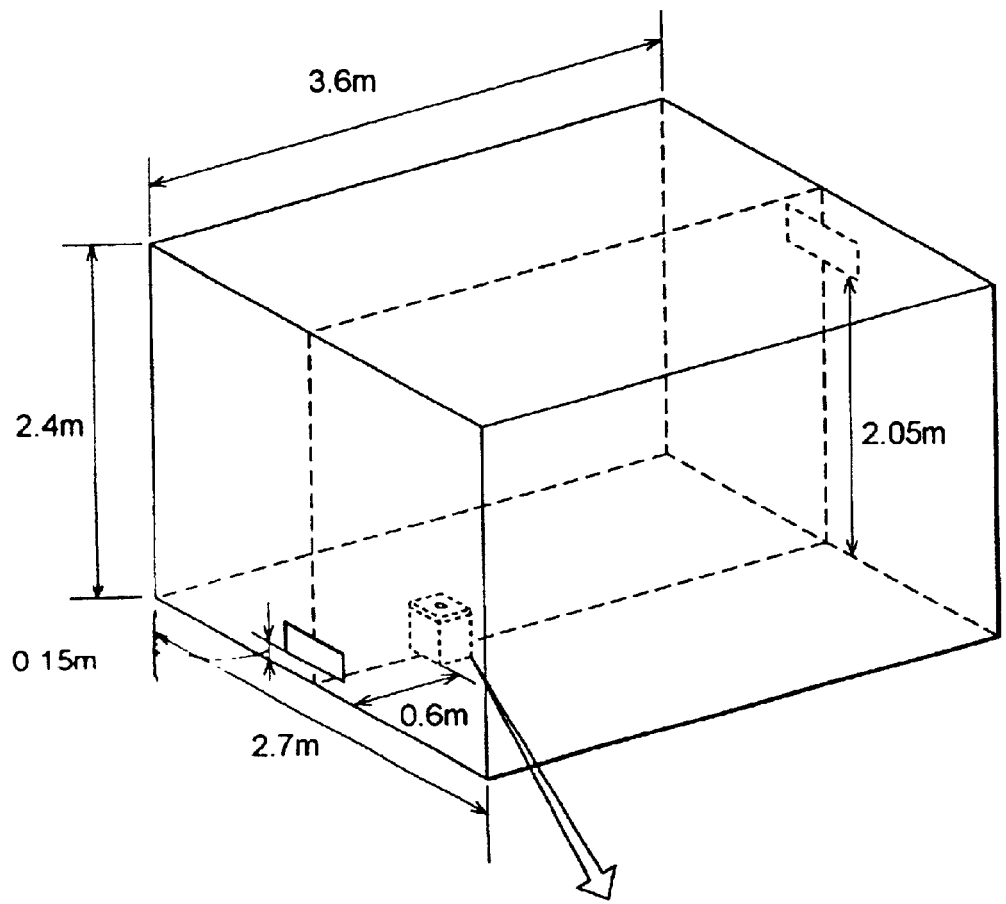
FIG. 16A is an explanatory view showing a modeled state of indoor environment in the case where an indoor behavior of the compound is estimated in the fifth embodiment of the present invention.
Figure 16B:
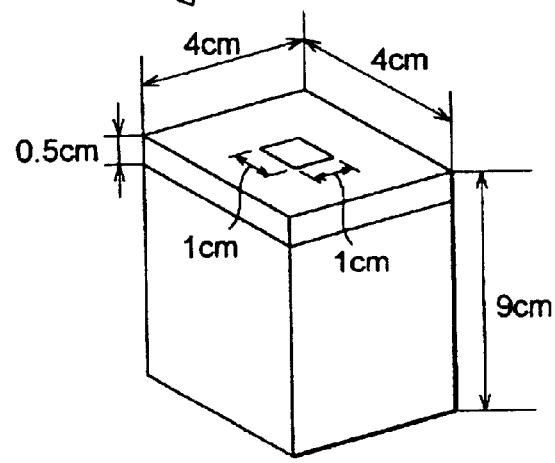
FIG. 16B is an enlarged view of an electric heating evaporator in the fifth embodiment of the present invention.

The examples of values in Tables 25 to 28 assume those of a six-mat room (9.72 [m$^2$]) of a typical apartment in Japan in summer, using an electric heating vaporizer employing an oil-based chemical (see FIGS. 16A and 16B). The electric heating vaporizer comprises a core portion of 1 [cm]×1 [cm] (at a temperature of 405 [K]), a heater portion of 4 [cm]×4 [cm]×0.5 [cm] (at a temperature of 373 [K]), and a container in which a chemical is packed (at a temperature of 303 [K]). The example of value of compound content ($R_a$) in Table 28 indicates the volume of compound relative to the volume of particles immediately after condensation.

Subsequently, using the primary condition, a secondary condition is determined by calculation (S2). The secondary condition comprises a temporally unchangeable definite factor condition (see Table 29) determined by the primary condition alone and a temporal change condition accompanying a temporal change (see Table 30). Their calculations will be explained later in detail.

TABLE 29

| DEFINITE FACTOR CONDITION | SYMBOL |
|---|---|
| FLOATING NUMBER OF CONDENSED PARTICLES | $n_i$ (i = 9,10,11) |
| EVAPORATION CONSTANT OF CONDENSED PARTICLES | $\alpha$ |
| EMISSION AMOUNT OF CHEMICAL IN GAS STATE | $E_v$ |
| DIFFUSION COEFFICIENT OF COMPOUND IN AIR | $D_{ca}$ |
| SURFACE AREA OF FLOOR/WALL/CEILING | $A_k$ (k = 5,6,15,16,17) |
| DIFFUSION COEFFICIENT OF FLOOR/WALL/CEILING | $D_c$ |
| AIR VELOCITY | $V_f$ |
| FUGACITY CAPACITY | |
| OF CONDENSED PARTICLE | $Z_i$ (i = 9,10,11) |
| AIR | $Z_j$ (j = 12,13,14) |
| FLOOR/WALL/CEILING | $Z_k$ (k = 5,6,15,16,17) |
| DEGRADATION CONSTANT | |
| OF CONDENSED PARTICLE | $K_i$ (i = 9,10,11) |
| AIR | $K_j$ (j = 12,13,14) |
| FLOOR/WALL/CEILING | $K_k$ (k = 5,6,15,16,17) |

TABLE 30

| TEMPORAL CHANGE CONDITION | SYMBOL |
|---|---|
| CONDENSED PARTICLE DIAMETER | $d_i$ (i = 9,10,11) |
| TRANSFERENCE SPEED OF COMPOUND | |
| IN CONDENSED PARTICLE | $k_i$ (i = 9,10,11) |
| AIR | $k_j$ (j = 12,13,14) |
| FLOOR/WALL/CEILING | $k_k$ (k = 5,6,15,16,17) |
| TRANSFERENCE COEFFICIENT OF COMPOUND BETWEEN CONDENSED PARTICLE AND AIR | $D_{i13}$ (i = 9,10,11) |
| TRANSFERENCE COEFFICIENT OF COMPOUND BETWEEN AIR AND FLOOR/WALL/CEILING | $D_{jk}$ (j = 12,13,14, k = 5,6,15,16,17) |
| VOLUME OF CONDENSED PARTICLE | $V_i$ (i = 9,10,11) |
| VOLUME OF FLOOR/WALL/CEILING | $V_k$ (k = 5,6,15,16,17) |

Using the secondary condition, 11 kinds of Fugacity are calculated (S3). Namely, 11 kinds of differential equations concerning the 3 kinds of condensed particles 9, 10, and 11, 3 kinds of air 12, 13, and 14, floor 5, wall 6, and 3 kinds of ceilings 15, 16, and 17 are simultaneously formed and are solved by Runge-Kutta-Gill method, whereby 11 kinds of Fugacity are computed over time. Here, an estimation nick time width (minute time unit) set when solving the differential equations is automatically set so as to be varied in response to a fluctuation in mass balance of the compound.

At S4, using thus computed Fugacity ($f_{14}$) of the low-concentration air 14, temporal concentration of the compound in the air is computed; whereas temporal residual amounts of the compound on the floor 5 is computed by use of Fugacity ($f_5$) of the floor 5.

At S5, it is judged whether or not to perform safety evaluation in the case where the chemical is inhaled. If the safety evaluation in inhalation is to be performed, then an estimated exposure amount in inhalation indicating a degree of exposure upon inhalation of the contaminated air is computed by use of the above-mentioned temporal concentration in the indoor air (S6). Thereafter, an inhalation safety coefficient is computed according to the estimated exposure amount in inhalation (S7). At S8, the inhalation safety coefficient is compared with a reference value defined in each country. If the inhalation safety coefficient exceeds the reference value, it is judged that "there is no problem in safety." By contrast, if the inhalation safety coefficient is lower than the reference value at S8, it is judged that "there is a problem in safety", and the operation returns to S1, where alteration of the primary condition such as alteration of compound, alteration of chemical formulation, alternation of using condition, or the like is considered.

If the safety evaluation in inhalation is not selected at S5, calculated is an estimated amount of percutaneous exposure indicating to what extent the skin is exposed in contact with the floor 5 to which the chemical is attached (S9). Thereafter, at S10, it is judged whether to perform a percutaneous safety evaluation or not. If the percutaneous safety evaluation is to be performed, a percutaneous safety coefficient is computed according to the estimated percutaneous exposure amount (S11). At S12, as with the safety evaluation in inhalation, the percutaneous safety coefficient is compared with a reference value defined in each country, whereby the safety is evaluated. If there is a problem in safety at S12, the operation returns to S1, where alteration of the primary condition is considered.

If the percutaneous safety evaluation is not selected at S10, calculated at S13 according to the estimated percutaneous exposure amount is an estimated oral exposure amount indicating the degree of exposure in the case where the chemical attached to a hand or the like is taken orally (S13). Subsequently, according to the estimated oral exposure amount, an oral safety coefficient is computed (S14). This oral exposure may occur, in particular, when an infant puts a chemical-attached hand into the mouth. At S15, as with the safety evaluation in inhalation, the oral safety coefficient is compared with a reference value defined in each country, whereby the safety is evaluated. If there is a problem in safety at S15, the operation returns to S1, where alteration of the primary condition is considered.

Finally, if it is judged to be safe at S8, S12, or S15, overall safety is evaluated. Here, the sum of respective reciprocals of the previously determined inhalation safety coefficient, percutaneous safety coefficient, and oral safety coefficient is determined, and the reciprocal of thus determined value is defined as an overall safety coefficient (S16). This overall safety coefficient is compared with a reference value, whereby an evaluation similar to the previous safety evaluation is effected (S17).

In the following, the above-mentioned steps of S2 to S4, S6, S7, S9, S11, S13, and S14 will be explained in detail.

(i) Secondary Condition Calculation (S2)

Calculations of the definite factor condition shown in Table 29 and the temporal change condition shown in Table 30 will be explained.

The condensed particles 9, 10, and 11 are successively generated during time $t_1$ and are absorbed by the high-concentration ceiling 15. Specifically, the condensed particles 9 exist during the period of time $t_1/3$ after evaporation, the condensed particles 10 are generated after the lapse of time $t_1/3$, and the condensed particles 11 are generated after the lapse of time $2t_1/3$. Here, the floating number ($n_i$, i=9, 10, 11) of the condensed particles is constant from their generation till absorption, and is expressed, from the specific gravity ($\rho$) of the compound, compound content ($R_a$), emission rate ($E_T$), condensation ratio ($C_r$), and initial diameter ($d_0$) of condensed particles 9, 10, and 11, as follows:

$$n_i = \left(\frac{dn_T}{dt}\right)\frac{t_1}{3} \quad (54)$$

$$\frac{dn_T}{dt} = E_T C_r / \{(\frac{\pi}{6}d_0^3 R_a \rho) - G\}$$

wherein G is the ventilation rate.

According to surface temperature ($T_d$) of particles, properties of particle-constituting solvent (vapor pressure $P_d$, molecular weight $M_d$, and specific gravity $\rho_d$), and indoor environment (air diffusion coefficient $D_{air}$, vapor pressure $P^\infty$, and room temperature $T^\infty$), the evaporation constant ($\alpha$) of the condensed particles 9, 10, and 11 is defined as follows:

$$\alpha = \frac{4D_{air}M_d}{R\rho_d}\left(\frac{P_d}{T_d} - \frac{P\infty}{T\infty}\right) \quad (55)$$

wherein R is a gas constant.

Here, the upper parts of the above-mentioned Tables 27 and 28 exemplify the case where the heat-vaporized aerosol is of oil base. In this case, $T^\infty$ (temperature at the site far from particles) and $T_d$ are set to room temperature (T), whereas $P^\infty$ (vapor pressure of oil at the site far from particles) is set to zero.

In the case where the heat-vaporized aerosol is of water base, it is necessary for $P_d$, $M_d$, $\rho_d$, $T_d$, and $P^\infty$ in expression (55) to be changed to values based on properties of water. Specifically, the above-mentioned factor values when the room temperature (T) is 298 [K] (=25° C.) and the relative humidity is 60[% RH] are exemplified in the lower parts of Tables 27 and 28.

Here, $T_d$ can be determined, according to the room temperature (T) and relative humidity (H), from "mass-based humidity table" disclosed in "Kagaku Kikai no Riron to Keisan (Theory and Calculation of Chemical Machines)" (Second Edition) (Saburo Kamei ed., Sangyo Tosho) or the like. On the other hand, $P_d$ and $P^\infty$ can be computed from the following expressions:

$$\log_{10}P_d=10.23-1750/(T_d-38)$$

$$\log_{10}P^\infty=8.23-1750/(T-38)+\log_{10}\psi$$

wherein $\psi$ is an indoor relative humidity.

From the molecular weight ($M_a$) of the compound, emission rate ($E_T$), and condensation rate ($C_r$), the amount of emission of chemical ($E_v$) to the high-concentration air 12 is expressed as follows:

$$E_v = E_T(1-C_r)/M_a \quad (56)$$

The surface area ($A_k$, k=5, 6, 15, 16, 17) of each of the floor 5, wall 6, high-concentration ceiling 15, medium-concentration ceiling 16, and low-concentration ceiling 17 is determined by the room size ($V_4$) and floor area ($L_4 \times W_4$).

Using the room size ($V_4$), ventilation rate (G), and cross-sectional area ($A_{14}$) of the room with respect to the direction of movement of indoor air, the indoor air velocity ($V_f$) is determined as follows:

$$V_f = G\frac{V_4}{A_{14}} \quad (57)$$

From the vapor pressure ($P^s$) and melting point ($T_M$) of the compound and surface temperature ($T_d$) of particles, Fugacity capacity ($Z_i$, i=9, 10, 11) of the condensed particles 9, 10, and 11 is expressed as:

$$Z_i = \frac{6 \times 10^6}{P_L^s RT_d} \quad (58)$$

$$P_L^s = P^s\exp\{6.79(T_M/T_d - 1)\}$$

Though the vapor pressure of the compound in a liquid state ($P_L^s$) is computed by use of $T_M$ and $T_d$ here; in the case where $T_M$ cannot be obtained, $P_L^s$ may be set identical to the vapor pressure of the compound in a solid state ($P^s$).

From the room temperature (T), Fugacity capacity ($Z_j$, j=12, 13, 14) of the airs 12, 13, and 14 is expressed as follows:

$$Z_j \simeq \frac{1}{RT} \quad (59)$$

From the vapor pressure ($P^s$), water solubility ($C^s$), and octanol/water distribution coefficient ($K_{ow}$) of the compound, and from the oil component content ($\rho_k$, k=5, 6, 15, 16, 17) of the material constituting the floor 5, wall 6, and ceilings 15, 16, and 17, Fugacity capacity ($Z_k$, k=5, 6, 15, 16, 17) of the floor 5, wall 6, and ceilings 15, 16, and 17 is expressed as:

$$Z_k = \rho_k K_{ow} C^s / P^s \quad (60)$$

Mainly generated in the 11 kinds of media are degradation reactions caused by light and oxidation. The degradation constant ($K_i$, i=9, 10, 11) of the condensed particles 9, 10, and 11, degradation constant ($K_j$, j=12, 13, 14) of the airs 12, 13, and 14, and degradation constant ($K_k$, k=5, 6, 15, 16, 17) of the floor 5, wall 6, and ceilings 15, 16, and 17 are defined by use of the respective half-lives of degradation by light/oxidation ($\tau_i$), ($\tau_j$), and ($\tau_k$).

$$K_i = \frac{0.693}{\tau_i} \quad (61)$$

$$K_j = \frac{0.693}{\tau_j}$$

$$K_k = \frac{0.693}{\tau_k}$$

While $\tau_i$ and $\tau_k$ are often unavailable, $K_i$ and $K_k$ may be nullified in this case from the viewpoint of securing safety of inhabitants. When $\tau_j$ of the compound in the air is unavailable, it may be determined by use of Atmospheric Oxidation program (Atkinson et al., 1984, Chem. Rev. Vol. 84, pp. 437–470) from the structural formula of the compound.

Since the volume of particles decreases over time due to evaporation of the particle-constituting solvent component, during the evaporation of particle-constituting solvent component, using the diameter ($d_0$) of particles immediately after spraying (t=0) and the evaporation constant ($\alpha$) determined from expression (55), the diameter ($d_i$, i=9, 10, 11) of the condensed particles 9, 10, and 11 at time t is represented as:

$$d_i=\sqrt{d_0^2-2\alpha t} \tag{62}$$

From the diameter ($d_i$) of condensed particles 9, 10, and 11 determined by expression (62), indoor velocity ($v_f$) determined by expression (57), and Fugacity capacity ($Z_i$) of condensed particles 9, 10, and 11 determined by expression (58), and Fugacity capacity ($Z_{13}$) of the medium-concentration air 13 determined by expression (59), the transference coefficient ($D_{i13}$) between the condensed particles 9, 10, and 11 and the medium-concentration air 13 becomes:

$$D_{i13} = \frac{1}{1/(k_i A_i Z_i) + 1/(k_{13} A_i Z_{13})} \tag{63}$$

wherein $A_i$ ($=\pi d_i^2$) is the surface area of particles, $k_{13}$ ($=v_f+v_i$) is the transference speed of the compound in the medium-concentration air 13, and $k_i$ ($=v_f/100$) is the transference speed of the compound in the particles. Here, $v_i$ is the floating speed of the condensed particles 9, 10, and 11, and can be determined by use of hydrodynamics since it is under the control of the flow caused by the heat of the electric heating vaporizer, gravity, and air resistance.

From the half-life of transference to air ($\tau_{jk}$) in the ceilings 15, 16, and 17, volume ($V_j$, j=12, 13, 14) of the airs 12, 13, and 14, volume ($V_k$) of the floor/wall/ceiling determined by expression (66) mentioned later, Fugacity capacity ($Z_j$) of airs 12, 13, and 14 determined by expression (59), and Fugacity capacity ($Z_k$) of floor/wall/ceiling determined by expression (60), the transference coefficient ($D_{jk}$) of the compound between the medium-concentration air 13 and the ceilings 15 and 16 or between the low-concentration air 14 and the floor 5, wall 6, and low-concentration ceiling 17 becomes:

$$D_{jk} = \frac{0.693}{\tau_{jk}\{1/(V_j Z_j) + 1/(V_k Z_k)\}} \tag{64}$$

$$D_{jk} = \frac{1}{1/(k_j A_{jk} Z_j) + 1/(k_k A_{jk} Z_k)} \tag{64'}$$

Here, the total volume $V_{12}+V_{13}+V_{14}$ of the airs 12, 13, and 14 equals the volume ($V_4$) of the room.

The above-mentioned transference coefficient ($D_{jk}$) may also be determined by the expression represented by the above-mentioned expression (64') by use of the transference speed ($k_j$) of the compound in the air and the transference speed ($k_k$) of the compound in the interior materials (floor 5, wall 6, and ceilings 15, 16, and 17).

Here, the half-life of transference to air ($\tau_{jk}$) in expression (64) is hard to actually measure and varies under various conditions, thus making it difficult to determine an accurate value thereof. By contrast, all the parameters in expression (64') can be easily determined by calculation without necessitating measurement. For example, using the diffusion coefficient ($D_c$) of compound, the transference speed ($k_k$) of the compound in the interior material is calculated as $(D_c/t)^{0.5}$; whereas $A_{jk}$ can be determined from the contact area between the individual airs 12, 13, and 14 and the individual interior materials (floor 5, wall 6, and ceilings 15, 16, and 17). Here, $D_c$ can be determined when the diffusion coefficient ($D_{ca}$) of the compound in the air is multiplied by $10^{-9}$, whereas $D_{ca}$ can be computed from properties of the compound (e.g., structural formula, molecular weight, and the like) according to Wike and Lee method ("Handbook of Chemical Property Estimation Methods," McGraw-Hill Book Company, 1982), for example. Accordingly, the transference coefficient ($D_{jk}$) is more preferably determined by expression (64') than by expression (64).

Using the diameter ($d_i$) of particles determined by expression (62) and the evaporation constant ($\alpha$), change in volume ($dv_i/dt$) of the condensed particles 9, 10, and 11 is expressed by:

$$\frac{dV_i}{dt} = -\frac{\pi}{2}\alpha d_i \tag{65}$$

Namely, as the particle-constituting solvent component evaporates over time, the volume ($V_i$, i=9, 10, 11) of condensed particles 9, 10, and 11 decreases.

Assuming that each of the floor 5, wall 6, and ceilings 15, 16, and 17 before heat-vaporizing the chemical is like a thin film and that, as the chemical infiltrates into the film, its thickness increases so as to enhance the volume thereof; from the surface area ($A_k$) of the floor/wall/ceiling and diffusion coefficient ($D_c$) of the compound in the floor/wall/ceiling, the volume ($V_k$, k=5, 6, 15, 16, 17) of floor/wall/ceiling becomes:

$$V_k=2\sqrt{D_c t}A_k \tag{66}$$

(ii) Fugacity Calculation (S3)

The behavior of the compound in the condensed particles 9, 10, and 11 is expressed in the form of differential equation concerning Fugacity ($f_i$) as:

$$\underset{F\text{-change}}{\frac{df_i}{dt}V_i Z_i} = \underset{V\text{-change}}{\frac{\pi}{2}\alpha d_i Z_i f_i} - \underset{\text{Transference(13)}}{D_{i13}(f_i - f_{13})} - \underset{\text{Degradation}}{K_i V_i Z_i f_i} \tag{67}$$

Here, the terms of V-change, Transference (13), and Degradation respectively indicate the volume change (decrease over time) of the condensed particles, amount of transference of the compound between the condensed particles 9, 10, and 11 and the medium-concentration air 13, and amount of degradation of the compound by light and oxidation in the condensed particles 9, 10, and 11 ($K_iV_iZ_i$ indicating the degradation speed quantity). Here, when the condensed particles 9, 10, and 11 are absorbed by the high-concentration ceiling 15, Fugacity ($f_i$) immediately disappears and is added to Fugacity ($f_{15}$) explained later.

The behavior of the compound in the high-concentration air 12 is expressed in the form of differential equation concerning Fugacity ($f_{12}$) as:

$$\underset{F\text{-change}}{\frac{df_{12}}{dt}V_{12}Z_{12}} = \underset{\text{Emission}}{E_v} + \underset{\text{Transference}(f)}{v_f A_{12}(Z_{13}f_{13} - Z_{12}f_{12})} - \underset{\text{Degradation}}{K_{12}V_{12}Z_{12}f_{12}} \tag{68}$$

Here, the terms of Emission, Transference (j), and Degradation respectively indicate the amount of emission of the compound as complete vapor, amount of transference of the compound with respect to the medium-concentration air 13, and amount of degradation of the compound by light and oxidation ($K_{12}V_{12}Z_{12}$ indicating the degradation speed quantity).

The behavior of the compound in the medium-concentration air 13 is expressed in the form of differential equation concerning Fugacity ($f_{13}$) as:

$$\underbrace{\frac{df_{13}}{dt}V_{13}Z_{13}}_{F\text{-change}} = \underbrace{v_f\{A_{12}Z_{12}f_{12} - (A_{12}+A_{13})Z_{13}f_{13} + A_{13}Z_{14}f_{14}\}}_{\text{Transference}(j)} - \quad (69)$$

$$\underbrace{\sum_{i=9}^{11} n_i D_{i13}(f_{13}-f_i)}_{\text{Transference}(i)} - \underbrace{\sum_{k=15}^{16} D_{13k}(f_{13}-f_k)}_{\text{Transference}(k)} - \underbrace{K_{13}V_{13}Z_{13}f_{13}}_{\text{Degradation}}$$

Here, the terms of Transference (j), Transference (i), Transference (k), and Degradation respectively indicate the amount of transference of the compound with respect to the high-concentration air 12 and low-concentration air 14, amount of transference of the compound with respect to the condensed particles 9, 10, and 11, amount of transference of the compound with respect to the ceilings 15 and 16, and amount of degradation of the compound by light and oxidation ($K_{13}V_{13}Z_{13}$ indicating the degradation speed quantity).

The behavior of the compound in the low-concentration air 14 is expressed in the form of differential equation concerning Fugacity ($f_{14}$) as:

$$\underbrace{\frac{df_{14}}{dt}V_{14}Z_{14}}_{F\text{-change}} = \underbrace{v_f\{A_{13}Z_{13}f_{13} - (A_{13}+A_{14})Z_{14}f_{14}\}}_{\text{Transference}(j) \ \& \ \text{Ventilation}} - \quad (70)$$

$$\underbrace{\sum_{k=5}^{6} D_{14k}(f_{14}-f_k)}_{\text{Transference}(k)} - \underbrace{D_{1417}(f_{14}-f_{17})}_{\text{Transference}(17)} -$$

$$\underbrace{K_{14}V_{14}Z_{14}f_{14}}_{\text{Degradation}}$$

Here, the terms of Transference (j) & Ventilation, Transference (k), Transference (17), and Degradation respectively indicate the amount of transference of the compound with respect to the medium-concentration air 13 and the amount of discharge thereof outdoors, amount of transference of the compound with respect to the floor 5 and wall 6, amount of transference of the compound with respect to the low-concentration ceiling 17, and amount of degradation of the compound by light and oxidation ($K_{14}V_{14}Z_{14}$ indicating the degradation speed quantity).

The behaviors of the compound in the floor 5 and wall 6 are respectively expressed in the forms of differential equations concerning Fugacity ($f_5$) and ($f_6$) as follows:

$$\underbrace{\frac{df_5}{dt}V_5Z_5}_{F\text{-change}} = -\underbrace{\sqrt{D_c/t}A_5Z_5f_5}_{V\text{-change}} - \underbrace{D_{145}(f_5-f_{14})}_{\text{Transference}(14)} - \quad (71)$$

$$\underbrace{K_5V_5Z_5f_5}_{\text{Degradation}}$$

$$\underbrace{\frac{df_6}{dt}V_6Z_6}_{F\text{-change}} = -\underbrace{\sqrt{D_c/t}A_6Z_6f_6}_{V\text{-change}} - \underbrace{D_{146}(f_6-f_{14})}_{\text{Transference}(14)} - \quad (72)$$

$$\underbrace{K_6V_6Z_6f_6}_{\text{Degradation}}$$

Here, in each expression, the terms of V-change, Transference (14), and Degradation respectively indicate the volume change (increase over time) of the floor 5 or wall 6, amount of transference of the compound with respect to the floor 5 or wall 6, and amount of degradation of the compound by light and oxidation ($K_5V_5Z_5$ or $K_6V_6Z_6$ indicating the degradation speed quantity).

The behaviors of the compound in the high-concentration ceiling 15, medium-concentration ceiling 16, and low-concentration ceiling 17 are respectively expressed in the forms of differential equations concerning Fugacity ($f_{15}$), ($f_{16}$), and ($f_{17}$) as follows:

$$\underbrace{\frac{df_{15}}{dt}V_{15}Z_{15}}_{F\text{-change}} = -\underbrace{\sqrt{D_c/t}A_{15}Z_{15}f_{15}}_{V\text{-change}} - \underbrace{D_{13\,15}(f_{15}-f_{13})}_{\text{Transference}(13)} - \quad (73)$$

$$\underbrace{K_{15}V_{15}Z_{15}f_{15}}_{\text{Degradation}}$$

$$\underbrace{\frac{df_{16}}{dt}V_{16}Z_{16}}_{F\text{-change}} = -\underbrace{\sqrt{D_c/t}A_{16}Z_{16}f_{16}}_{V\text{-change}} - \underbrace{D_{13\,16}(f_{16}-f_{13})}_{\text{Transference}(13)} - \quad (74)$$

$$\underbrace{K_{16}V_{16}Z_{16}f_{16}}_{\text{Degradation}}$$

$$\underbrace{\frac{df_{17}}{dt}V_{17}Z_{17}}_{F\text{-change}} = -\underbrace{\sqrt{D_c/t}A_{17}Z_{17}f_{17}}_{V\text{-change}} - \underbrace{D_{14\,17}(f_{17}-f_{14})}_{\text{Transference}(14)} - \quad (75)$$

$$\underbrace{K_{17}V_{17}Z_{17}f_{17}}_{\text{Degradation}}$$

Here, in each expression, the terms of V-change, Transference (13), Transference (14), and Degradation respectively indicate the volume change (increase over time) of the ceilings 15, 16, and 17, amount of transference of the compound between the high-concentration ceiling 15 or medium-concentration ceiling 16 and the medium-concentration air 13, amount of transference of the compound between the low-concentration ceiling 17 and the low-concentration air 14, and amount of degradation of the compound by light and oxidation ($K_{15}V_{15}Z_{15}$, $K_{16}V_{16}Z_{16}$, or $K_{17}V_{17}Z_{17}$ indicating the degradation speed quantity).

When the following Fugacity ($f_a$) is added to the floor (k=5), wall (k=6), and ceiling (k=15, 16, 17) by a predetermined ratio, accuracy can be improved.

$$f_a = n_i V_{tia} Z_i f_{ia}/V_k/Z_k \quad (76)$$

Here, $V_{tia}$ and $f_{ia}$ respectively indicate the volume and Fugacity of particles immediately before the condensed particles attach to the interior materials.

The above-mentioned 11 kinds of differential equations (67) to (75) are simultaneously formed and are solved by Runge-Kutta-Gill method, so as to compute Fugacity ($f_5$, $f_6$, $f_9$ to $f_{17}$).

When solving these simultaneous differential equations, it is necessary to set an estimation nick time width (dt) which is a minute time unit. Namely, the estimation nick time width is used such that solutions of the simultaneous differential equations are initially determined at a time ($t_0$), and then solutions of the simultaneous differential equations are determined at a time ($t_0$+dt) to which the estimation nick time width is added. As solutions are obtained while estimation nick time widths are successively added, temporally changing Fugacity can be determined. Theoretically, as the set time of the estimation nick time width is shorter, more accurate solutions can be obtained, though necessitating a very long calculation time. By contrast, when the set time is too long, solutions tend to diverge, thereby generating errors.

Therefore, in the present invention, the estimation nick time width is set shorter when a very large change occurs in a chemical, whereas it is set longer when there is no large change.

Specifically, mass balance is always confirmed such that the amount of input of the chemical and the resulting solution coincide with each other, and the estimation nick time width is set longer when the mass balance does not fluctuate greatly, whereas it is set shorter when the mass balance starts fluctuating. For example, when the fluctuation of mass balance is set to an accuracy of ±5%, the estimation nick time width is always set so as to constantly satisfy the relationship of:

compound input amount/(existing amount+degrading amount+ discharging amount)=0.95 to 1.05 namely, such that the fluctuation of mass balance lies within the range of ±5%.

Here, the above-mentioned compound input amount is determined by the compound content ($R_a$) and emission rate ($E_T$). Since the temporal amounts of compound in the 11 kinds of media are determined by the simultaneous differential equations, they are summed up so as to compute the existing amount as shown in the following:

$$\left.\begin{aligned}\text{existing amount} &= \sum_{i=9}^{11} n_i V_i Z_i f_i + \sum_{k=5}^{6} f_k V_k Z_k + \sum_{k=12}^{17} f_k V_k Z_k \\ \text{degrading amount} &= \sum_{i=9}^{11} n_i K_i V_i Z_i f_i + \sum_{k=5}^{6} K_k f_k V_k Z_k + \\ &\qquad \sum_{k=12}^{17} K_k f_k V_k Z_k \\ \text{discharging amount} &= v_f A_{14} Z_{14} f_{14}\end{aligned}\right\} \quad (77)$$

The degrading amount and discharging amount are as represented above.

With reference to the flowchart of FIG. 5, the method of setting the estimation nick time width (dt) will be explained.

First, an initial value of estimation nick time width (dt) is inputted (S21). Then, an upper limit set value (e.g., 0.1[%]) which is the upper limit of difference in mass balance, and a lower limit set value (e.g., $10^{-6}$[%]) which is the lower limit of difference in mass balance are inputted (S22). Thereafter, Fugacity and mass balance at $t=t_0$ are calculated (S23 and S24), and Fugacity and mass balance at t=t+dt (or $t_0$+dt) are calculated (S25 and S26).

It is judged whether the fluctuation in mass balance is within the range of ±5% or not (S27). If the fluctuation in mass balance is within the range of ±5%, it is judged whether the difference between the mass balance at t=t (or $t_0$) and the mass balance at t=t+dt (or $t_0$+dt) is at least the upper limit set value or not (S28). If it is judged to be at least the upper limit set value at S28, then solutions become more accurate when the estimation nick time width (dt) is made shorter. In this case, the estimation nick time width (dt) is multiplied by ½ so as to change its setting (S29). When the difference is judged to be smaller than the upper limit set value at S28, it is judged at S30 whether the difference between the mass balance at t=t (or $t_0$) and the mass balance at t=t+dt (or $t_0$+dt) is at most the lower limit set value or not.

When the mass balance difference is not greater than the lower limit set value at S30, since solutions are not influenced by longer estimation nick time width (dt), the estimation nick time width (dt) is doubled so as to change its setting (S31). Subsequently, it is judged whether the estimation nick time width (dt) changed at S31 is at most a maximum value (e.g., 0.1 [hour]) of estimation nick time width (dt) or not (S32). When the estimation nick time width (dt) is not greater than the maximum value at S32, since solutions do not diverge, the estimation nick time width (dt) set at S31 is used. When the estimation nick time width (dt) is greater than the maximum value at S32, since solutions may diverge, the estimation nick time width (dt) is reset to the maximum value (S33). When the mass balance difference is greater than the lower limit set value at the above-mentioned S30, namely, when it lies between the lower limit set value and upper limit set value, the calculations are continued without changing the estimation nick time width (dt).

After the step of S29, S30, S32, or S33, the operation returns to S25 so as to effect calculation again, and this process is repeated till the aimed time is attained.

When the fluctuation in mass balance exceeds the range of ±5% at S27, on the other hand, the mass balance fluctuation is so much that calculation is preferably effected with an estimation nick time width (dt) shorter than that in the case where the fluctuation is within the range of ±5%. Accordingly, the calculation is stopped once (S34), the lower limit set value is reset to a lower level (S35), and then the operation returns to the step of S23.

Thus, when the estimation nick time width is variably set without being held constant, while monitoring the mass balance fluctuation, Fugacity can be computed accurately and efficiently.

(iii) Computation of Temporal Concentration in Indoor Air and Floor Residual Amount (S4)

The temporal concentration of the compound in the indoor air is computed when Fugacity ($f_{14}$) of the low-concentration air 14, determined by the above-mentioned item(ii), is multiplied by its Fugacity capacity ($Z_{14}$). The concentration in the low-concentration air 14 is used because the most part in the room is filled with the low-concentration air 14, and humans are most likely to inhale the low-concentration air 14. The concentration in the air of other concentrations may also be used when necessary.

The floor residual amount of the compound is computed when Fugacity ($f_5$) of the floor is multiplied by Fugacity capacity ($Z_5$).

(iv) calculation of Estimated Exposure Amount in Inhalation and Inhalation Safety Coefficient (S6 and S7)

The above-mentioned temporal concentration in the indoor air forms a curve shown in FIG. 3A, for example. This concentration curve is integrated, an accumulated concentration of the compound during a specific period ($t_1$ to $t_2$) is determined (see FIG. 3B), and the mean concentration in the indoor air is computed from thus determined value. While an arbitrary period is set as the specific period depending on the object, an appropriate period is usually set in view of the method of use of the product and the test period of toxicity data.

Then, according to the above-mentioned mean concentration in the indoor air, amount of respiration, and exposure time, the estimated exposure amount in inhalation is determined. Namely, calculation of:

estimated exposure amount in inhalation [mg/kg/day]=mean concentration in indoor air [mg/m$^3$]×amount of respiration [m$^3$/kg/min]×exposure time [min/day]

is effected. Here, as the above-mentioned amount of respiration, a published value or actually measured value may be used. Also, when amounts of respiration are respectively set for adult and child, more appropriate estimated exposure amounts in inhalation can be obtained. In the case where the inhaled harmful material is not totally absorbed into the body but is partially discharged by respiration, a more appropriate estimated exposure amount in inhalation can be obtained when the inhalation ratio is taken into account.

The inhalation safety coefficient is computed from a non-influential amount concerning inhalation toxicity examined by an animal experiment beforehand and the estimated exposure amount in inhalation determined above. Namely, it is expressed as:

inhalation safety coefficient=inhalation non-influential amount [mg/kg/day]/estimated exposure amount in inhalation [mg/kg/day]

(v) Calculation of Estimated Percutaneous Exposure Amount and Percutaneous Safety Coefficient (S9 and S11)

The above-mentioned floor residual amount forms a curve such as that shown in FIG. 4A, for example. This residual amount curve is integrated, the accumulated residual amount of the compound during a specific period ($t_1$ to $t_2$) is determined (see FIG. 4B), and the mean residual amount is computed from thus determined value. While an arbitrary period is set as the specific period depending on the object, an appropriate period is usually set in view of the method of use of the product and the test period of toxicity data.

Then, according to the mean floor residual amount, skin attachment ratio, contact area, and body weight, the estimated percutaneous exposure amount is determined. Namely, calculation of:

estimated percutaneous exposure amount [mg/kg/day]=(mean residual amount [mg/m$^2$]×skin attachment ratio [%]×contact area [m$^2$/day])/body weight [kg]

is effected. Here, as the contact area, a published value (e.g., 4 [m$^2$/day]) may be used. The skin attachment ratio is a ratio of the compound attaching to the skin when the latter is in contact with the floor 5 where the compound exists. As this value, a published value or a value experimentally obtained from a model may be used.

A model experiment method for the skin attachment ratio is as follows. A weight (8 cm×8 cm×8 cm; 4.2 kg) is placed on a denim cloth (8 cm×10 cm) with a pressure similar to that of an infant in contact with a floor, and the denim cloth is pulled on the floor at a speed (120 cm/15 sec) similar to the moving speed of the infant. The denim and floor are analyzed so as to compute the compound contained in the denim and floor. From the ratio therebetween, the skin attachment ratio is obtained. It has been confirmed that the skin attachment ratio obtained by this method is identical to or slightly higher than that determined from analyzed values of a hand and a floor when the hand is actually pressed against the floor, thereby proving this model experiment method to be useful for evaluating exposure of inhabitants.

The percutaneous safety coefficient is computed from the non-influential amount concerning percutaneous toxicity examined by an animal experiment beforehand and the estimated percutaneous exposure amount determined above. Namely, it is expressed as:

percutaneous safety coefficient=percutaneous non-influential amount [mg/kg/day]/estimated percutaneous exposure amount [mg/kg/day]

Nevertheless, in general, percutaneous non-influential amount has not often been determined, and there are not many published values. Accordingly, a more accurate value can be determined from the estimated percutaneous exposure amount, and oral non-influential amount and percutaneous absorption ratio for which many published values exist, according to the following expression:

percutaneous safety coefficient=oral non-influential amount [mg/kg/day]/(estimated percutaneous exposure amount [mg/kg/day]×percutaneous absorption ratio [%])

Here, when the percutaneous absorption ratio is unknown, employed is a national guideline (e.g., 10%) which usually exists.

(vi) Calculation of Estimated Oral Exposure Amount and Oral Safety Coefficient (S13 and S14)

From the estimated percutaneous exposure amount obtained in the above-mentioned item (v), hand surface area ratio, and oral transference ratio, the estimated oral exposure amount from hand to mouth is determined. Namely, calculation of:

estimated oral exposure amount [mg/kg/day]=estimated percutaneous exposure amount [mg/kg/day]×hand surface area ratio [%]×oral transference ratio [%]

is effected. Here, the hand surface area ratio is expressed by (hand surface area/body surface area), for which a published value (e.g., 5[%]) may be used. The oral transference ratio is a hypothetical value, which is set to 100%, for example.

In the case where oral exposure might occur via tableware or food contaminated with the residually sprayed compound, it is required that the estimated oral exposure amount from tableware or food to mouth be added to the estimated oral exposure amount from hand to mouth to yield the total estimated oral exposure amount. For example, the estimated oral exposure amount from tableware is obtained when, according to the tableware residual amount indicating the amount of the harmful material remaining in tableware, tableware use area which is the sum of tableware surface areas, and oral transference ratio from tableware, calculation of:

estimated oral exposure amount [mg/kg/day]=tableware residual amount [mg/m$^2$]×tableware use area [m$^2$/day]×oral transference ratio [%]/body weight [kg]

is effected. Here, the tableware residual amount is expressed by (mean floor residual amount×tableware contamination ratio). As the tableware contamination ratio, an actually measured value (e.g., 9%) or a hypothetical value may be used.

The oral safety coefficient is computed from the non-influential amount concerning oral toxicity examined by an animal experiment beforehand and the estimated oral exposure amount determined above. Namely, it is expressed as:

oral safety coefficient=oral non-influential amount [mg/kg/day]/estimated oral exposure amount [mg/kg/day]

As mentioned in the foregoing, in the method of estimating an indoor behavior of a pesticidal compound in this embodiment, the environment is divided into the condensed particles 9, 10, and 11 that are classified into three kinds depending on occurrence and extinction, the high-concentration air 12, medium-concentration air 13, and low-concentration air 14 that are classified into three kinds depending on the compound concentration, the floor 5, the wall 6, and the high-concentration ceiling 15, medium-concentration ceiling 16, and low-concentration ceiling 17 that are classified into three kinds depending on the compound concentration; and differential equations concerning Fugacity in these members are simultaneously formed and are solved, whereby the indoor behavior of the compound when heat-vaporizing a chemical containing the compound is estimated. Here, when solving the simultaneous differential equations, the estimation nick time width is variably set, while constantly confirming mass balance of the compound indoors after the spraying, so that the amount of input of the chemical indoors and the resulting solution coincide with each other.

Accordingly, since mass balance of the compound after the spraying is always monitored such that the amount of input of the compound indoors and the resulting solution coincide with each other, thereby varying the estimation nick time width; the estimation nick time width is set longer when the mass balance fluctuates a little, whereas it is set shorter when the mass balance starts fluctuating greatly. Namely, when solving simultaneous differential equations including a parameter accompanying temporal change, the estimation nick time width is automatically set in response to the fluctuation in mass balance. Consequently, when processed by a computer, an accurate solution can be obtained in a short time.

The method of evaluating safety of a pesticidal compound in accordance with this embodiment uses the estimated result mentioned above to evaluate the safety of the compound with respect to the human body when the chemical is heated to vaporize.

Accordingly, the safety of the compound with respect to the human body can be evaluated accurately in a short time. As a consequence, when formulating a chemical such as insecticide containing the compound, simulation can be easily repeated while changing conditions, thereby making it easier to formulate a chemical having a high safety conforming to the aimed object.

Though the kind of the floor 5 is assumed to be tatami in this embodiment, differential equations similar to those mentioned above may also be formed in the case of flooring. In this case, however, when determining fugacity capacity ($Z_5$) of the floor 5 in equation (60), it is necessary for the particle-constituting solvent component content (see Table 27) to be changed from that of tatami to that of flooring.

Though Fugacity is determined by use of Runge-Kutta-Gill method in this embodiment, other methods may be used for solving differential equations. Runge-Kutta-Gill method, however, is preferably used since a program for the above-mentioned differential equations can be easily made by Basic. Also in the case where differential equations are solved by a method other than Runge-Kutta-Gill method, similar effects can be obtained when the estimation nick time width is set as mentioned above.

(6) Sixth Embodiment

With reference to the drawings, the sixth embodiment of the present invention will be explained in the following. The method of simulating an indoor behavior of a pesticidal compound in accordance with this embodiment estimates the behavior of the compound in the case where the floor in the fifth embodiment is constituted by a rug having ears of fiber. For convenience of explanation, members identical to those shown in the drawings of the previous embodiment will be referred to with numerals or letters identical thereto, without their explanations provided. Explained here is a case where the kind of floor is a carpet. Accordingly, only the portion different from the fifth embodiment will be explained.

First, the carpet is modeled as shown in FIGS. 13A, 13B, and 13C. Namely, the carpet is divided into a plurality of carpet fibers (ears of fiber) planted on a substrate and space portions existing between the fibers. When a chemical is heated to vaporize in a room in which such a carpet covers the whole floor surface, as condensed particles fall on the carpet, the chemical infiltrates into the carpet fiber and accumulates in the space portion.

While the method of simulating an indoor behavior of a pesticidal compound in accordance with this embodiment also conforms to the flowchart of FIG. 1, at S1, as the primary condition, the carpet-related primary condition shown in Table 31 is added to the primary condition of the fifth embodiment (see Tables 25 to 28). Here, the cross-sectional area ($A_c$) of the space portion of the carpet refers to the area in which the space portion is in contact with the indoor air (see FIGS. 13A, 13B, and 13C).

TABLE 31

| CARPET - RELATED PRIMARY CONDITION | SYMBOL | EXAMPLE OF VALUE |
|---|---|---|
| CARPET | | |
| CROSS - SECTIONAL AREA OF SPACE PORTION OF CARPET | $A_c$ | $1.6 \times 10^{-3}$ [$m^2/m^2$ FLOOR] |
| AREA IN WHICH CARPET FIBER IS IN CONTACT WITH COMPOUND IN SPACE PORTION | $A_{cS}$ | 0.192 [$m^2/m^2$ FLOOR] |
| AREA IN WHICH CARPET FIBER IS IN CONTACT WITH COMPOUND | $A_{aS}$ | 1.19 [$m^2/m^2$ FLOOR] |
| PRODUCT PROPERTY | | |
| CONTENT OF SOLVENT (XYLENE) CONTAINED IN PRODUCT | $C_{sd}$ | |
| DILUTION OF PRODUCT | $X_{sol}$ | |

The examples of values in Table 31 are based on the values shown in FIGS. 13A, 13B, and 13C. Here, one space portion is set to a size of 0.1 [mm]×0.1 [mm]×3 [mm], and one square of carpet fiber is set to a size of 2.5 [mm]×2.5 [mm]×3 [mm]. Also, it is assumed that 16 [pieces] of carpet fiber exist in 1 [$cm^2$].

In this case, the individual parameters can be determined as:

$$A_c = (0.1 \text{ [mm]} \times 0.1 \text{ [mm]} \times 16 \text{ [pieces]})/1 \text{ [cm]}$$
$$= 1.6 \times 10^{-3} \text{ [}m^2/m^2 \text{ floor]}$$
$$A_{cS} = (0.1 \text{ [mm]} \times 3 \text{ [mm]} \times 4 \text{ [faces]} \times 16 \text{ [pieces]})/1 \text{ [cm]}$$
$$= 0.192 \text{ [}m^2/m^2 \text{ floor]}$$
$$A_S = 1 - A_c$$
$$= 1 - 1.6 \times 10^{-3} \text{ [}m^2/m^2 \text{ floor]}$$
$$A_{aS} = A_S + A_{cS}$$
$$= 1.19 \text{ [}m^2/m^2 \text{ floor]}$$

Here, $A_S$ is the area in which the carpet fibers in 1 [$m^2$] are in contact with the indoor air.

As the secondary condition at S2, the carpet-related secondary condition shown in Table 32 is added to the secondary condition of the fifth embodiment. Here, $k_5$ and $V_5$, which are respectively transference speed of the compound in the floor and the volume of the floor in the fifth embodiment (see Table 30), are respectively replaced by the transference speed of the compound in the carpet fiber and the volume of the whole fiber of the carpet.

TABLE 32

| CARPET - RELATED SECONDARY CONDITION | SYMBOL |
|---|---|
| DEFINITE FACTOR CONDITION | |
| EVAPORATION CONSTANT OF CHEMICAL IN SPACE PORTION | $R_d$ |
| HUMIDITY AT TEMPERATURE ($T_d$) OF SPACE PORTION | $H_m$ |
| VOLUME OF WHOLE FIBER OF CARPET | $V_5$ |
| TRANSFERENCE SPEED OF COMPOUND IN PRODUCT | $k_c$ |
| PROPERTY CHANGE CONSTANT OF PRODUCT | a |

TABLE 32-continued

| CARPET - RELATED SECONDARY CONDITION | SYMBOL |
|---|---|
| TEMPORAL CHANGE CONDITION | |
| TRANSFERENCE COEFFICIENT OF COMPOUND BETWEEN CHEMICAL IN SPACE PORTION AND AIR | $D_{c14}$ |
| TRANSFERENCE COEFFICIENT OF COMPOUND BETWEEN CHEMICAL IN SPACE PORTION AND CARPET FIBER | $D_{cS}$ |
| VOLUME OF CHEMICAL IN SPACE PORTION | $V_c$ |
| FUGACITY CAPACITY OF CHEMICAL IN SPACE PORTION | $Z_c$ |

A method of computing the definite factor conditions and temporal change conditions shown in the above-mentioned Table 32 will be explained hereinafter as exemplified by the case using an aqueous aerosol, i.e., case where the particle-constituting solvent is water.

From the cross-sectional area ($A_c$) of the space portion, room temperature (T), and humidity (H), the evaporation constant ($R_d$) of the chemical entered into the space portion of the carpet is expressed as:

$$R_d = A_c h(H_m - H)/C_H$$

$$C_H = 0.24 + 0.46H$$

$$h = 3.06 \times 10^{-4}(T - T_d)^{1/3} \quad (78)$$

wherein $T_d$ is the temperature of the space portion of the carpet (corresponding to the wet-bulb temperature), and $H_m$ is the humidity (corresponding to the saturated humidity at the wet-bulb temperature) of the space portion at $T_d$. Here, $T_d$ and $H_m$ can be determined from the above-mentioned "mass-based humidity table" according to the room temperature (T) and humidity (H). In the case of an oil-based product (aerosol), while the vapor constant of the chemical can be computed when properties of the water and oil are compared with each other and then are multiplied by $R_d$, $R_d = 0$ may be assumed in the case where the evaporation of the oil is slow.

From the diffusion coefficient ($D_c$) and the area ($A_{aS}$) in which the carpet fiber is in contact with the compound, the volume ($V_S$) of the whole fiber of the carpet is determined as:

$$V_S = 2\sqrt{D_c t} A_{aS} \quad (79)$$

The transference speed ($k_c$) of the compound in the product is expressed as $k_{14}/100$ by use of $k_4$ ($=Gv_4/A_{14}$) which indicates the transference speed of the compound in the indoor air.

From the above-mentioned transference speed ($k_c$) of the compound in the product, transference speed ($k_{14}$) of the compound in the indoor air, floor area ($L_4 \times W_4$), cross-sectional area ($A_c$) of the space portion, Fugacity capacity ($Z_c$) of the chemical in the space portion determined by expression (82) which will be mentioned later, and Fugacity capacity ($Z_{14}$) of the low-concentration air determined by expression (59) of the fifth embodiment, the transference coefficient ($D_{c14}$) of the compound between the chemical in the space portion of the carpet and the low-concentration air is expressed as:

$$D_{c14} = \frac{1}{1/(k_c A_c L_4 W_4 Z_c) + 1/(k_{14} A_c L_4 W_4 Z_{14})} \quad (80)$$

From the above-mentioned transference speed ($k_c$) of the compound in the product, diffusion coefficient ($D_c$), floor area ($L_4 \times W_4$), area ($A_{c5}$) in which the carpet fiber is in contact with the compound in the space portion, Fugacity capacity ($Z_c$) of the chemical in the space portion, and Fugacity capacity ($Z_5$) of the floor determined by expression (60) of the fifth embodiment, the transference coefficient ($D_{c5}$) of the compound between the chemical in the space portion and the carpet fiber is expressed as;

$$D_{c5} = \frac{1}{1/(k_c A_{c5} L_4 W_4 Z_c) + 1/(k_5 A_{c5} L_4 W_4 Z_5)} \quad (81)$$

wherein $k_5$ ($=(D_c/t)^{0.5}$) is the transference speed of the compound within the carpet fiber.

The volume ($V_c$) of the chemical in the space portion is determined from the floor area ($L_4 \times W_4$), emission rate ($E_T$), condensation rate ($C_r$), and evaporation constant ($R_d$) of the chemical in the space portion determined by expression (78). The volume ($V_c$) of the space portion decreases until the solvent in the chemical completely evaporates.

From the vapor pressure ($P^s$), water solubility ($C^s$), and octanol/water distribution coefficient ($K_{ow}$) of the compound, and property change constant (a) of the product, Fugacity capacity ($Z_c$) of the chemical in the space portion is expressed as follows:

$$Z_c = (e^{-at} K_{ow} + 1 - e^{-at}) C^s / P^s \quad (82)$$

Here, the property change constant (a) of the product can be computed according to the evaporation constant ($R_d$) of the chemical in the space portion determined by expression (78), content ($C_{sd}$) of the solvent (Xylene) contained in the product, and dilution ($X_{sol}$) of the product. Namely, Fugacity capacity ($Z_c$) of the chemical in the space portion is also expressed as:

$$Z_c = [(\text{ratio of organic solvent in product}) K_{ow} + (\text{ratio of water in product})] \times C^s / P^s$$

By simultaneously forming this expression and the above-mentioned expression (82), the property change constant (a) of the product is computed. Here, in the case of the oil-based product (aerosol), Fugacity capacity ($Z_o$) of the chemical in the space portion is given by expression (57) of the fifth embodiment from the vapor pressure ($P^s$), water solubility ($C^s$), and octanol/water distribution coefficient ($K_{ow}$) of the compound.

Consequently, the behavior of the compound in the space portion of the carpet is expressed in the form of differential equation concerning Fugacity ($f_c$) as follows:

$$\frac{df_c}{dt} V_c Z_c = \gamma_c \sum_{i=9}^{11} n_i A_{aS} V_i Z_i f_i + \text{Deposition}(i) \quad (83)$$

F-change $R_d L_4 W_4 Z_c f_c +$     V-change $D_{cj}(f_c - f_j) +$     Transference(j)

$D_{c13}(f_c - f_{13}) -$     Transfernce(k)

$K_c V_c Z_c f_c$     Degradation

Also, expressions (71) and (70) in the fifth embodiment are respectively replaced by the following expressions (84) and (85):

$$\frac{df_5}{dt} V_5 Z_5 = \sqrt{D_c/t}\, A_5 Z_5 f + \quad V-\text{change} \tag{84}$$

$$\sum_{i=9}^{11} n_i V_i Z_i f_i + \quad \text{Deposition}(i)$$

$$D_{c5}(f_5 - f_c) + \quad \text{Transference}(c)$$

$$D_{145}(f_5 - f_{14}) - \quad \text{Transfernce}(14)$$

$$K_5 V_5 Z_5 f_5 \quad \text{Degradation}$$

$$\frac{df_{14}}{dt} V_{14} Z_{14} = G V_{14} Z_{14} f_{14} - \quad \text{Ventilation} \tag{85}$$

$$\sum_{i=9}^{11} n_i D_{i14}(f_{14} - f_i) - \quad \text{Transference}(i)$$

$$\sum_{j=5,13,14} D_{14j}(f_{14} - f_j) - \quad \text{Transference}(j)$$

$$K_{14} V_{14} Z_{14} f_{14} - \quad \text{Degradation}$$

$$D_{14c}(f_{14} - f_c) \quad \text{Transference}(c)$$

Namely, as shown in expression (84), the differential equation concerning the floor (carpet fiber) includes, in addition to expression (71) of the fifth embodiment, the terms of Deposition (i) indicating the amount of deposition of condensed particles onto the carpet fiber and Transference (c) indicating the amount of transference of the compound between the carpet fiber and the space portion In expression (85), which is differential equation concerning the low-concentration air, terms of ventilation, Transference (i), Transference (j), Degradation, and Transference (c) respectively indicate the amount of discharge of the compound outdoors, amount of transference of the compound between the low-concentration air and condensed particles, amount of transference of the compound between the low-concentration air and the medium-concentration air and floor, amount of degradation of the compound by light and oxidation, and amount of transference of the compound between the low-concentration air and the space portion.

Accordingly, Fugacity calculation at S3 is performed such that 12 kinds of differential equations of expressions (67) to (69) and (72) to (75) in the fifth embodiment and the above-mentioned expressions (83) to (85) are solved by Runge-Kutta-Gill method. The subsequent steps of S4 to S17 are similar to those in the fifth embodiment.

As explained in the foregoing, in the method of estimating an indoor behavior of a pesticidal compound in accordance with this embodiment, in the case where the kind of floor is a carpet having ears of fiber and a space portion between the ears, a differential equation for Fugacity in the above-mentioned space portion of the carpet is added to 11 kinds of simultaneous differential equations concerning Fugacity in 3 kinds of condensed particles, air divided into 3 kinds depending on the compound concentration, floor, wall, and ceiling divided into 3 kinds depending on the compound concentration, so as to calculate Fugacity.

Consequently, even in the case where the chemical is accumulated in the space portion, so that the compound behaves differently from the case with a flat floor, the behavior of the compound can be estimated accurately, whereby various kinds of simulations can be performed.

(7) Seventh Embodiment

With reference to the drawings, the seventh embodiment of the present invention will be explained in the following.

The method of simulating an indoor behavior of a pesticidal compound (hereinafter simply referred to as compound) contained in a chemical (solution) such as insecticide in accordance with this embodiment estimates the behavior of the compound in the case where the chemical is sprayed over the whole floor surface, and is applied to the case where a carpet (rug) made of polymer fiber is spread on the whole floor surface. Here, usable as the chemical are pyrethroid insecticidal compounds, organophosphorus compounds, carbamate compounds, insect growth restrainers (IGR), and the like. Its solvent may be water or oil. Explained in this embodiment is the case where the solvent is water. The vermin to be killed is mainly flea, mite, and the like.

First, the carpet is modeled as shown in FIGS. 13A, 13B, and 13C. Namely, the carpet is divided into a plurality of carpet fibers (ears of fiber) planted on a substrate and space portions existing between the fibers. When a chemical is sprayed over the whole floor area covered with a carpet, since the solvent of the chemical is water, the chemical infiltrates into the carpet fiber and accumulates in the space portion. The chemical not only attaches to the floor but also is partly suspended in the air.

Figure 17:
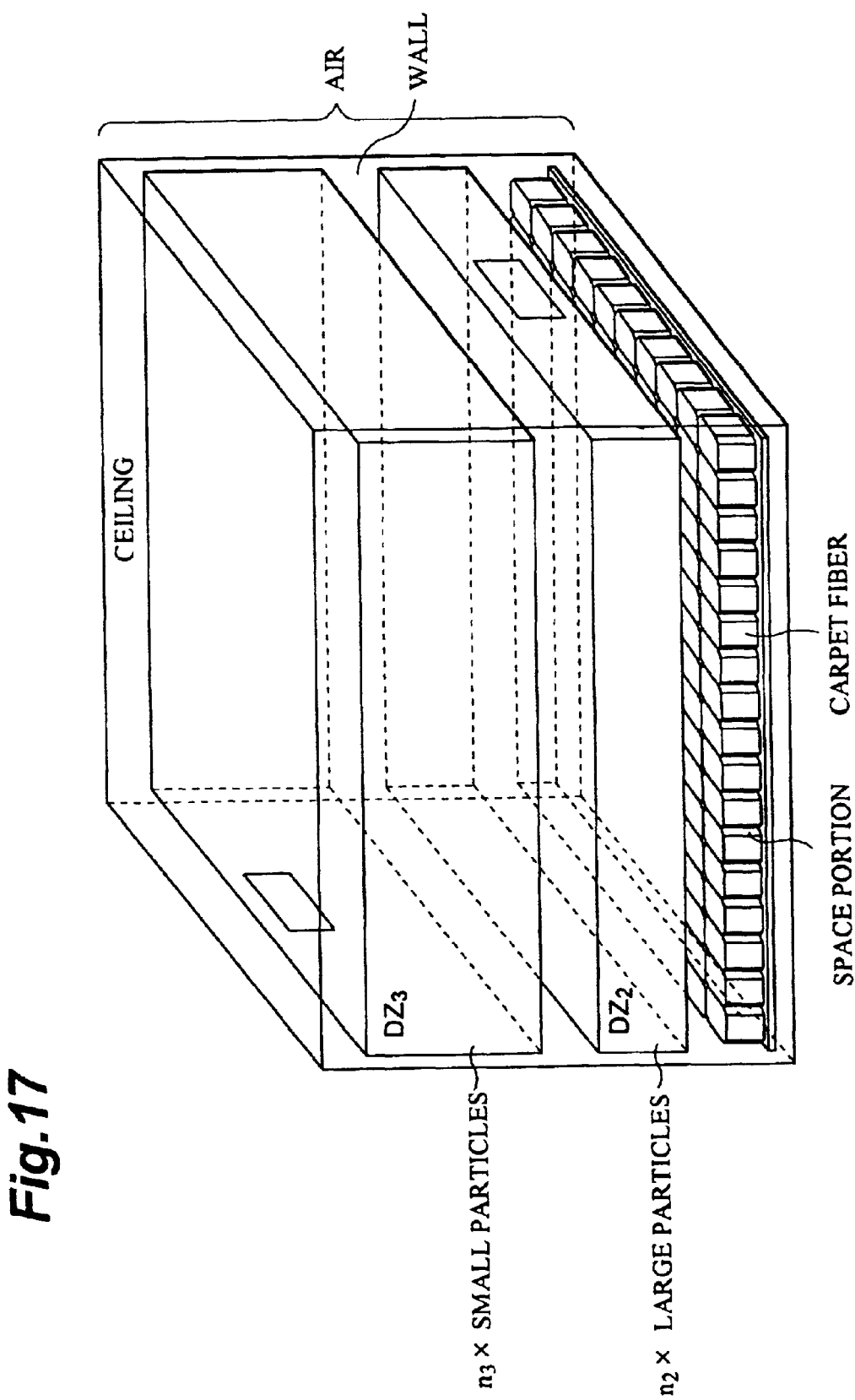
FIG. 17 is an explanatory view showing a modeled state of indoor environment in the case where an indoor behavior of a compound is estimated in the seventh embodiment of the present invention.

Accordingly, as shown in FIG. 17, the indoor environment covered with the carpet is classified into seven kinds of media comprising the space portion of the carpet, two kinds of suspended large and small particles having different diameters, whole indoor air, floor (carpet fiber), wall, and ceiling.

The suspended particles are divided into two kinds since the behavior of the particles mainly depend on their diameter. Namely, while the individual particles are distributed in the same place immediately after spraying, as time passes, the large particles are distributed to a particle zone $DZ_2$ close to the floor due to their weight, and the small particles are distributed to a particle zone $DZ_3$ close to the ceiling since they are lighter than the large particles.

Simultaneous differential equations concerning Fugacity of the compound in the above-mentioned seven kinds of media are formed and are solved by Runge-Kutta-Gill method, whereby the indoor behavior of the compound in the chemical when the chemical is sprayed over the whole carpet surface, i.e., temporal change in the compound distribution in the room and amount of attachment to the interior materials of the floor, wall, ceiling, and the like, is estimated and analyzed.

With reference to FIG. 1, a method of simulating an indoor behavior of the compound will be explained. The simulation method in accordance with this embodiment can be mainly divided into a step of dividing an indoor environment into predetermined media and forming a differential equation concerning a fugacity of the compound in each medium (S1 to S2); a step of determining the fugacity of the compound in each medium from the differential equation (S3); a step of determining the indoor behavior of the compound from the fugacity of the compound in each medium (S4); a step of changing, in response to a fluctuation in mass balance of the compound indoors, a minute time unit used when solving the differential equation (S21 to S35, see FIG. 5); and a step of evaluating safety of the compound with respect to a human body according to the indoor behavior of the compound (S5 to S17).

First, at step (hereinafter abridged as S) 1, a primary condition is inputted. The primary condition comprises physicochemical properties of the compound (see Table 33), indoor environmental behavior properties of the compound (see Table 34), indoor environment (see Table 35), a carpet condition (see Table 36), and product properties (see Table 37).

TABLE 33

| PHYSICOCHEMICAL PROPERTY OF COMPOUND | SYMBOL | EXAMPLE OF VALUE |
|---|---|---|
| MOLECULAR WEIGHT | M | 350.46 [mole] |
| SPECIFIC GRAVITY | $\rho$ | 1 [g/cm$^3$] |
| VAPOR PRESSURE | $P^s$ | $6.7 \times 10^{-3}$ [Pa] |
| WATER SOLUBILITY | $C^s$ | $1.1 \times 10^{-3}$ [mole/m$^3$] |
| OCTANOL/WATER DISTRIBUTION COEFFICIENT | $K_{ow}$ | $10^{5.1}$ |

TABLE 34

| INDOOR ENVIRONMENTAL BEHAVIOR PROPERTY OF COMPOUND | SYMBOL | EXAMPLE OF VALUE |
|---|---|---|
| HALF-LIFE OF DEGRADATION BY LIGHT/OXIDATION | | |
| IN CARPET SPACE PORTION | $\tau_c$ | |
| SUSPENDED PARTICLE | $\tau_i$ (i = 2, 3) | $1.89 \times 10_5$ [sec] |
| AIR | $\tau_4$ | |
| FLOOR/WALL/CEILING | $\tau_j$ (j = 5, 6, 7) | |
| DIFFUSION COEFFICIENT IN FLOOR/WALL/CEILING | $D_c$ | $4.52 \times 10^{-15}$ [m$^2$/s] |

TABLE 35

| INDOOR ENVIRONMENT | SYMBOL | EXAMPLE OF VALUE |
|---|---|---|
| ROOM SIZE | $V_4$ | 23.3 [m$^3$] |
| TEMPERATURE | T | 298 [K] |
| RELATIVE HUMIDITY | $\phi$ | 60 [% RH] |
| ABSOLUTE HUMIDITY | H | $1.9 \times 10^{-2}$ [kg-H$_2$O/kg/dry air] |
| VENTILATION RATE | G | 0.58 [l/h] |
| INDOOR VAPOR PRESSURE IN PARTICLE - CONSTITUTING SOLVENT | $P^\infty$ | $1.89 \times 10^3$ [Pa] |
| AIR DIFFUSION COEFFICIENT | $D_{air}$ | $8.64 \times 10^{-2}$ [m$^2$/h] |

HERE, $V_4 = L_4 \times W_4 \times H_4$ (= 3.6 m × 2.7 m × 2.4 m).

TABLE 36

| CARPET CONDITION | SYMBOL | EXAMPLE OF VALUE |
|---|---|---|
| CROSS - SECTIONAL AREA OF SPACE PORTION OF CARPET | $A_c$ | $1.6 \times 10^{-3}$ [m$^2$/m$^2$ FLOOR] |
| AREA IN WHICH CARPET FIBER IS IN CONTACT WITH COMPOUND IN SPACE PORTION | $A_{c5}$ | 0.192 [m$^2$/m$^2$ FLOOR] |
| AREA IN WHICH CARPET FIBER IS IN CONTACT WITH COMPOUND | $A_{a5}$ | 1.19 [m$^2$/m$^2$ FLOOR] |

TABLE 37

| PRODUCT PROPERTY | SYMBOL | EXAMPLE OF VALUE |
|---|---|---|
| COMPOUND CONTENT | $C_a$ | 0.5 [%] |
| SPRAY RATIO | — | 25.4 [ml/m$^2$] |
| RATIO OF CHEMICAL ATTACHING TO FLOOR | — | 60 [%] |
| CONTENT OF SOLVENT (XYLENE) CONTAINED IN PRODUCT | $C_{sd}$ | — |
| DILUTION OF PRODUCT | $X_{sol}$ | — |
| DIAMETER OF SUSPENDED PARTICLE | | |
| LARGE PARTICLE | $d_{o2}$ | 10 [$\mu$m] |
| SMALL PARTICLE | $d_{o3}$ | 1 [$\mu$m] |
| DISTRIBUTION OF SUSPENDED PARTICLE | | |
| LARGE PARTICLE | — | ABOUT 40 [%] |
| SMALL PARTICLE | — | ABOUT 0.006 [%] |
| SPACE WIDTH OF SUSPENDED PARTICLE | | |
| LARGE PARTICLE | $H_{(2)}$ | 2 [m] |
| SMALL PARTICLE | $H_{(3)}$ | 1 [m] |

The examples of values in Table 35 assume those of a six-mat room (9.72 [m$^2$]) of a typical apartment in Japan.

The cross-sectional area ($A_c$) of the space portion of the carpet in Table 36 is an area in which the space portion is in contact with the indoor air (see FIGS. 13A, 13B, and 13C). Further, the examples of values in Table 36 are based on the values shown in FIGS. 13A, 13B, and 13C. Here, one space portion is set to a size of 0.1 [mm]×0.1 [mm]×3 [mm], and one square of carpet fiber is set to a size of 2.5 [mm]×2.5 [mm]×3 [mm]. Also, it is assumed that 16 [pieces] of carpet fiber exist in 1 [cm$^2$].

In this case, the individual parameters can be determined as;

$$A_c = (0.1 \text{ [mm]} \times 0.1 \text{ [mm]} \times 16 \text{ [pieces]})/1 \text{ [cm]}$$
$$= 1.6 \times 10^{-3} \text{ [m}^2\text{/m}^2 \text{ floor]}$$
$$A_{c5} = (0.1 \text{ [mm]} \times 3 \text{ [mm]} \times 4 \text{ [faces]} \times 16 \text{ [pieces]})/1 \text{ [cm]}$$
$$= 0.192 \text{ [m}^2\text{/m}^2 \text{ floor]}$$
$$A_5 = 1 - A_c$$
$$= 1 - 1.6 \times 10^{-3} \text{ [m}^2\text{/m}^2 \text{ floor]}$$
$$A_{a5} = A_5 + A_{c5}$$
$$= 1.19 \text{ [m}^2\text{/m}^2 \text{ floor]}$$

Here, $A_5$ is the area in which the carpet fibers in 1 [m$^2$] are in contact with the indoor air.

Subsequently, using the primary condition, a secondary condition is determined by calculation (S2). The secondary condition comprises a temporally unchangeable definite factor condition (see Table 38) determined by the primary condition alone, and a temporal change condition accompanying a temporal change (see Table 39). Their calculations will be explained later in detail.

TABLE 38

| DEFINITE FACTOR CONDITION | SYMBOL |
|---|---|
| EVAPORATION CONSTANT OF SUSPENDED PARTICLES | $\alpha$ |
| VOLUME RATIO OF COMPOUND IN PRODUCT | $R_a$ |
| DIFFUSION COEFFICIENT OF COMPOUND IN AIR | $D_{ca}$ |
| EVAPORATION CONSTANT OF CHEMICAL IN SPACE PORTION | $R_d$ |

TABLE 38-continued

| DEFINITE FACTOR CONDITION | SYMBOL |
|---|---|
| FUGACITY CAPACITY OF | |
| SUSPENDED PARTICLE | $Z_i$ |
| | (i = 2, 3) |
| AIR | $Z_4$ |
| FLOOR/WALL/CEILING | $Z_j$ |
| | (j = 5, 6, 7) |
| DEGRADATION CONSTANT OF | |
| CARPET SPACE PORTION | $K_c$ |
| SUSPENDED PARTICLE | $K_i$ |
| | (i = 2, 3) |
| AIR | $K_4$ |
| FLOOR/WALL/CEILING | $K_j$ |
| | ('= 5, 6, 7) |

TABLE 39

| TEMPORAL CHANGE CONDITION | SYMBOL |
|---|---|
| SUSPENDED PARTICLE | |
| DIAMETER | $d_i$ |
| | (i = 2, 3) |
| FALLING SPEED | $v_i$ |
| | (i = 2, 3) |
| SUSPENDED NUMBER | $n_i$ |
| | (i = 2, 3) |
| TRANSFERENCE SPEED OF COMPOUND | |
| BETWEEN CHEMICAL IN SPACE PORTION AND AIR | $D_{c4}$ |
| BETWEEN CHEMICAL IN SPACE PORTION AND CARPET FIBER | $D_{c5}$ |
| BETWEEN SUSPENDED PARTICLE AND AIR | $D_{i4}$ |
| | (i = 2, 3) |
| BETWEEN FLOOR/WALL/CEILING AND AIR | $D_{4j}$ |
| | (j = 5, 6, 7) |
| VOLUME OF CHEMICAL IN SPACE PORTION | |
| VOLUME OF SUSPENDED PARTICLE | $D_i$ |
| | (i = 2, 3) |
| VOLUME OF FLOOR/WALL/CEILING | $D_j$ |
| | (j = 5, 6, 7) |
| FUGACITY CAPACITY OF CHEMICAL IN SPACE PORTION | $Z_c$ |

Using the secondary condition, seven kinds of Fugacity are calculated (S3). Namely, seven kinds of differential equations concerning the space portion of the carpet, two kinds of large and small suspended particles, indoor air, floor (carpet fiber), wall, and ceiling are simultaneously formed and are solved by Runge-Kutta-Gill method, whereby seven kinds of Fugacity are computed over time. Here, an estimation nick time width (minute time unit) set when solving the differential equations is automatically set so as to be varied in response to a fluctuation in mass balance of the compound.

At S4, using thus computed Fugacity of the small particles (taking account of Fugacity of the large particles when necessary) and Fugacity of the indoor air, temporal concentration of the compound in the air is computed; whereas floor residual amount of the compound is computed by use of Fugacity of the carpet fiber and carpet space portion.

At S5, it is judged whether or not to perform safety evaluation in the case where the chemical is inhaled. If the safety evaluation in inhalation is to be performed, then an estimated exposure amount in inhalation indicating a degree of exposure upon inhalation of the contaminated air is computed by use of the above-mentioned temporal concentration in the indoor air (S6). Thereafter, an inhalation safety coefficient is computed according to the estimated exposure amount in inhalation (S7). At S8, the inhalation safety coefficient is compared with a reference value defined in each country. If the inhalation safety coefficient exceeds the reference value, it is judged that "there is no problem in safety." By contrast, if the inhalation safety coefficient is lower than the reference value at S8, it is judged that "there is a problem in safety," and the operation returns to S1, where alteration of the primary condition such as alteration of compound, alteration of chemical formulation, alternation of using condition, or the like is considered.

If the safety evaluation in inhalation is not selected at S5, calculated is an estimated amount of percutaneous exposure indicating to what extent the skin is exposed in contact with the floor to which the chemical is attached (S9). Thereafter, at S10, it is judged whether to perform a percutaneous safety evaluation or not. If the percutaneous safety evaluation is to be performed, a percutaneous safety coefficient is computed according to the estimated percutaneous exposure amount (S11). At S12, as with the safety evaluation in inhalation, the percutaneous safety coefficient is compared with a reference value defined in each country, whereby the safety is evaluated. If there is a problem in safety at S12, the operation returns to S1, where alteration of the primary condition is considered.

If the percutaneous safety evaluation is not selected at S10, calculated at S13 according to the estimated percutaneous exposure amount is an estimated oral exposure amount indicating the degree of exposure in the case where the chemical attached to a hand or the like is taken orally (S13). Subsequently, according to the estimated oral exposure amount, an oral safety coefficient is computed (S14). This oral exposure may occur, in particular, when an infant puts a chemical-attached hand into the mouth. At S15, as with the safety evaluation in inhalation, the oral safety coefficient is compared with a reference value defined in each country, whereby the safety is evaluated. If there is a problem in safety at S15, the operation returns to S1, where alteration of the primary condition is considered.

Finally, if it is judged to be safe at S8, S12, or S15, overall safety is evaluated. Here, the sum of respective reciprocals of the previously determined inhalation safety coefficient, percutaneous safety coefficient, and oral safety coefficient is determined, and the reciprocal of thus determined value is defined as an overall safety coefficient (S16). This overall safety coefficient is compared with a reference value, whereby an evaluation similar to the previous safety evaluation is effected (S17).

In the following, the above-mentioned steps of S2 to S4, S6, S7, S9, S11, S13, and S14 will be explained in detail.

(i) Secondary Condition Calculation (S2)

Calculations of the definite factor condition shown in Table 38 and the temporal change condition shown in Table 39 will be explained.

According to surface temperature ($T_d$) of particles, properties of particle-constituting solvent (vapor pressure $P_d$, molecular weight $M_d$, and specific gravity $\rho_d$), and indoor environment (air diffusion coefficient $D_{air}$, vapor pressure $P^\infty$, and room temperature $T^\infty$), the evaporation constant ($\alpha$) of the suspended particles is defined as follows:

$$\alpha = \frac{4 D_{air} M_d}{R \rho_d} \left( \frac{P_d}{T_d} - \frac{P\infty}{T\infty} \right) \tag{86}$$

wherein R is a gas constant, and $P_d$ (=2.26×10$^3$ [Pa]), $M_d$ (=18 [g/mole]), and $\rho_d$ (=1×10$^6$ [μg/m$^3$]) are assumed to be the values due to properties of water. Also, in this case, $T^\infty$ (temperature at the site far from particles) is set to room temperature (T), $T_d$ to indoor wet-bulb temperature (=292.5 [K]), and $P^\infty$ (vapor pressure of water at the site far from particles) to $1.89 \times 10^3$ [Pa]. These values are those with room temperature (T) of 298 [K] and relative humidity of 60[% RH].

Here, $T_d$ can be determined, according to the room temperature (T) and relative humidity (H), from "mass-based humidity table" disclosed in "Kagaku Kikai no Riron to Keisan (Theory and Calculation of Chemical Machines)" (Second Edition) (Saburo Kamei ed., Sangyo Tosho) or the like. On the other hand, $P_{d \text{ and } P}^\infty$ can be computed from the following expressions:

$$\log_{10} P_d = 10.23 - 1750/(T_d - 38)$$

$$\log_{10} P^\infty = 8.23 - 1750/(T-38) + \log_{10} \psi$$

wherein $\psi$ is an indoor relative humidity.

From the cross-sectional area ($A_c$) of the space portion, room temperature (T), and humidity (H), the evaporation constant ($R_d$) of the chemical entered into the space portion of the carpet is expressed as:

$$R_d = A_c h(H_m - H)/C_H$$

$$C_H = 0.24 + 0.46H$$

$$h = 3.06 \times 10^{-4} (T - T_d)^{1/3} \tag{87}$$

wherein $H_m$ is a humidity at temperature ($T_d$). The chemical entered into the space portion of the carpet reduces its volume upon evaporation and finally disappears, leaving the compound. Thus left compound infiltrates through the carpet fiber.

From the surface temperature ($T_d$) of particles and the vapor pressure ($P^s$) of the compound, Fugacity capacity ($Z_i$, i=2, 3) of the large and small particles is expressed as:

$$Z_i = \frac{6 \times 10^6}{P_L^S R T_d} \tag{88}$$

$$P_L^S = P^S \exp\{6.79(T_M/T_d - 1)\}$$

Though the vapor pressure of the compound in a liquid state ($P_L^s$) is computed by use of the melting point ($T_M$) of the compound and $T_d$ here; in the case where $T_M$ cannot be obtained, $P_L^s$ may be set identical to the vapor pressure of the compound in a solid state ($P^s$).

From the room temperature (T), Fugacity capacity ($Z_4$) of the air is expressed as follows:

$$Z_4 = \frac{1}{RT} \tag{89}$$

Since the carpet fiber and wallpaper covering the floor/wall/ceiling are formed by polymers; from the vapor pressure ($P^s$), water solubility ($C^s$), and octanol/water distribution coefficient ($K_{ow}$) of the compound, and from the oil component content ($\rho_j$) of the carpet fiber and wallpaper covering the floor/wall/ceiling, Fugacity capacity ($Z_j$, j=5, 6, 7) of the floor/wall/ceiling is expressed as:

$$Z_j = \rho_j K_{ow} C^S / P^S \tag{90}$$

The degradation constants ($K_c$), ($K_i$, i=2, 3), ($K_4$), ($K_j$, j=5, 6, 7) of the carpet space portion, suspended particles, air, and floor/wall/ceiling are defined by use of their respective half-lives of degradation by light/oxidation ($\tau_o$), ($\tau_i$), ($\tau_4$), and ($\tau_j$) as follows:

$$\left.\begin{array}{l} K_c = 0.693/\tau_c \\ K_i = 0.693/\tau_i \\ K_4 = 0.693/\tau_4 \\ K_j = 0.693/\tau_j \end{array}\right\} \tag{91}$$

Mainly generated in the seven kinds of media are degradation reactions caused by light and oxidation, and the reaction speed quantity at this time is represented by the product of degradation constant, volume, and Fugacity capacity. Among the degradation constants shown in expression (91), the degradation constant ($K_4$) of the compound in the air is hard to actually measure, and it is not usually easy to determine this value. Accordingly, when the actually measured value is unavailable, it may be determined as computed by Atmospheric Oxidation program (Atkinson et al., 1984, Chem. Rev. Vol. 84, pp. 437–470) from the structural formula of the compound. Also, from the viewpoint of securing safety of inhabitants, the degradation constants in the particles and in the interior materials (floor/wall/ceiling) may be nullified when their actually measured values are unavailable.

Since the volume of particles decreases over time due to evaporation, using the evaporation constant ($\alpha$) determined from expression (86) and the diameter ($d_{0i}$) of suspended particle immediately after spraying (t=0), the diameter ($d_i$, i=2, 3) of the suspended particles at time t is determined as:

$$d_i = \sqrt{d_{0i}^2 - 2\alpha t} \tag{92}$$

$$d_i = \sqrt[3]{R_a} d_{0i} \tag{92'}$$

On the other hand, when the particle-constituting solvent in the suspended particle is completely evaporated, the diameter ($d_i$) becomes that of the compound alone, thereby being held constant. Namely, the particle diameter ($d_i$) after the complete evaporation of the particle-constituting solvent is represented by the above-mentioned expression (92') by use of the volume ratio ($R_a$) of the compound in the product and the diameter ($d_{0i}$) of the particles immediately after spraying.

From the compound content ($C_a$) and the specific gravity ($\rho$) of the compound, the volume ratio ($R_a$) of the compound in the product is expressed as $C_a/\rho$.

Figure 18:
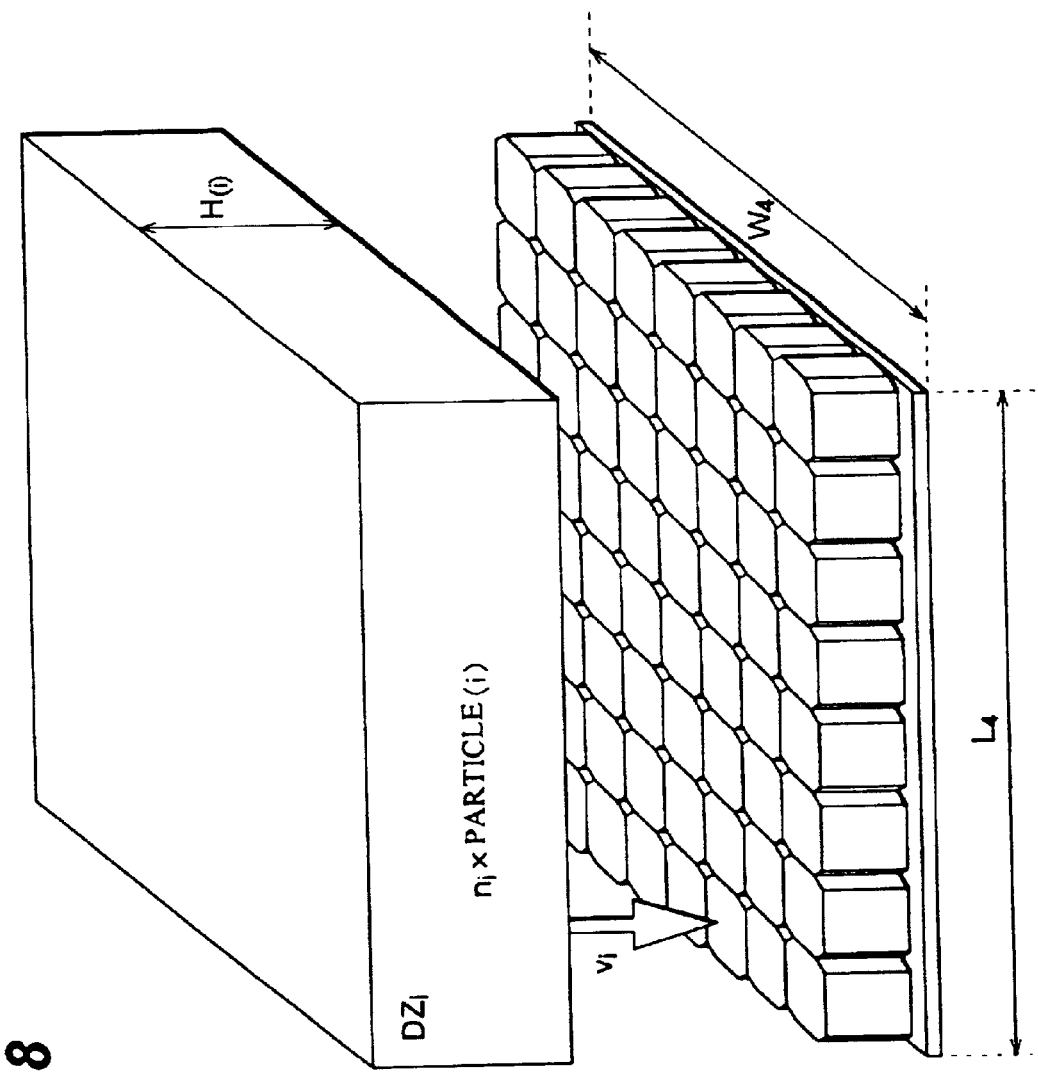
FIG. 18 is an explanatory view showing a falling state of a particle zone.

As shown in FIG. 18, immediately after spraying the chemical, a particle zone ($DZ_i$) having a width ($W_4$), length ($L_4$), and space width ($H_{(i)}$) is formed at a certain height from the floor. In conformity to the falling speed ($v_i$) of suspended particles, the particle zone ($DZ_i$) approaches the floor. When the bottom of the particle zone ($DZ_i$) reaches the floor, the compound in the suspended particles transfers to the carpet space portion and carpet fiber.

Since movement of the particles is under the control of gravity and air resistance, according to Stokes' law using the diameter ($d_i$) of suspended particles determined by expression (92), the falling speed ($v_i$, i=2, 3) of the suspended particles is represented by the following expression (93):

$$v_i = \frac{\rho g S_c}{18\eta} d_i^2 = \beta(d_{0i}^2 - 2\alpha i) \tag{93}$$

-continued $$S_c = 1 + \frac{2}{7.6 \times 10^7 d_i}[6.32 + 2.01\exp(-8.322 \times 10^6 d_i)] \quad (93')$$

$$v_i = (\rho/\rho_d)\beta d_i^2 \quad (93'')$$

wherein g is gravitational acceleration, η is the coefficient of viscosity of the air, $S_c$ is a sliding correction coefficient, and β is a speed coefficient. Here, while particles do not conform to the Stokes' law when they become small, the sliding correction coefficient ($S_c$), which is a coefficient for correcting this phenomenon, is represented by the above expression (93') according to the diameter ($d_i$) of particles determined by expression (92).

On the other hand, the falling speed ($v_i$) of the particles after the complete evaporation of particle-constituting solvent component is represented by the above expression (93") using the specific gravity (ρ) of the compound, specific gravity ($\rho_d$) of the particle-constituting solvent, speed coefficient (β), and diameter ($d_i$) of particles determined by expression (92').

The number of suspended particles ($n_i$, i=2, 3) also decreases upon exchange of the air through a window and the like. Here, the small particles float in conformity to the indoor air flow, and the large particles, which reduce their diameter as their volume decreases, are assumed to conform to the flow of the indoor air flow. In this case, during the period till the particle zone ($DZ_i$) reaches the floor, the number of particles ($n_i$) would decrease only upon ventilation of the room. Accordingly, from the room size ($V_4 = L_4 \times W_4 \times H_4$), ventilation rate (G), particle space width ($H_{(i)}$, i=2, 3), and particle falling speed ($v_i$) determined by expression (93) or (93"), the particle number ($n_i$) is expressed as follows:

$$\frac{dn_i}{dt} = -\frac{n_i}{H_{(i)}}Vi - \frac{n_i}{L_4}k_4 \quad (94)$$

wherein $k_4$ (=$GV_4/A_4$) is the transference speed of the compound in the air.

From the floor size ($L_4 \times W_4$), ventilation rate (G), cross-sectional area ($A_o$) of the space portion, Fugacity capacity ($Z_o$) of the chemical in the space portion determined by expression (101) mentioned later, and Fugacity capacity ($Z_4$) of the air determined by expression (89), the transference coefficient ($D_{c4}$) of the compound between the chemical in the space portion and the air is represented as follows:

$$D_{c4} = \frac{1}{1/(k_c A_c L_4 W_4 Z_c) + 1/(k_4 A_c L_4 W_4 Z_4)} \quad (95)$$

wherein $k_c$ (=$k_4/100$) is the transference speed of the compound on the water surface of the chemical in the space portion.

From the diffusion coefficient ($D_p$), floor size ($L_4 \times W_4$), ventilation rate (G), Fugacity capacity ($Z_c$) of the chemical in the space portion, and Fugacity capacity ($Z_5$) of the floor determined by expression (90), the transference coefficient ($D_{c5}$) of the compound between the chemical in the space portion and the carpet fiber is represented as:

$$D_{c5} = \frac{1}{1/(k_c A_{c5} L_4 W_4 Z_c) + 1/(k_5 A_{c5} L_4 W_4 Z_5)} \quad (96)$$

wherein $k_5$ (=$(D_p/t)^{0.5}$) is the transference speed of the compound in the carpet fiber, and $A_{c5}$ is the contact area ratio of the carpet fiber and space portion relative to the floor.

The diffusion coefficient ($D_p$) of the compound in the floor/wall/ceiling can be determined when the diffusion coefficient ($D_{ca}$) of the compound in the air is multiplied by $10^{-9}$, whereas $D_{ca}$ can be computed from properties of the compound (e.g., structural formula, molecular weight, and the like) according to Wike and Lee method ("Handbook of Chemical Property Estimation Methods," McGraw-Hill Book Company, 1982), for example.

From the diameter ($d_i$) of particles determined by expression (92) or (92'), transference speed ($k_4$) of the compound in the air, falling speed ($v_i$) determined by expression (93) or (93"), Fugacity capacity ($Z_i$) and ($Z_4$) determined by expressions (88) and (89), the transference coefficient ($D_{i4}$) of the compound between the suspended particles and the air becomes:

$$D_{i4} = \frac{1}{1/(k_i A_i Z_i) + 1/\{(k_4 + v_i)A_i Z_4\}} \quad (97)$$

wherein $A_i$ (=$\pi d_i^2$) is the surface area of suspended particles, and $k_i$ (=$k_4/100$) is the transference speed of the compound in the particle surface.

From the diffusion coefficient ($D_p$) of the floor/wall/ceiling, room size ($L_4 \times W_4 \times Z_4$), ventilation rate (G), and Fugacity capacity ($Z_4$) and ($Z_j$) determined by expressions (89) and (90), the transference coefficient ($D_{4j}$) of the compound between the air and the floor/wall/ceiling becomes:

$$D_{4j} = \frac{1}{1/(k_4 A_j Z_4) + 1/(k_j A_j Z_j)} \quad (98)$$

wherein $A_j$ is the surface area of the wall and ceiling, and $k_j$ (=$(D_p/t)^{0.5}$) is the transference speed of the compound in the floor/wall/ceiling.

The volume ($V_c$) of the chemical in the space portion is determined from the floor size ($L_4 \times W_4$), spray rate, content ($C_{sd}$) of the solvent (xylene) contained in the product, dilution ($X_{sol}$) of the product, and evaporation constant ($R_d$) of the chemical in the space portion determined by expression (87). The volume ($V_c$) of the space portion decreases until the particle-constituting solvent in the chemical completely evaporates.

Since the suspended particles are mostly made of moisture (particle-constituting solvent), their volume decreases as time passes. Since the suspended particles reduce their volume till the particle-constituting solvent completely evaporates, using diameter ($d_i$) of suspended particles determined by expression (92) or (92') and the above-mentioned evaporation constant (α), the volume change ($dV_i/dt$) of suspended particles is expressed as follows:

$$\frac{dV_i}{dt} = -\frac{\pi}{2}\alpha d_i \quad (99)$$

Assuming that the floor/wall/ceiling before spraying the chemical is like a thin film and that, as the chemical infiltrates into the film, its thickness increases so as to enhance the volume thereof; from the diffusion coefficient ($D_p$) of the compound in the floor/wall/ceiling, the volume ($V_j$) of floor/wall/ceiling is represented as follows:

$$V_j = 2(D_p t)^{0.5} A_j \quad (100)$$

Fugacity capacity ($Z_c$) of the chemical in the space portion is initially expressed by $K_{ow} C^s/P^s$ as with the above-mentioned Fugacity of the floor/wall/ceiling. When the chemical begins evaporating, Fugacity capacity ($Z_c$) gradually approaches $C^s/P^s$ (Fugacity capacity of water). Accordingly, from the vapor pressure ($P^s$), water solubility ($C^s$), and octanol/water distribution coefficient ($K_{ow}$) of the compound, and property change constant (a) of the product, Fugacity capacity ($Z_c$) is expressed as follows:

$$Z_c = (e^{-at}K_{ow} + 1 - e^{-at})C^s/P^s \tag{101}$$

Here, the property change constant (a) of the product can be computed according to the evaporation constant ($R_d$) of the chemical in the space portion determined by expression (87), content ($C_{sd}$) of the solvent (Xylene) contained in the product, and dilution ($X_{sol}$) of the product. Namely, Fugacity capacity ($Z_c$) of the chemical in the space portion is also expressed as:

$$Z_c = ((\text{ratio of organic solvent in diluted liquid})K_{ow} + (\text{ratio of water in diluted liquid})) \times C^s/P^s$$

By simultaneously forming this expression and the above-mentioned expression (101), the property change constant (a) of the product is computed.

(ii) Fugacity Calculation (S3)

The behavior of the compound in the carpet space portion is expressed in the form of differential equation concerning Fugacity ($f_c$) as:

$$\frac{df_c}{dt}V_c Z_c = \gamma_s \sum_{i=2}^{3} n_i v_i A_c V_i Z_i f_i / H_{(i)} + \quad \text{Deposition}(i) \tag{102}$$

F-change $$R_d L_4 W_4 Z_c f_c - \quad \text{V-change}$$

$$\sum_{k=4}^{5} D_{ek}(f_c - f_k) - \quad \text{Transference}(4,5)$$

$$K_c V_c Z_c f_c \quad \text{Degradation}$$

Here, the terms of Deposition (i), V-change, Transference (4,5), and Degradation respectively indicate the attachment accompanying the falling of the suspended particles to the space portion, volume change (decrease over time) of the chemical in the space portion, amount of transference of the compound between the space portion and the air and floor (carpet fiber), and amount of degradation of the compound in the space portion. Here, Fugacity ($f_c$) is effective till the chemical in the space portion completely evaporates. Also, $\gamma_5$ indicates the ratio of suspended particles attaching to the floor.

The behavior of the compound in the large and small particles is expressed in the form of differential equation concerning Fugacity ($f_i$, i=2, 3) as:

$$\frac{df_i}{dt}V_i Z_i = \frac{\pi}{2}\alpha d_i Z_i f_i \quad \text{V-change} \tag{103}$$

F-change $$-D_{i4}(f_i - f_4) \quad \text{Transference}(4)$$

$$-K_i V_i Z_i f_i \quad \text{Degradation}$$

Here, the terms of V-change, Transference (4), and Degradation respectively indicate the volume change (decrease over time) of the suspended particles, amount of transference of the compound between the particles and the air, and amount of degradation of the compound in the particles. Here, with the lapse of time, particles are absorbed by the carpet space portion and floor (carpet fiber), whereby Fugacity ($f_i$) is lost.

The behavior of the compound in the indoor air is expressed in the form of differential equation concerning Fugacity ($f_4$) as:

$$\frac{df_4}{dt}V_4 Z_4 = -GV_4 Z_4 f_4 \quad \text{Ventilation} \tag{104}$$

F-change $$-D_{c4}(f_4 - f_c) \quad \text{Transference}(c)$$

$$-\sum_{i=2}^{3} n_i D_{i4}(f_4 - f_i) \quad \text{Transference}(i)$$

$$-\sum_{j=5}^{7} D_{4j}(f_4 - f_j) \quad \text{Transference}(j)$$

$$-K_4 V_4 Z_4 f_4 \quad \text{Degradation}$$

Here, the terms of Ventilation, Transference (C), Transference (i), Transference (j), and Degradation respectively indicate the amount of discharge of the compound outdoors, amount of transference of the compound between the air and the space portion, amount of transference of the compound between the air and the suspended particles, amount of transference of the compound between the air and the floor/wall/ceiling, and amount of degradation of the compound in the air.

The behavior of the compound in the floor (carpet fiber) is expressed in the form of differential equation concerning Fugacity ($f_5$) as:

$$\frac{df_5}{dt}V_5 Z_5 = \gamma_s \sum_{i=2}^{3} n_i v_i A_{a5} V_i Z_i f_i / H_{(i)} - \quad \text{Deposition}(i) \tag{105}$$

F-change $$\sqrt{D_p/t}\, A_{a5} Z_5 f_5 - \quad \text{V-change}$$

$$D_{c5}(f_5 - f_c) - \quad \text{Transference}(c)$$

$$D_{45}(f_5 - f_4) - \quad \text{Transference}(4)$$

$$K_5 V_5 Z_5 f_5 \quad \text{Degradation}$$

Here, the terms of Deposition (i), V-change, Transference (c), Transference (4), and Degradation respectively indicate the attachment of the suspended particles accompanying falling to the carpet fiber, volume change (increase over time) of the floor, amount of transference of the compound between the carpet fiber and the space portion, amount of transference of the compound between the carpet fiber and the air, and amount of degradation of the compound in the carpet fiber.

The behavior of the compound in the wall and ceiling is expressed in the form of differential equation concerning Fugacity ($f_j$, j=6, 7) as:

$$\frac{df_j}{dt}V_j Z_j = -\sqrt{D_p/t}\, A_j Z_j f_j + \quad \text{V-change} \tag{106}$$

F-change $$r_j \sum_{i=2}^{3} n_i v_i V_i Z_i f_i / H_{(i)} - \quad \text{Deposition}$$

$$D_{4j}(f_j - f_4) - \quad \text{Transference}$$

$$K_j V_j Z_j f_j \quad \text{Degradation}$$

Here, the terms of V-change, Transference (4), and Degradation respectively indicate the volume change (increase over time) of the wall/ceiling, amount of transference of the compound between the wall/ceiling and the air, and amount of degradation of the compound in the wall/ceiling. Also, $\gamma_j$ is the ratio of suspended particles attaching to the wall and ceiling.

The above-mentioned seven kinds of differential equations (102) to (106) are simultaneously formed and are solved by Runge-Kutta-Gill method, so as to compute Fugacity ($f_2$ to $f_7$, and $f_c$)

When solving these simultaneous differential equations, it is necessary to set an estimation nick time width (dt) which is a minute time unit. Namely, the estimation nick time width is used such that solutions of the simultaneous differential equations are initially determined at a time ($t_0$), and then solutions of the simultaneous differential equations are determined at a time ($t_0$+dt) to which the estimation nick time width is added. As solutions are obtained while estimation nick time widths are successively added, temporally changing Fugacity can be determined. Theoretically, as the set time of the estimation nick time width is shorter, more accurate solutions can be obtained, though necessitating a very long calculation time. By contrast, when the set time is too long, solutions tend to diverge, thereby generating errors.

Therefore, in the present invention, the estimation nick time width is set shorter when a very large change occurs in a chemical, whereas it is set longer when there is no large change.

Specifically, mass balance is always confirmed such that the amount of input of the chemical and the resulting solution coincide with each other, and the estimation nick time width is set longer when the mass balance does not fluctuate greatly, whereas it is set shorter when the mass balance starts fluctuating. For example, when the fluctuation of mass balance is set to an accuracy of ±5%, the estimation nick time width is always set so as to constantly satisfy the relationship of:

compound input amount/(existing amount+degrading amount+discharging amount)=0.95 to 1.05 namely, such that the fluctuation of mass balance lies within the range of ±5%.

Here, the above-mentioned compound input amount is determined by the floor size ($L_4 \times W_4$), compound content ($C_a$), and spray rate. Since the temporal amounts of compound in the seven kinds of media are determined by the simultaneous differential equations, they are summed up so as to compute the existing amount as shown in the following. Also, the degrading amount and discharging amount are as follows:

$$\text{existing amount} = V_c Z_c f_c + \sum_{i=2}^{3} n_i f_i V_i Z_i + \sum_{k=4}^{7} f_k V_k Z_k \quad (107)$$

$$\text{degrading amount} = K_c V_c Z_c f_c + \sum_{i=2}^{3} K_i n_i f_i V_i Z_i + \sum_{k=4}^{7} K_k f_k V_k Z_k$$

$$\text{discharging amount} = G V_4 Z_4 f_4 + \sum_{i=2}^{3} G n_i V_i Z_i f_i$$

With reference to the flowchart of FIG. 5, the method of setting the estimation nick time width (dt) will be explained.

First, an initial value of estimation nick time width (dt) is inputted (S21). Then, an upper limit set value (e.g., 0.1[%]) which is the upper limit of difference in mass balance, and a lower limit set value (e.g., $10^{-6}$[%]) which is the lower limit of difference in mass balance are inputted (S22).

Thereafter, Fugacity and mass balance at t=$t_0$ are calculated (S23 and S24), and Fugacity and mass balance at t=t+dt (or $t_0$+dt) are calculated (S25 and S26).

It is judged whether the fluctuation in mass balance is within the range of ±5% or not (S27). If the fluctuation in mass balance is within the range of ±5%, it is judged whether the difference between the mass balance at t=t (or $t_0$) and the mass balance at t=t+dt (or $t_0$+dt) is at least the upper limit set value or not (S28). If it is judged to be at least the upper limit set value at S28, then solutions become more accurate when the estimation nick time width (dt) is made shorter. In this case, the estimation nick time width (dt) is multiplied by ½ so as to change its setting (S29). When the difference is judged to be smaller than the upper limit set value at S28, it is judged at S30 whether the difference between the mass balance at t=t (or $t_0$) and the mass balance at t=t+dt (or $t_0$+dt) is at most the lower limit set value or not.

When the mass balance difference is not greater than the lower limit set value at S30, since solutions are not influenced by longer estimation nick time width (dt), the estimation nick time width (dt) is doubled so as to change its setting (S31). Subsequently, it is judged whether the estimation nick time width (dt) changed at S31 is at most a maximum value (e.g., 0.1 [hour]) of estimation nick time width (dt) or not (S32). When the estimation nick time width (dt) is not greater than the maximum value at S32, since solutions do not diverge, the estimation nick time width (dt) set at S31 is used. When the estimation nick time width (dt) is greater than the maximum value at S32, since solutions may diverge, the estimation nick time width (dt) is reset to the maximum value (S33). When the mass balance difference is greater than the lower limit set value at the above-mentioned S30, namely, when it lies between the lower limit set value and upper limit set value, the calculations are continued without changing the estimation nick time width (dt).

After the step of S29, S30, S32, or S33, the operation returns to S25 so as to effect calculation again, and this process is repeated till the aimed time is attained.

When the fluctuation in mass balance exceeds the range of ±5% at S27, on the other hand, the mass balance fluctuation is so much that calculation is preferably effected with an estimation nick time width (dt) shorter than that in the case where the fluctuation is within the range of ±5%. Accordingly, the calculation is stopped once (S34), the lower limit set value is reset to a lower level (S35), and then the operation returns to the step of S23.

Thus, when the estimation nick time width is variably set without being held constant, while monitoring the mass balance fluctuation, Fugacity can be computed accurately and efficiently.

(iii) Computation of Temporal Concentration in Indoor Air and Floor Residual Amount (S4)

The temporal concentration of the compound in the indoor air is computed when Fugacity ($f_3$) of the small particles, determined by the above-mentioned item (ii), multiplied by Fugacity capacity ($Z_3$), and Fugacity ($f_4$) of the indoor air multiplied by Fugacity capacity ($Z_4$) are summed up. Here, in the case where the large particles may be inhaled by a human body depending on the kind of chemical, calculation is effected while taking account of Fugacity ($f_2$) of the large particles as well.

The floor residual amount of the compound is computed when Fugacity ($f_5$) of the floor is multiplied by Fugacity capacity ($Z_5$). In the case where the solvent is water, in particular, it is preferably computed by summing up the above-mentioned computed value ($f_5$, $Z_5$) and the value obtained when Fugacity ($f_c$) of the space portion is multiplied by Fugacity capacity ($Z_c$).

(iv) Calculation of Estimated Exposure Amount in Inhalation and Inhalation Safety Coefficient (S6 and S7)

The above-mentioned temporal concentration in the indoor air forms a curve shown in FIG. 3A, for example. This concentration curve is integrated, an accumulated concentration of the compound during a specific period ($t_1$ to $t_2$) is determined (see FIG. 3B), and the mean concentration in the indoor air is computed from thus determined value. While an arbitrary period is set as the specific period depending on the object, an appropriate period is usually set in view of the method of use of the product and the test period of toxicity data.

Then, according to the above-mentioned mean concentration in the indoor air, amount of respiration, and exposure time, the estimated exposure amount in inhalation is determined. Namely, calculation of:

estimated exposure amount in inhalation [mg/kg/day]=mean concentration in indoor air [mg/m$^3$]×amount of respiration [m$^3$/kg/min]×exposure time [min/day]

is effected. Here, as the above-mentioned amount of respiration, a published value or actually measured value may be used. Also, when amounts of respiration are respectively set for adult and child, more appropriate estimated exposure amounts in inhalation can be obtained. In the case where the inhaled harmful material is not totally absorbed into the body but is partially discharged by respiration, a more appropriate estimated exposure amount in inhalation can be obtained when the inhalation ratio is taken into account.

The inhalation safety coefficient is computed from a non-influential amount concerning inhalation toxicity examined by an animal experiment beforehand and the estimated exposure amount in inhalation determined above. Namely, it is expressed as:

inhalation safety coefficient=inhalation non-influential amount [mg/kg/day]/estimated exposure amount in inhalation [mg/kg/day]

(v) Calculation of Estimated Percutaneous Exposure Amount and Percutaneous Safety Coefficient (S9 and S11)

The above-mentioned floor residual amount forms a curve such as that shown in FIG. 4A, for example. This residual amount curve is integrated, the accumulated residual amount of the compound during a specific period ($t_1$ to $t_2$) is determined (see FIG. 4B), and the mean residual amount is computed from thus determined value. While an arbitrary period is set as the specific period depending on the object, an appropriate period is usually set in view of the method of use of the product and the test period of toxicity data.

Then, according to the mean floor residual amount, skin attachment ratio, contact area, and body weight, the estimated percutaneous exposure amount is determined. Namely, calculation of:

estimated percutaneous exposure amount [mg/kg/day]=(mean floor residual amount [mg/m$^2$]×skin attachment ratio [%]×contact area [m$^2$/day])/body weight [kg]

is effected. Here, as the contact area, a published value (e.g., 4 [m$^2$/day]) may be used. The skin attachment ratio is a ratio of the compound attaching to the skin when the latter is in contact with the floor where the compound exists. As this value, a published value or a value experimentally obtained from a model may be used.

A model experiment method for the skin attachment ratio is as follows. A weight (8 cm×8 cm×8 cm; 4.2 kg) is placed on a denim cloth (8 cm×10 cm) with a pressure similar to that of an infant in contact with a floor, and the denim cloth is pulled on the floor at a speed (120 cm/15 sec) similar to the moving speed of the infant. The denim and floor are analyzed so as to compute the compound contained in the denim and floor. From the ratio therebetween, the skin attachment ratio is obtained. It has been confirmed that the skin attachment ratio obtained by this method is identical to or slightly higher than that determined from analyzed values of a hand and a floor when the hand is actually pressed against the floor, thereby proving this model experiment method to be useful for evaluating exposure of inhabitants.

The percutaneous safety coefficient is computed from the non-influential amount concerning percutaneous toxicity examined by an animal experiment beforehand and the estimated percutaneous exposure amount determined above. Namely, it is expressed as:

percutaneous safety coefficient=percutaneous non-influential amount [mg/kg/day]/estimated percutaneous exposure amount [mg/kg/day]

Nevertheless, in general, percutaneous non-influential amount has not often been determined, and there are not many published values. Accordingly, a more accurate value can be determined from the estimated percutaneous exposure amount, and oral non-influential amount and percutaneous absorption ratio for which many published values exist, according to the following expression:

percutaneous safety coefficient=oral non-influential amount [mg/kg/day]/(estimated percutaneous exposure amount (mg/kg/day)×percutaneous absorption ratio [%])

Here, when the percutaneous absorption ratio is unknown, employed is a national guideline (e.g., 10%) which usually exists.

(vi) Calculation of Estimated Oral Exposure Amount and Oral Safety Coefficient (S13 and S14)

From the estimated percutaneous exposure amount obtained in the above-mentioned item (v), hand surface area ratio, and oral transference ratio, the estimated oral exposure amount from hand to mouth is determined. Namely, calculation of:

estimated oral exposure amount [mg/kg/day]=estimated percutaneous exposure amount [mg/kg/day]×hand surface area ratio [%]×oral transference ratio [%]

is effected. Here, the hand surface area ratio is expressed by (hand surface area/body surface area), for which a published value (e.g., 5[%]) may be used. The oral transference ratio is a hypothetical value, which is set to 100%, for example.

In the case where oral exposure might occur via tableware or food contaminated with the residually sprayed compound, it is required that the estimated oral exposure amount from tableware or food to mouth be added to the estimated oral exposure amount from hand to mouth to yield the total estimated oral exposure amount. For example, the estimated oral exposure amount from tableware is obtained when, according to the tableware residual amount indicating the amount of the harmful material remaining in tableware, tableware use area which is the sum of tableware surface areas, and oral transference ratio from tableware, calculation of:

estimated oral exposure amount [mg/kg/day]=tableware residual amount [mg/m$^2$]×tableware use area [m$^2$/day]×oral transference ratio [%]/body weight [kg]

is effected. Here, the tableware residual amount is expressed by (mean floor residual amount×tableware contamination ratio). As the tableware contamination ratio, an actually measured value (e.g., 9%) or a hypothetical value may be used.

The oral safety coefficient is computed from the non-influential amount concerning oral toxicity examined by an animal experiment beforehand and the estimated oral exposure amount determined above. Namely, it is expressed as:

oral safety coefficient=oral non-influential amount [mg/kg/day]/ estimated oral exposure amount [mg/kg/day]

As mentioned in the foregoing, in the method of estimating an indoor behavior of a pesticidal compound in this embodiment, when a chemical containing the above-mentioned compound is sprayed over the whole floor area, differential equations concerning Fugacity of the space portion between carpet fibers, two kinds of large and small particles, indoor air, whole carpet fiber, wall, and ceiling are simultaneously formed and are solved, and the indoor behavior of the compound is estimated according to thus obtained solution. Here, the estimation nick time width is variably set, while constantly confirming mass balance of the compound indoors after the spraying, so that the amount of input of the chemical indoors and the resulting solution coincide with each other.

Accordingly, since mass balance of the compound after the spraying is always monitored such that the amount of input of the compound indoors and the resulting solution coincide with each other, thereby varying the estimation nick time width; the estimation nick time width is set longer when the mass balance fluctuates a little, whereas it is set shorter when the mass balance starts fluctuating greatly. Namely, when solving simultaneous differential equations including a parameter accompanying temporal change, the estimation nick time width is automatically set in response to the fluctuation in mass balance. Consequently, when processed by a computer, an accurate solution can be obtained in a short time.

The method of evaluating safety of a pesticidal compound in accordance with this embodiment uses the estimated result mentioned above to evaluate the safety of the compound with respect to the human body when the chemical is sprayed over the whole floor surface.

Accordingly, the safety of the compound with respect to the human body can be evaluated accurately in a short time. As a consequence, when formulating a chemical such as insecticide containing the compound, simulation can be easily repeated while changing conditions, thereby making it easier to formulate a chemical having a high safety conforming to the aimed object.

Though Fugacity is determined by use of Runge-Kutta-Gill method in this embodiment, other methods may be used for solving differential equations. Runge-Kutta-Gill method, however, is preferably used since a program for the above-mentioned differential equations can be easily made by Basic. Also in the case where differential equations are solved by a method other than Runge-Kutta-Gill method, similar effects can be obtained when the estimation nick time width is set as mentioned above.

Figure 19:
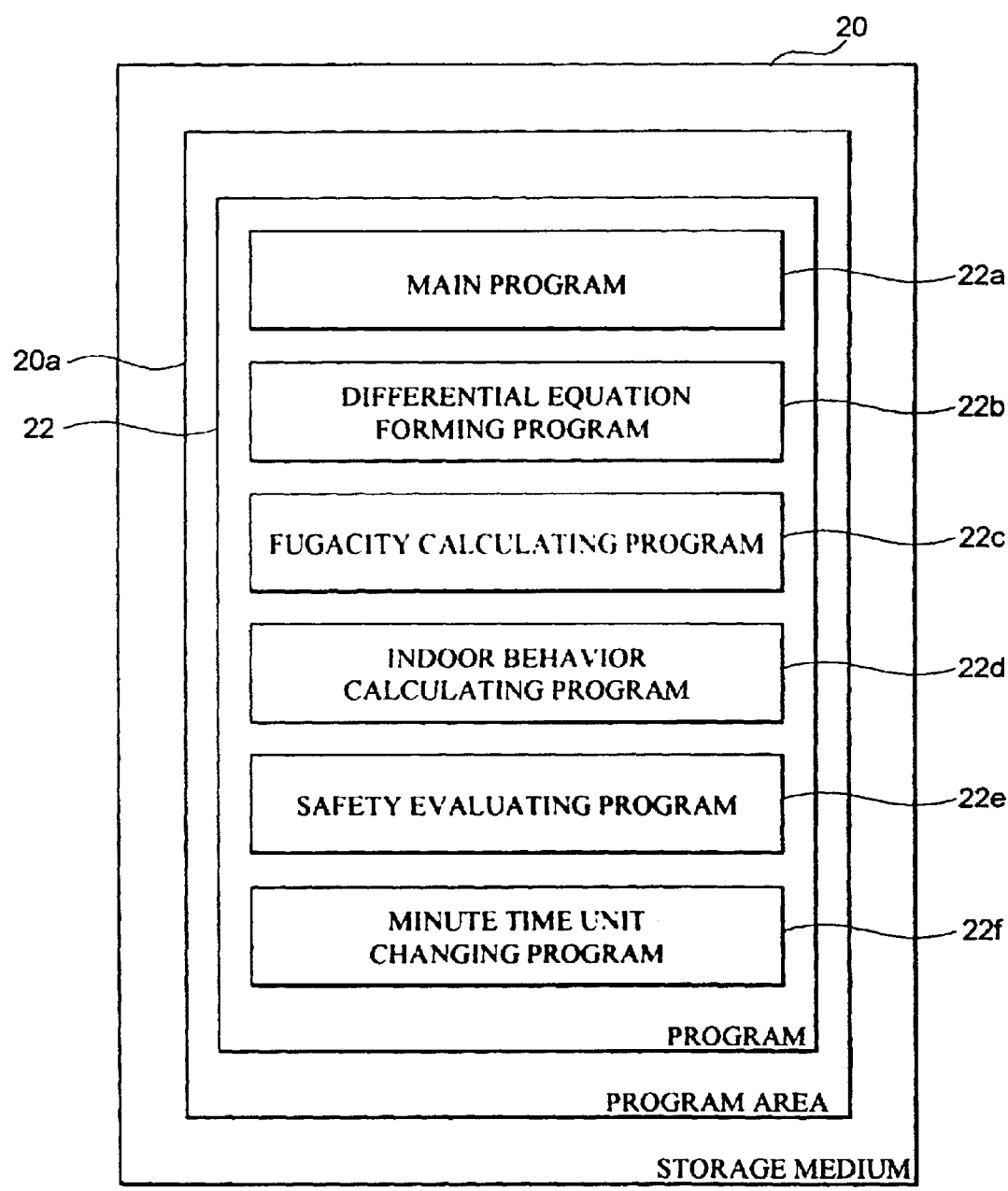
FIG. 19 is a configurational view of a storage medium 20 employed in each of the above-mentioned embodiments of the present invention.

Finally, a computer program product (storage medium) employed in each of the above-mentioned embodiments will be explained. FIG. 19 is a configurational view showing a storage medium 20 employed in each of the above-mentioned embodiments of the present invention. As shown in FIG. 19, the storage medium 20 comprises a program area 20a for storing a program. This program area 20a stores a pesticidal compound indoor behavior simulation program 22. The pesticidal compound indoor behavior simulation program 22 comprises a main program 22a for supervising the processing; a differential equation forming program 22b for (S1) inputting a primary condition necessary for forming a differential equation concerning a fugacity of the compound in each medium in response to an indoor environment divided into predetermined media and (S2) calculating a secondary condition so as to form the above-mentioned differential equation; a Fugacity calculating program 22c for (S3) determining the fugacity of the compound from the above-mentioned differential equation; an indoor behavior calculating program 22d for (S4) computing temporal concentration in indoor air and residual amount, which constitute an indoor behavior of the compound, from thus calculated fugacity; a safety evaluating program 22e for (S5 to S17) evaluating the safety of the compound with respect to a human body according to the temporal concentration in the indoor air and residual amount; and a minute time unit changing program 22f for (S21 to S35) changing, in response to a fluctuation in mass balance of the compound, the minute time unit used when solving the differential equation. The above-mentioned letters and numerals within parentheses refer to the corresponding steps in FIGS. 1 or 5.

As the storage medium 20, a disk-shaped storage medium such as flexible disk or CD-ROM is used, for example. Alternatively, a tape-like storage medium such as magnetic tape may be used as well.

Figure 20:
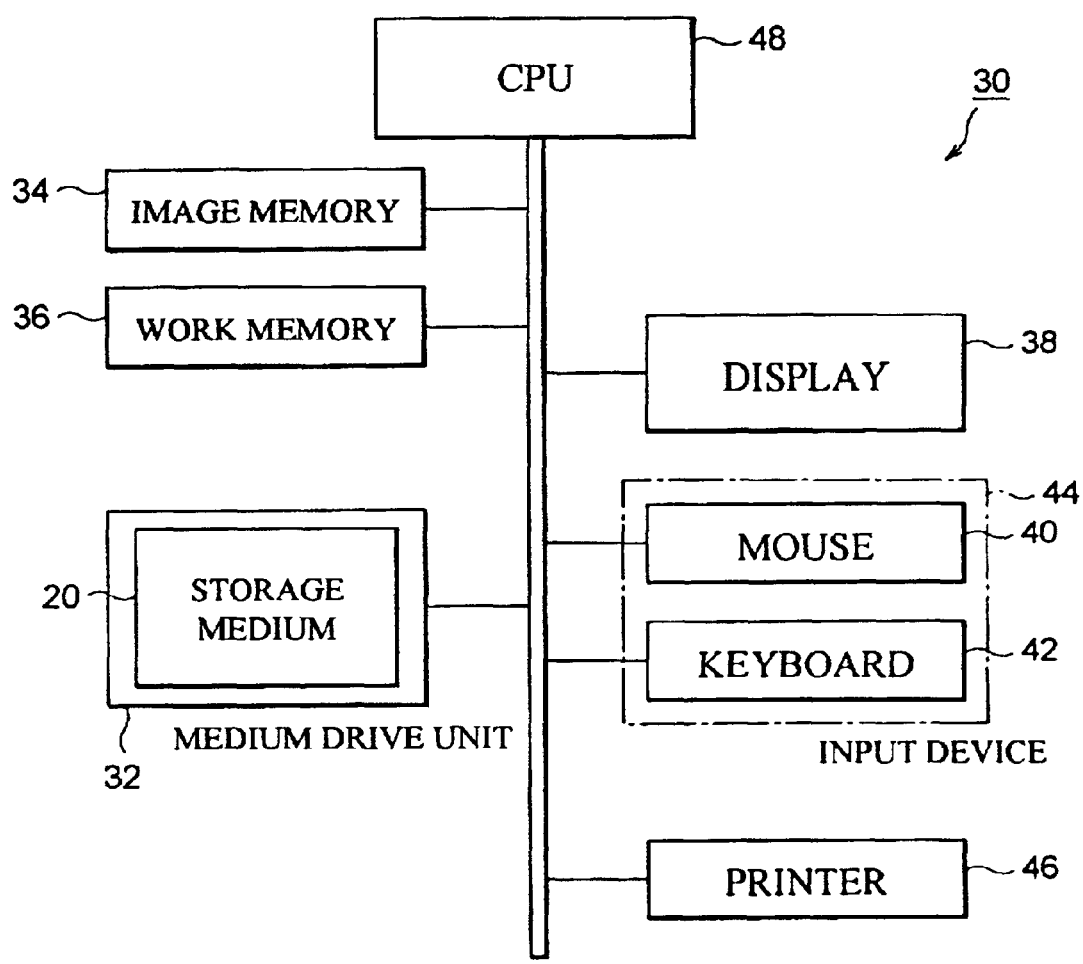
FIG. 20 is a configurational view of an information processing apparatus for operating a program stored in the storage medium 20.
Figure 21:
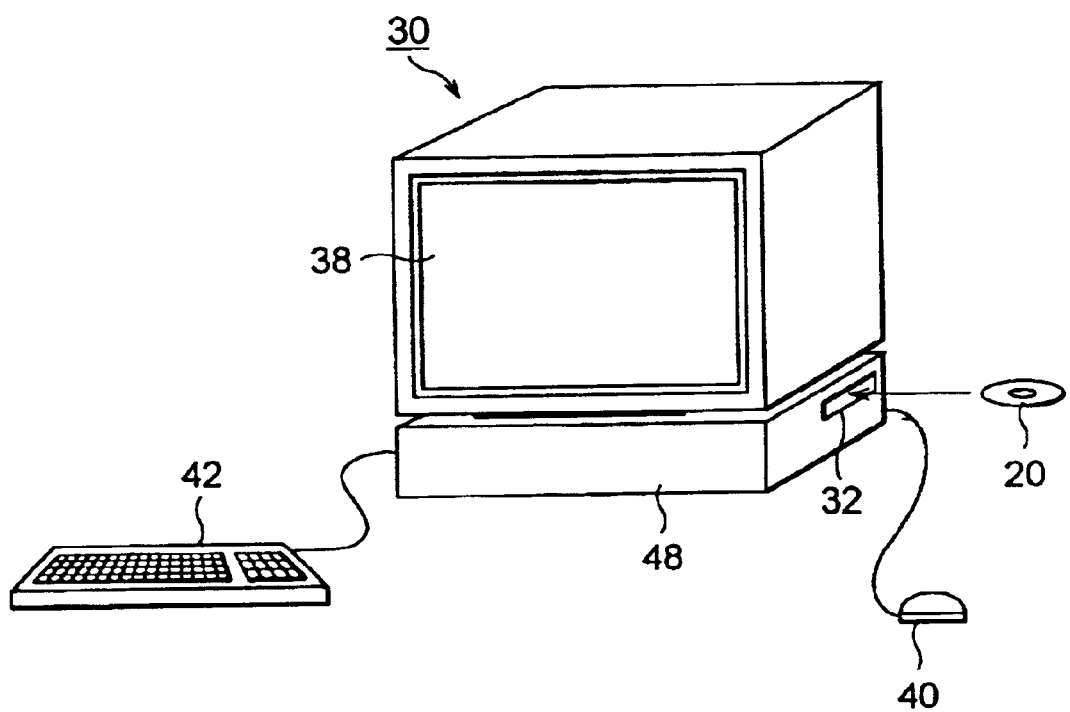
FIG. 21 is a configurational view of the information processing apparatus for operating a program stored in the storage medium 20.

The storage medium 20 may be used in an information processing apparatus shown in FIGS. 20 and 21. Namely, the information processing apparatus 30 comprises a medium drive unit 32, which can accommodate the storage medium 20. As the storage medium 20 is thus accommodated, the information stored therein can be accessed by the medium drive unit 32. Consequently, the pesticidal compound indoor behavior simulation program 22 stored in the program area 20a can be executed by the information processing apparatus 30.

This information processing apparatus is configured as follows. First, it comprises the above-mentioned medium drive unit 32, an image memory 34 for storing image data indicating simulation results and the like; a work memory (internal memory) 36 in which an operation system (OS) is resident; and a display 38 which is a display means. Also, it comprises an input device 44 which is an input means having a mouse 40 and a keyboard 42 for receiving input data such as the primary condition; a printer 46 for outputting image data and the like; and a CPU 48 for controlling execution of the pesticidal compound indoor behavior simulation program 22 and the like.

As the medium drive unit, in conformity to the storage medium 20, a flexible disk unit, CD-ROM drive unit, magnetic tape drive unit, or the like may be used.

In the following, the processing of the pesticidal compound indoor behavior simulation program 22 stored in the program area 20a of the storage medium 20 will be explained. This processing is performed by executing the pesticidal compound indoor behavior simulation program 22 read out by the medium drive unit 32. Upon this execution, the main program 22a of the pesticidal compound indoor behavior simulation program 22 is activated.

Figure 5:
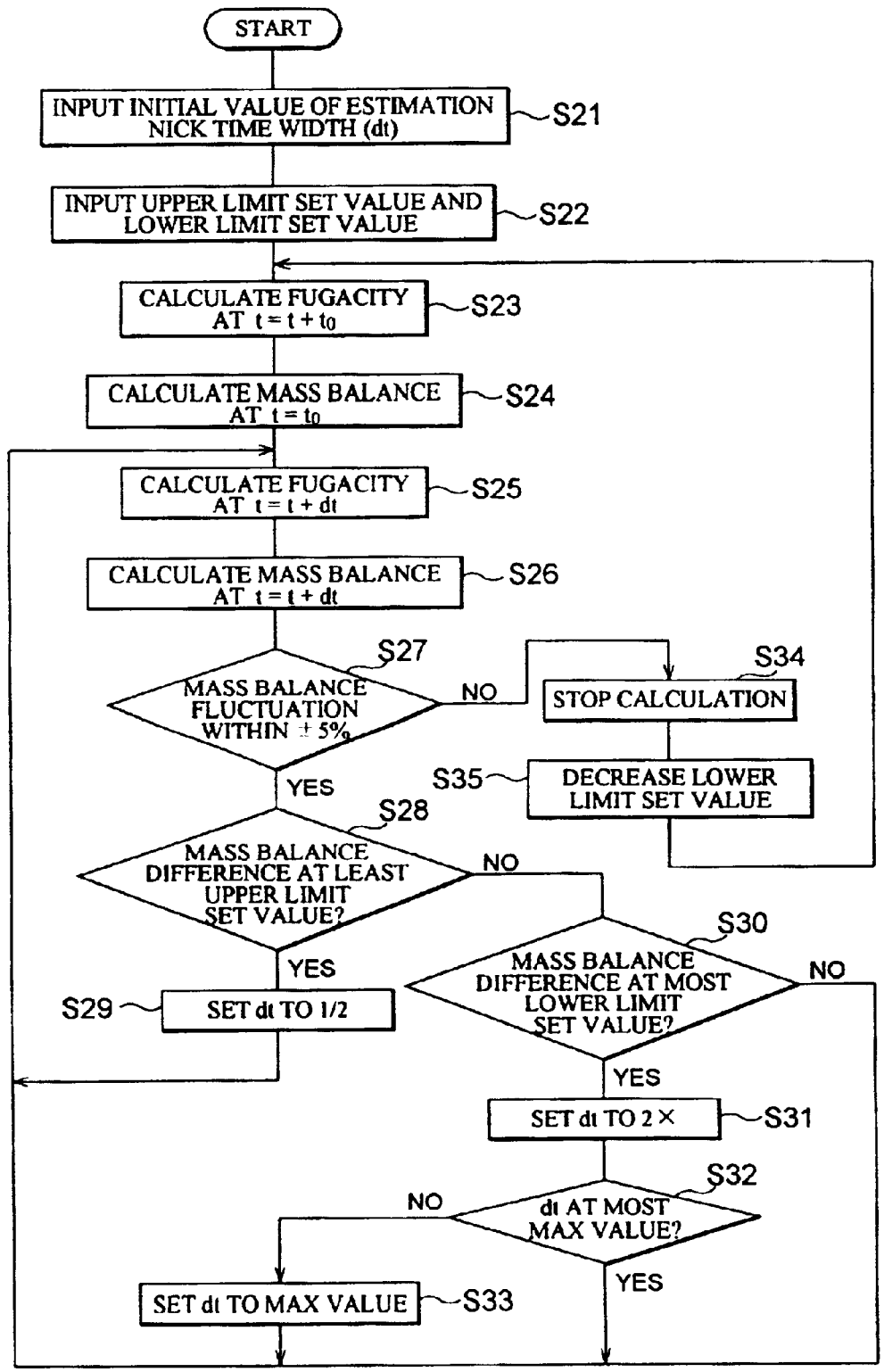
FIG. 5 is a flowchart showing a method of setting an estimation nick time width.

The subsequent processing operations of the differential equation forming program 22b, Fugacity calculating program 22c, indoor behavior calculating program 22d, safety evaluating program 22e, and minute time unit changing program 22f correspond to those explained in the above-mentioned embodiments and FIGS. 1 and 5.

As explained in the foregoing, the computer program product (storage medium) employed in each of the above-mentioned embodiments of the present invention has a program for initially dividing the environment into predetermined media (constituents), simultaneously forming differential equations concerning Fugacity of the compound in these medium, and then solving them, thereby estimating an indoor behavior of a compound when a chemical containing the compound is residually sprayed.

Consequently, the environment is assumed to be a plurality of media, and exchanges of the compound between media and the like are taken into account, whereby simulation results close to the actual behavior of the compound can be obtained.

The estimation nick time width set when solving the simultaneous differential equations is variably set, while constantly confirming mass balance of the compound indoors after the residual spraying, so that the amount of input of the chemical indoors and the resulting solution coincide with each other.

Accordingly, since mass balance of the compound after the residual spraying is always monitored such that the amount of input of the compound indoors and the resulting solution coincide with each other, thereby varying the estimation nick time width; the estimation nick time width is set longer when the mass balance fluctuates a little, whereas it is set shorter when the mass balance starts fluctuating greatly. Namely, when solving simultaneous differential equations including a parameter accompanying temporal change, the estimation nick time width is automatically set in response to the fluctuation in mass balance. Consequently, when processed by a computer, an accurate solution can be obtained in a short time.

Also, the computer program product (storage medium) employed in each of the above-mentioned embodiments of the present invention has a program for evaluating, by use of the above-mentioned estimated results, safety of a pesticidal compound with respect to the human body when the chemical is residually sprayed.

Accordingly, the safety of the compound with respect to the human body can be evaluated accurately in a short time. As a consequence, when formulating a chemical such as insecticide containing the compound, simulation can be easily repeated while changing conditions, thereby making it easier to formulate a chemical having a high safety conforming to the aimed object.

Industrial Applicability

In the method of simulating an indoor behavior of a pesticidal compound in accordance with the present invention, the indoor environment is divided into predetermined media, and exchanges of the compound between media and the like are taken into account, whereby simulation results similar to the actual behavior of the compound can be obtained. Also, when solving simultaneous differential equations including a parameter accompanying a temporal change, a minute time unit can be automatically set in response to the fluctuation in mass balance, whereby an accurate solution can be obtained in a short time when processed by a computer.

The method of simulating an indoor behavior of a pesticidal compound in accordance with the present invention further comprises a step of evaluating, according to the indoor behavior of the compound, safety of the compound with respect to a human body, whereby the safety of the pesticidal compound can be evaluated accurately in a short time. Accordingly, when formulating a chemical such as insecticide containing the compound, simulation can be easily repeated while changing conditions, thereby making it easier to formulate a chemical having a high safety conforming to the aimed object.

What is claimed is:

1. A method of simulating an indoor behavior of a pesticidal compound, said simulation method comprising:
    a step of dividing an indoor environment into predetermined medias;
    a step of determining under a differential equation, the fugacities with the unit of pressure of said compound in each of said medias, wherein the fugacities are determined in terms selected from emission rate, deposition, V-change, transference, ventilation and degradation;
    a step of determining at least one indoor behavior of said compound in the indoor environment from multiplication of fugacity capacity (Z) and said fugacity (f), and further volume (V) at option in each of said medias, wherein said at least one indoor behavior is selected from a temporal concentration and residual amount; and
    a step of monitoring the mass balance of the compound under changing, in response to a fluctuation in the mass balance of the compound indoors, a minute time unit used when solving said differential equation.

2. A simulation method according to claim 1, further comprising a step of evaluating safety of said compound with respect to a human body according to the indoor behavior of said compound.

3. A simulation method according to claim 1, wherein said compound-is introduced into an indoor space as a solution containing said compound is residually sprayed; and
    wherein said media are a spraying site, suspended particles which are divided into at least one kind according to size, indoor air, a floor, a wall, and a ceiling.

4. A simulation method according to claim 3, wherein said differential equation at said spraying site is a differential equation stating a relationship among temporal change of fugacity of said compound at said spraying site, temporal change in volume of said spraying site, amount of attachment of said suspended particles to said spraying site, amount of transference of said compound between said spraying site and another medium, and change in amount of degradation of said compound at said spraying site;
    wherein said differential equation in said suspended particles is a differential equation stating a relationship among temporal change of fugacity of said compound in said suspended particles, temporal change in volume of said suspended particles, amount of transference of said compound between said suspended particles and another medium, and change in amount of degradation of said compound in said suspended particles;
    wherein said differential equation in said indoor air is a differential equation stating a relationship among temporal change of fugacity of said compound in said indoor air, amount of discharge of said compound outdoors, amount of transference of said compound between said indoor air and another medium, and change in amount of degradation of said compound in said indoor air;
    wherein said differential equation at said floor is a differential equation stating a relationship among temporal change of fugacity of said compound at said floor, temporal change in volume of said floor, amount of attachment of said suspended particles to said floor, amount of transference of said compound between said floor and another medium, and change in amount of degradation of said compound at said floor;

wherein said differential equation at said wall is a differential equation stating a relationship among temporal change of fugacity of said compound at said wall, temporal change in volume of said wall, amount of attachment of said suspended particles of said wall, amount of transference of the compound between said wall and another medium, and change-in-amount of degradation-of said-compound at said wall; and wherein said differential equation at said ceiling is a differential equation stating a relationship among temporal change of fugacity of said compound at said ceiling, temporal change in volume of said ceiling, amount of attachment of said suspended particles fo said ceiling, amount of transference of said compound between said ceiling and another medium, and change in amount of degradation of said compound at said ceiling.

5. A simulation method according to claim 1, wherein said compound is introduced into an indoor space as a solution containing said compound is spatially sprayed; and wherein said media are suspended particles which are divided into at least one kind according to size, indoor air, a floor, a wall, and a ceiling.

6. A simulation method according to claim 5, wherein said differential equation in said suspended particles is a differential equation stating a relationship among temporal change of fugacity of said compound in said suspended particles, temporal change in volume of said suspended particles, amount of transference of said compound between said suspended particles and another medium, and change in amount of degradation of said compound in said suspended particles;

wherein said differential equation in said indoor air is a differential equation stating a relationship among temporal change of fugacity of said compound in said indoor air, amount of discharge of said compound outdoors, amount of transference of said compound between said indoor air and another medium, and change in amount of degradation of said compound in said indoor air;

wherein said difference equation at said floor is a differential equation stating a relationship amount temporal change of fugacity of said compound at said floor, temporal change in volume of said floor, amount of attachment of said suspended particles to said floor, amount of transference of said compound between said floor and another medium, and change in amount of degradation of said compound at said floor;

wherein said differential equation at said wall is a differential equation stating a relationship amount temporal change of fugacity of said compound at said wall, temporal change in volume of said wall, amount of attachment of said suspended particles to said wall, amount of transference of said compound between said wall and another medium, and change in amount of degradation of said compound at said wall; and wherein said differential equation at said ceiling is a differential equation stating a relationship among temporal change of fugacity of said compound at said ceiling, temporal change in volume of said ceiling, amount of attachment of said suspended particles of said ceiling, amount of transference of said compound between said ceiling and another medium, and change in amount of degradation of said compound at said ceiling.

7. A simulation method according to claim 1, wherein said compound is introduced into an indoor space as a solution containing said compound is heated to vaporize; and wherein said media are condensed particles which are divided into at least one kind according to generation and extinction, high-concentration air, medium-concentration air, low-concentration air, a floor, a wall, and a ceiling which is divided into at least one kind according to compound concentration.

8. A simulation method according to claim 7, wherein said differential equation in said condensed particles is a differential equation stating a relationship among temporal change of fugacity of said compound in said condensed particles, temporal change in volume of said condensed particles, amount of transference of said compound between said condensed particles and another medium, and change in amount of degradation of said compound in said condensed particles;

wherein said differential equation in said high-concentration air is a differential equation stating a relationship among temporal change of fugacity of said compound in said high-concentration air, amount of discharge of said compound, amount of transference of said compound between said high-concentration air and another medium, and change in amount of degradation of said compound in said high-concentration air;

wherein said differential equation in said medium-concentration air is differential equation stating a relationship among temporal change of fugacity of said compound in said medium-concentration air, amount of transference of said compound between said medium-concentration air, amount of transference of said compound between said medium-concentration air and another medium, and change in amount of degradation of said compound in said medium-concentration air;

wherein said differential equation at said low-concentration air is a differential equation stating a relationship among temporal change of fugacity of said compound in said low-concentration air, amount of discharge of said compound outdoors, amount of transference of said compound between said low-concentration air and another medium, and change in amount of degradation of said compound in said low-concentration air;

wherein said differential equation at said floor is a differential equation stating a relationship among temporal change of fugacity of said compound at said floor, temporal change in volume of said floor, amount of transference of said compound between said floor and another medium, and change in amount of degradation of said compound at said floor;

wherein said differential equation at said wall is a differential equation stating a relationship among temporal change of fugacity of said compound at said wall, temporal change in volume of said wall, amount of transference of said compound between said wall and another medium, and change in amount of degradation of said compound at said wall; and wherein said difference equation at said ceiling is a differential equation stating a relationship among temporal change of fugacity of said compound at said ceiling, temporal change in volume of said ceiling, amount of transference of said compound between said ceiling and another medium, and change in amount of degradation of said compound at said ceiling.

9. A simulation method according to claim 1, wherein said compound is introduced into an indoor space as a solution containing said compound is sprayed over the whole floor; and wherein said medium are suspended particles which are divided into at least one kind according to size, indoor, air, a floor, a wall, and a ceiling.

10. A simulation method according to claim 9, wherein said differential equation in said suspended particles is a differential equation stating a relationship among temporal change of fugacity of said compound in said suspended particles, temporal change in volume of said suspended particles, amount of transference of said compound between said suspended particles and another medium, and change in amount of degradation of said compound in said suspended particles;

wherein said differential equation in said indoor air is a differential equation stating a relationship among temporal change of fugacity of said compound in said indoor air, amount of discharge of said compound outdoors, amount of transference of said compound between said indoor air and another medium, and change in amount of degradation of said compound in said indoor air;

wherein said differential equation at said floor is a differential equation stating a relationship among temporal change of fugacity of said compound at said floor, temporal change in volume of said floor, amount of attachment of said suspended particles to said floor, amount of transference of said compound between said floor and another medium, and change in amount of degradation of said compound at said floor;

wherein said differential equation at said wall is a differential equation stating a relationship among temporal change of fugacity of said compound at said wall, temporal change in volume of said wall, amount of attachment of said suspended particles to said wall, amount of transference of said compound between said wall and another medium, and change in amount of degradation of said compound at said wall; and wherein said differential equation of said ceiling is a differential equation stating a relationship among temporal change of fugacity of said compound at said ceiling, temporal change in volume of said ceiling, amount of attachment of said suspended particles of said ceiling, amount of transference of said compound between said ceiling and another medium, and change in amount of degradation of said compound at said ceiling.

11. A simulation method according to claim 3, wherein said floor is constituted by a rug having ears of fiber; and wherein a space between said ears is added to said media.

12. A simulation method according to claim 11, wherein said differential equation in the space between said ears is a differential equation stating a relationship among temporal change of fugacity of said compound in the space between said ears, temporal change in volume of the solution containing said compound in the space between said ears, amount of attachment of said compound into the space portion between said ears by falling, amount of transference of said compound between the space portion between said ears and another medium, and change in amount of degradation of said compound in the space portion between said ears.

13. A simulation method according to claim 5, wherein said floor is constituted by a rug having ears of fiber; and wherein a space between said ears is added to said media.

14. A simulation method according to claim 13, wherein said differential equation in the space between said ears is a differential equation stating a relationship among temporal change of fugacity of said compound in the space between said ears, temporal change in volume of the solution containing said compound in the space between said ears, amount of attachment of said compound into the space portion between said ears by falling, amount of transference of said compound between the space portion between said ears and another medium, and change in amount of degradation of said compound in the space portion between said ears.

15. A simulation method according to claim 7, wherein said floor is constituted by a rug having ears of fiber; and wherein a space between said ears is added to said media.

16. A simulation method according to claim 15, wherein said differential equation in the space between said ears is a differential equation stating a relationship among temporal change of fugacity of said compound in the space between said ears, temporal change in volume of the solution containing said compound in the space between said ears, amount of attachment of said compound into the space portion between said ears by falling, amount of transference of said compound between the space portion between said ears and another medium, and change in amount of degradation of said compound in the space portion between said ears.

17. A simulation method according to claim 9, wherein said floor is constituted by a rug having ears of fiber; and wherein a space between said ears is added to said media.

18. A simulation method according to claim 17, wherein said differential equation in the space between said ears is a differential equation stating a relationship among temporal change of fugacity of said compound in the space between said ears, temporal change in volume of the solution containing said compound in the space between said ears, amount of attachment of said compound into the space portion between said ears by falling, amount of transference of said compound between the space portion between said ears and another medium, and change in amount of degradation of said compound in the space portion between said ears.

19. The method according to claim 1, wherein at least one of the fugacities of the compound in each of the medias is determined in terms of V-change, transference and degradation.

20. The method according to claim 1, wherein at least one of the fugacities of the compound in each of the medias is determined in terms of ventilation, transference and degradation.

21. The method according to claim 1, wherein at least one of the fugacities of the compound in each of medias is determined in terms of V-change, deposition, transference and degradation.

22. The method according to claim 1, wherein at least one of the fugacities of the compound in each of the medias is determined in terms of emission rate.

23. A computer product comprising in a program area:

a program for dividing an indoor environment into predetermined medias;

a program for determining under a differential equation, the fugacities with the unit of pressure of said compound in each of said medias, wherein the fugacities are determined in terms selected from emission rate, deposition, V-change, transference, ventilation and degradation;

a program for determining at least one indoor behavior of said compound in the indoor environment from multiplication of fugacity capacity (Z) and said fugacity (f), and further volume (V) at option in each of said medias, wherein said at least one indoor behavior is selected from a temporal concentration and residual amount; and a program for monitoring the mass balance of the compound under changing, in response to a fluctuation in the mass balance of the compound indoor, a minute time unit used when solving said differential equation.

24. A computer program product according to claim 23, further comprising, in said program area, a program for evaluating safety of said compound with respect to human-body according to the indoor behavior of said compound.

25. A computer program product according to claim 23, wherein said compound is introduced into a indoor space as a solution containing said compound is residually sprayed; and wherein said media are a spraying site, suspended particles which are divided into at least one kind according to size, indoor air, a floor, a wall, and a ceiling.

26. A computer program product according to claim 25, wherein said differential equation at said spraying site is a differential equation stating a relationship among temporal change of fugacity of said compound in said spraying site, temporal change in volume of said spraying site, amount of attachment of said suspended particles to said spraying site, amount of transference of said compound between said spraying site and another medium, and change in amount of degradation of said compound at said spraying site;

wherein said differential equation in said suspended particles is a differential equation stating a relationship among temporal change of fugacity of said suspended particles, temporal change in volume of said suspended particles, amount of transference of said compound between said suspended particles and another medium, and change in amount of degradation of said compound is said suspended particles;

wherein said differential equation in said indoor air is a differential equation stating a relationship among temporal change of fugacity of said compound in said indoor air, amont of discharge of said compound outdoors, amount of transference of said compound between said indoor air and another medium, and change in amount of degradation of said compound in said indoor air;

wherein said differential equation at said floor is a differential equation stating a relationship among temporal change of fugacity of said compound at said floor, temporal change in volume of said floor, amount of attachment of said suspended particles to said floor, amount of transference of said compound between said floor and another medium, and change in amount of degradation of said compound of said floor;

wherein said differential equation at said wall is a differential equation stating a relationship among temporal change of fugacity of said compound at said wall, temporal change in volume of said wall, amount of attachment of said suspended particles to said wall, amount of transference of the compound between said wall and another medium, and change in amount of degradation of said compound at said wall; and wherein said differential equation at said ceiling is a differential equation stating a relationship among temporal change of fugacity of said compound at said ceiling, temporal change in volume of said ceiling, amount of attachment of said suspended particles to said ceiling, amount of transference of said compound between said ceiling and another medium, and change in amount of degradation of said compound at said ceiling.

27. A computer program product according to claim 23, wherein said compound is introduced into an indoor space as a solution containing said compound is spatially sprayed; and wherein said media are suspended particles which are divided into at least one kind according to size, indoor air, a floor, a wall, and a ceiling.

28. A computer program product according to claim 27, wherein said differential equation in said suspended particles is a differential equation stating a relationship among temporal change of fugacity of said compound in said suspended particles, amount of transference of said compound between said suspended particles and another medium, and change in amount of degradation of said compound at said suspended particles;

wherein said differential equation in said indoor air is a differential equation stating a relationship among temporal change of fugacity of said compound in said indoor air, amount of discharge of said compound outdoors, amount of transference of said compound between said indoor air and another medium, and change in amount of degradation of said compound in said indoor air;

wherein said differential equation in said floor is a differential equation stating a relationship among temporal change of fugacity of said compound at said floor, temporal change in volume of said floor, amount of attachment of said suspended particles to said floor, amount of transference of said compound between said floor and another medium, and change in amount of degradation of said compound at said floor;

wherein said differential equation at said wall is a differential equation stating a relationship among temporal change of fugacity of said compound in said wall, temporal change in volume of said wall, amount of attachment of said suspended particles to said wall, amount of transference of said compound between said wall and another medium, and change in amount of degradation of said compound of said wall; and wherein said differential equation at said ceiling is a differential equation stating a relationship among temporal change of fugacity of said compound at said ceiling, temporal change in volume of said ceiling, amount of attachment of said suspended particles to said ceiling, amount of transference of said compound between said ceiling and another medium, and change in amount of degradation of said compound at said ceiling.

29. A computer program product according to claim 23, wherein said compound is introduced into an indoor space as a solution containing said compound is heated to vaporize; and wherein said media are condensed particles which are divided into at least one kind according to generation and extinction, high-concentration air, medium-concentration air, low-concentration air, a floor, a wall, and a ceiling which is divided into at least one kind according to compound concentration.

30. A computer program product according to claim 29, wherein said differential equation in said condensed particles in a differential equation stating a relationship among temporal change of fugacity of said compound in said condensed particles, temporal change in volume of said condensed particles, amount of transference of said compound between said condensed particles and another medium, and change in amount of degradation of said compound of said condensed particles;
  wherein said differential equation in said high-concentration air is a differential equation stating a relationship among temporal change of fugacity of said compound in said high-concentration air, amount of discharge of said compound, amount of transference of said compound between said high-concentration air and another medium, and change in amount of degradation of said compound in said high-concentration air;
  wherein said differential equation in said medium-concentration air is a differential equation stating a relationship among temporal change of fugacity of said compound in said medium-concentration air, amount of transference of said compound between said medium-concentration air andanother medium, and change in amount of degradation of said compound in said medium-concentration air;
  wherein said differential equation in said low-concentration air is a differential equation stating a relationship among temporal change of fugacity of said compound in said low-concentration air, amount of discharge of said compound outdoors, amount of transference of said compound between said low-concentration air and another medium, and change in amount of degradation of said compound in said low-concentration air;
  wherein said differential equation at said floor is a differential equation stating a relationship among temporal change of fugacity of said compound at said floor, temporal change in volume of said floor, amount of transference of said compound between said floor and another medium, and change in amount of degradation of said compound at said floor;
  wherein said differential equation at said wall is a differential equation stating a relationship among temporal change of fugacity of said compound at said wall, temporal change in volume of said wall, amount of transference of said compound between said wall and another medium, and change in amount of degradation of said compound at said wall; and;
  wherein said differential equation at said ceiling is a differential equation stating a relationship among temporal change of fugacity of said compound at said ceiling, temporal change in volume of said ceiling, amount of transference of said compound between said ceiling and another medium, and change in amount of degradation of said compound at said ceiling.

31. A computer program product according to claim 23, wherein said compound is introduced into an indoor space as a solution containing said compound is sprayed over the whole floor; and
  wherein said media are suspended particles which are divided into at least one kind according to size, indoor air, a floor, a wall, and a ceiling.

32. A computer program product according to claim 31, wherein said differential equation in said suspended particles is a differential equation stating a relationship among temporal change of fugacity of said compound in said suspended particles, temporal change in volume of suspended particles, amount of transference of said compound between said suspended particles and another medium, and change in amount of degradation of said compound at said suspended particles;
  wherein said differential equation in said indoor air is a differential equation stating a relationship among temporal change of fugacity of said compound in said indoor air, amount of discharge of said compound outdoors, amount of transference of said compound between said indoor air and another medium, and change in amount of degradation of said compound in said indoor air;
  wherein said differential equation in said floor is a differential equation stating a relationship among temporal change of fugacity of said compound at said floor, temporal change in volume of said floor, amount of attachment of said suspended particles to said floor, amount of transference of said compound between said floor and another medium, and change in amount of degradation of said compound at said floor;
  wherein said differential equation a said wall is a differential equation stating a relationship among temporal change of fugacity of said compound in said wall, temporal change in volume of said wall, amount of attachment of said suspended particles to said wall, amount of transference of said compound between said wall and another medium, and change in amount of degradation of said compound of said wall; and
  wherein said differential equation at said ceiling is a differential equation stating a relationship among temporal change of fugacity of said compound at said ceiling, temporal change in volume of said ceiling, amount of attachment of said suspended particles to said ceiling, amount of transference of said compound between said ceiling and another medium, and change in amount of degradation of said compound at said ceiling.

33. A computer program product according to claim 25, wherein said floor is constituted by a rug having ears of fiber; and
  wherein a space between said ears is added to said media.

34. A computer program product according to claim 33, wherein a differential equation in the space between said ears is a differential equation stating a relationship among temporal change of fugacity of said compound in the space between said ears, temporal change in volume of the solution containing said compound in the space between said ears, amount of attachment of said compound into the space portion between said ears by falling, amount of transference of said compound between the space portion between said ears and another medium, and change in amount of degradation of said compound in the space portion between said ears.

35. A computer program product according to claim 27, wherein said floor is constituted by a rug having ears of fiber; and
  wherein a space between said ears is added to said media.

36. A computer program product according to claim 35, wherein a differential equation in the space between said ears is a differential equation stating a relationship among temporal change of fugacity of said compound in the space between said ears, temporal change in volume of the solution containing said compound in the space between said ears, amount of attachment of said compound into the space portion between said ears by falling, amount of transference of said compound between the space portion between said ears and another medium, and change in amount of degradation of said compound in the space portion between said ears.

37. A computer program product according to claim 29, wherein said floor is constituted by a rug having ears of fiber; and wherein a space between said ears is added to said media.

38. A computer program product according to claim 37, wherein said differential equation in the space between said ears is a differential equation stating a relationship among temporal change of fugacity of said compound in the space between said ears, temporal change in volume of the solution containing said compound in the space between said ears, amount of attachment of said compound into the space portion between said ears by falling, amount of transference of said compound between the space portion between said ears and another medium, and change in amount of degradation of said compound in the space portion between said ears.

39. A computer program product according to claim 31, wherein said floor is constituted by a rug having ears of fiber; and wherein a space between said ears is added to said media.

40. A computer program product according to claim 39, wherein a differential equation in the space between said ears is a differential equation stating a relationship among temporal change of fugacity of said compound in the space between said ears, temporal change in volume of the solution containing said compound in the space between said ears, amount of attachment of said compound into the space portion between said ears by falling, amount of transference of said compound between the space portion between said ears and another medium, and change in amount of degradation of said compound in the space portion between said ears.

41. A method of simulating an indoor behavior of a pesticidal compound wherein said compound is introduced into an indoor space as a solution containing said compound, or residually or spatially sprayed, or heated to vaporize, or sprayed over the whole floor, said simulation method comprising:

a step of dividing an indoor environment into predetermined medias;

a step of determining under a differential equation, the fugacities with the unit of pressure of said compound in each of said medias, wherein the fugacities are determined in terms selected from emission rate, deposition, V-change, transference, ventilation and degradation;

a step of determining at least one indoor behavior of said compound in the indoor environment from multiplication of fugacity capacity (Z) and said fugacity (f), and further volume (V) at option in each of said medias, wherein said at least one indoor behavior is selected from a temporal concentration and residual amount; and;

a step of monitoring the mass balance of the compound under changing, in response to a fluctuation in the mass balance of the compound indoor, a minute time unit used when solving said differential equation.

42. The simulation method according to claim 41, further comprising a step of evaluation safety of said compound with respect to a human body according to the indoor behavior of said compound.

* * * * *